(12) United States Patent
Yoneda et al.

(10) Patent No.: US 10,134,954 B2
(45) Date of Patent: Nov. 20, 2018

(54) LIGHT EMITTING ELEMENT HAVING PROTECTIVE LAYER

(71) Applicant: NICHIA CORPORATION, Anan-shi, Tokushima (JP)

(72) Inventors: Akinori Yoneda, Anan (JP); Shinji Nakamura, Tokushima (JP); Akiyoshi Kinouchi, Komatsushima (JP); Yoshiyuki Aihara, Tokushima (JP); Hirokazu Sasa, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/276,449

(22) Filed: Sep. 26, 2016

(65) Prior Publication Data

US 2017/0012174 A1 Jan. 12, 2017

Related U.S. Application Data

(63) Continuation of application No. 14/177,329, filed on Feb. 11, 2014, now Pat. No. 9,490,390.

(30) Foreign Application Priority Data

Feb. 12, 2013 (JP) .................................. 2013-024901
Feb. 6, 2014 (JP) .................................. 2014-021007

(51) Int. Cl.
*H01L 33/48* (2010.01)
*H01L 33/38* (2010.01)
(Continued)

(52) U.S. Cl.
CPC ........ *H01L 33/387* (2013.01); *H01L 33/0095* (2013.01); *H01L 33/44* (2013.01); *H01L 33/62* (2013.01)

(58) Field of Classification Search
CPC ............................ H01L 33/486; H01L 33/387
See application file for complete search history.

(56) References Cited

U.S. PATENT DOCUMENTS 7,554,126 B2 6/2009 Higashi et al.
2009/0057701 A1 3/2009 Chao
(Continued)

FOREIGN PATENT DOCUMENTS

JP 2000-244012 A 9/2000
JP 2002-118293 A 4/2002
(Continued)

OTHER PUBLICATIONS

Non-Final Office Action dated Sep. 24, 2015 in U.S. Appl. No. 14/177,329.
(Continued)

*Primary Examiner* — Thomas L Dickey
(74) *Attorney, Agent, or Firm* — Foley & Lardner LLP

(57) ABSTRACT

A light emitting element for flip-chip mounting having a flat mounting surface which allows a decrease in the width of the streets of a wafer. In the light emitting element, the insulating member filling around the bumps and flattening the upper surface is formed with a margin of a region with a width which is equal to or larger than the width of the streets on the dividing lines, so that at the time of dividing the wafer along the dividing lines, the insulating member is not processed, which allows designing of the streets with a small width.

7 Claims, 42 Drawing Sheets

(51) Int. Cl.
  *H01L 33/00*  (2010.01)
  *H01L 33/44*  (2010.01)
  *H01L 33/62*  (2010.01)

(56) References Cited

U.S. PATENT DOCUMENTS

| | | |
|---|---|---|
| 2009/0264784 A1 | 10/2009 | Stasz |
| 2009/0294784 A1 | 12/2009 | Nakahara et al. |
| 2010/0320488 A1 | 12/2010 | Horie |
| 2011/0073900 A1 | 3/2011 | Sugizaki |
| 2011/0297980 A1* | 12/2011 | Sugizaki ............ H01L 33/38 257/98 |
| 2012/0199860 A1 | 8/2012 | Hodota |
| 2013/0320382 A1 | 12/2013 | Kojima et al. |

FOREIGN PATENT DOCUMENTS

| | | |
|---|---|---|
| JP | 2003-007929 A | 1/2003 |
| JP | 2009-060077 A | 3/2009 |
| JP | 2011-071274 A | 4/2011 |
| JP | 2012-243849 A | 12/2012 |

OTHER PUBLICATIONS

Notice of Allowance dated Jun. 28, 2016 in U.S. Appl. No. 14/177,329.
Japanese Office Action dated Nov. 7, 2017 from corresponding application No. 2014-021007.

* cited by examiner

LIGHT EMITTING ELEMENT HAVING PROTECTIVE LAYER

CROSS-REFERENCE TO RELATED PATENT APPLICATIONS

This application is a continuation of U.S. patent application Ser. No. 14/177,329, filed on Feb. 11, 2014, which claims priority to Japanese Patent Application No. 2013-024901, filed on Feb. 12, 2013, and Japanese Patent Application No. 2014-021007, filed on Feb. 6, 2014, the entireties of which are hereby incorporated by reference.

BACKGROUND OF THE INVENTION

1. Technical Field

The present disclosure relates to a method of manufacturing light emitting element.

2. Background Art

There have been known methods of mounting a semiconductor light emitting element (hereinafter may be referred to as a "light emitting element") such as a light emitting diode (LED) or a laser diode (LD) on a wiring substrate, such as face-up mounting in which a light emitting element is placed with its main emission surface, a surface having electrodes, facing upward, and the electrodes and the wiring on the wiring substrate are electrically connected by electrically conductive wires respectively, or flip-chip mounting (face-down mounting) in which electrodes provided with a bonding means such as a bump are placed downward to bond the wiring on the surface of the wiring substrate.

Generally, a light emitting element has, on a substrate, an n-type semiconductor layer, an active layer, and a p-type semiconductor layer stacked in this order, and electrodes connected to the n-type and the p-type semiconductor layers respectively are needed to be on a same surface side. For this reason, the light emitting elements employ a structure in which an n-side electrode is disposed on an n-type semiconductor layer exposed by removing a part of the p-type semiconductor layer and the active layer which are upper layers. As a result, a step difference corresponding at least to the thickness of the active layer and the p-type semiconductor layer is created on the bonding surface of the n-side electrode and the p-side electrode respectively. Particularly, in the case where the light emitting element to be mounted by way of flip-chip mounting, mounting of the light emitting element in parallel to the wiring substrate becomes difficult to achieve. For this reason, a light emitting element having a structure to facilitate flip-chip mounting is disclosed for example in Patent Literatures 1 to 3 (JP2003-7929A, JP2011-204840A, and JP2012-23328A), in which, a region of the electrode forming surface where the electrodes or bumps are not disposed is enclosed with an insulating material such as a resin (an insulating member) and then grinding or the like is performed on the surface thereof to obtain a flat mounting surface (bonding surface).

BACKGROUND ART LITERATURE

Patent Literature

Patent literature 1: Japanese Unexamined Patent Application Publication No. 2003-7929
Patent literature 2: Japanese Unexamined Patent Application Publication No. 2011-345480
Patent literature 3: Japanese Unexamined Patent Application Publication No. 2012-345480

However, the light emitting element whose thickness has been increased by an insulating member as of conventional art, at the time of to dividing a wafer into chips by way of dicing (singulating), cutting of the wafer by a blade which does not have much thickness (thin blade) is difficult, so that streets, which are the "margins" with no semiconductor structure (effective region) are needed to be provided with a wide width corresponding to the thickness of the blade. This restricts the number of the light emitting elements obtained from one wafer, which limits improvement of productivity. Also, generally, a resin material cannot be processed by laser, so that laser dicing that allows a narrow street cannot be applied to a wafer having an insulating material stacked thereon, where even cleaving (breaking) by scribing is difficult to perform. Further, a physical impact at the time of dividing, the inorganic components such as a sapphire substrate and a nitride semiconductor and the insulating member such as a resin component may be detached from each other.

SUMMARY OF THE INVENTION

The present invention is devised to solve the above-described problems, and an object therefore is to provide a method of manufacturing a light emitting element suitable for flip-chip mounting with good productivity.

Accordingly, a method of manufacturing a light emitting element according to the embodiments of the present invention includes singulating by dividing along a dividing line to obtain light emitting elements respectively having a semiconductor structure including a first semiconductor layer and a second semiconductor layer stacked on a partial region on the first semiconductor layer, and electrodes respectively connected to the first semiconductor layer and the second semiconductor layer. The method includes forming the semiconductor structure, forming the electrodes respectively on the first semiconductor layer and the second semiconductor layer of the semiconductor structure, forming an insulating member covering the semiconductor structure having the electrodes formed thereon except for a connecting region to electrically connect the electrodes with outside and a region including a dividing region having a predetermined width along the dividing lines, and along the dividing lines, singulating the semiconductor structure covered with the insulating member to obtain light emitting elements whose dividing region are removed respectively.

According to the method of manufacturing a light emitting element according to the embodiments of the present invention, the width of streets can be narrowed so that light emitting elements having a flat mounting surface suitable for flip-chip mounting can be arranged in a great number on each wafer, thus high productivity can be achieved.

BRIEF DESCRIPTION OF THE DRAWINGS

FIGS. 1A and 1B are schematic diagrams illustrating a structure of a light emitting element manufactured by using a method of manufacturing light emitting element according to Embodiment 1 of the present invention, in which FIG. 1A is a plan view, and FIG. 1B is an cross-sectional view taken along line A-A of FIG. 1A.

FIGS. 8A and 8B are schematic diagrams of a wafer illustrating a method of manufacturing light emitting element according to an embodiment of the present invention, in which FIG. 8A is a plan view and FIG. 8B is a cross-section viewed from the direction of arrows along line B-B of FIG. 8A.

FIGS. 10A and 10B are schematic diagrams illustrating a structure of a light emitting element manufactured by using a method of manufacturing light emitting element according to a variation of Embodiment 1 of the present invention, in which FIG. 10A is a plan view, and FIG. 10B is an cross-sectional view taken along line C-C of FIG. 10A.

FIGS. 13A and 13B are schematic diagrams illustrating a structure of a light emitting element manufactured by using a method of manufacturing light emitting element according to a variation of Embodiment 1 of the present invention, in which FIG. 13A is a plan view, and FIG. 13B is a cross-section viewed from the direction of arrows along lines D-E, F-G-H of FIG. 13A.

FIGS. 21A and 21B are schematic diagrams illustrating a structure of a light emitting element manufactured by using a method of manufacturing light emitting element according to Embodiment 4 of the present invention, in which FIG. 21A is a plan view, and FIG. 21B is an cross-sectional view taken along line A-A of FIG. 2A.

FIGS. 27A and 27B are schematic diagrams illustrating a structure of a light emitting element manufactured by using a method of manufacturing light emitting element according to Embodiment 5 of the present invention, in which FIG. 27A is a plan view, and FIG. 27B is an cross-sectional view taken along line A-A of FIG. 27A.

Figure 28:
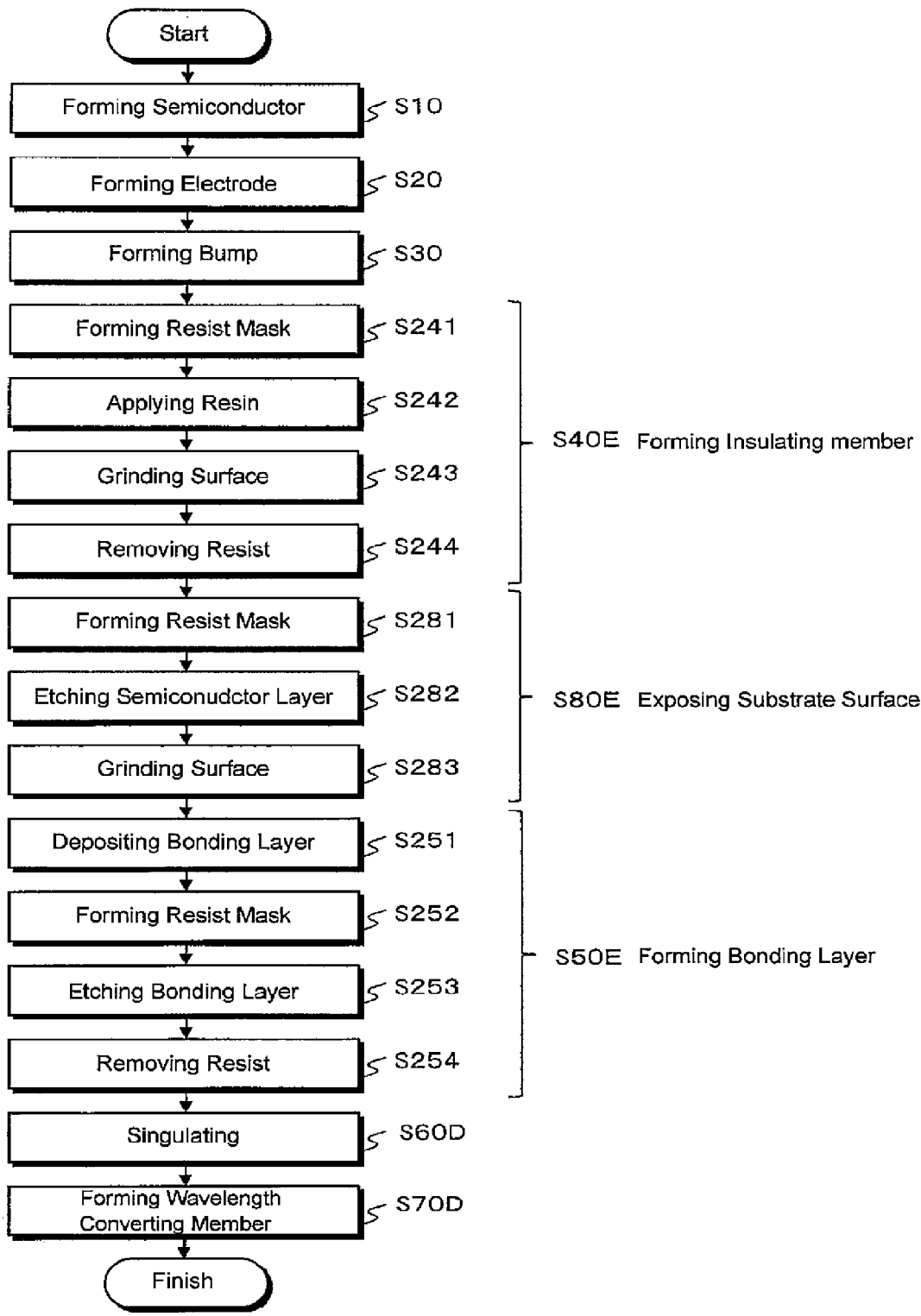
FIG. 28 is a flowchart illustrating a flow of processing in a method of manufacturing light emitting element according to Embodiment 5 of the present invention.

29A to 29D each corresponds to a cross-section viewed from the direction of arrows along line A-A of FIG. 28A.

FIGS. 30A to 30D are schematic diagrams illustrating a method of manufacturing light emitting element according to Embodiment 5 of the present invention, in which FIGS. 30A to 30D each corresponds to a cross-section viewed from the direction of arrows along line A-A of FIG. 28A.

FIGS. 31A to 31D are schematic diagrams illustrating a method of manufacturing light emitting element according to Embodiment 5 of the present invention, in which FIGS. 31A to 31D each corresponds to a cross-section viewed from the direction of arrows along line A-A of FIG. 28A.

Figure 32A:
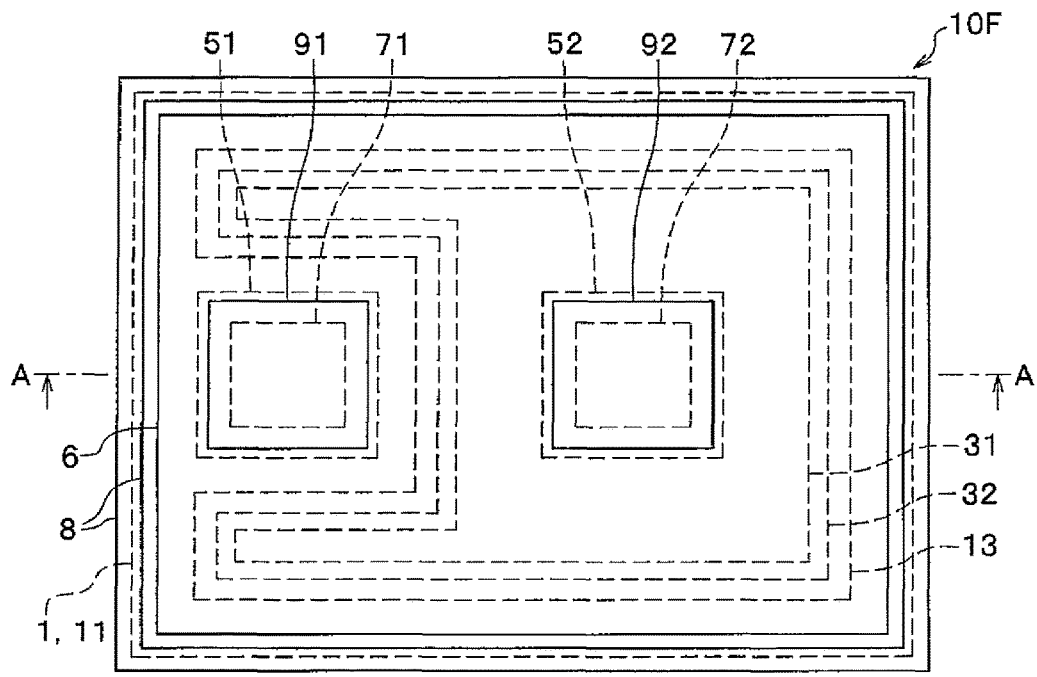
Figure 32B:
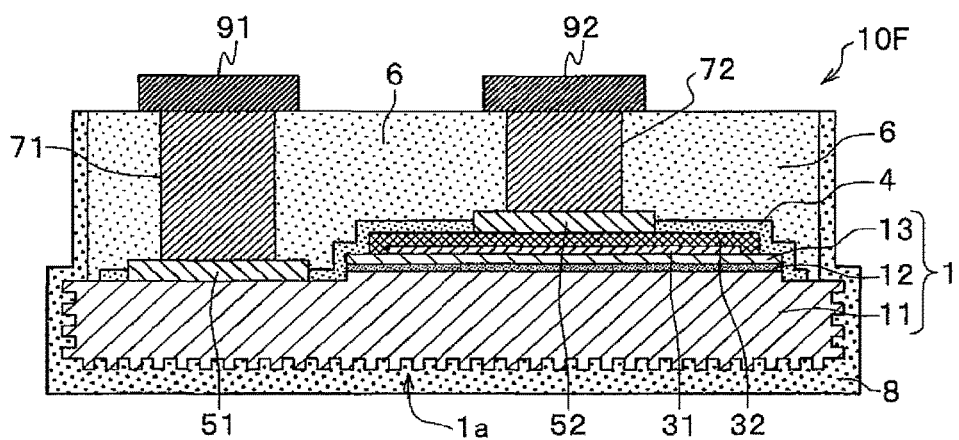

FIGS. 32A and 32B are schematic diagrams illustrating a structure of a light emitting element manufactured by using a method of manufacturing light emitting element according to Embodiment 6 of the present invention, in which FIG. 32A is a plan view, and FIG. 32B is an cross-sectional view taken along line A-A of FIG. 32A.

Figure 33:
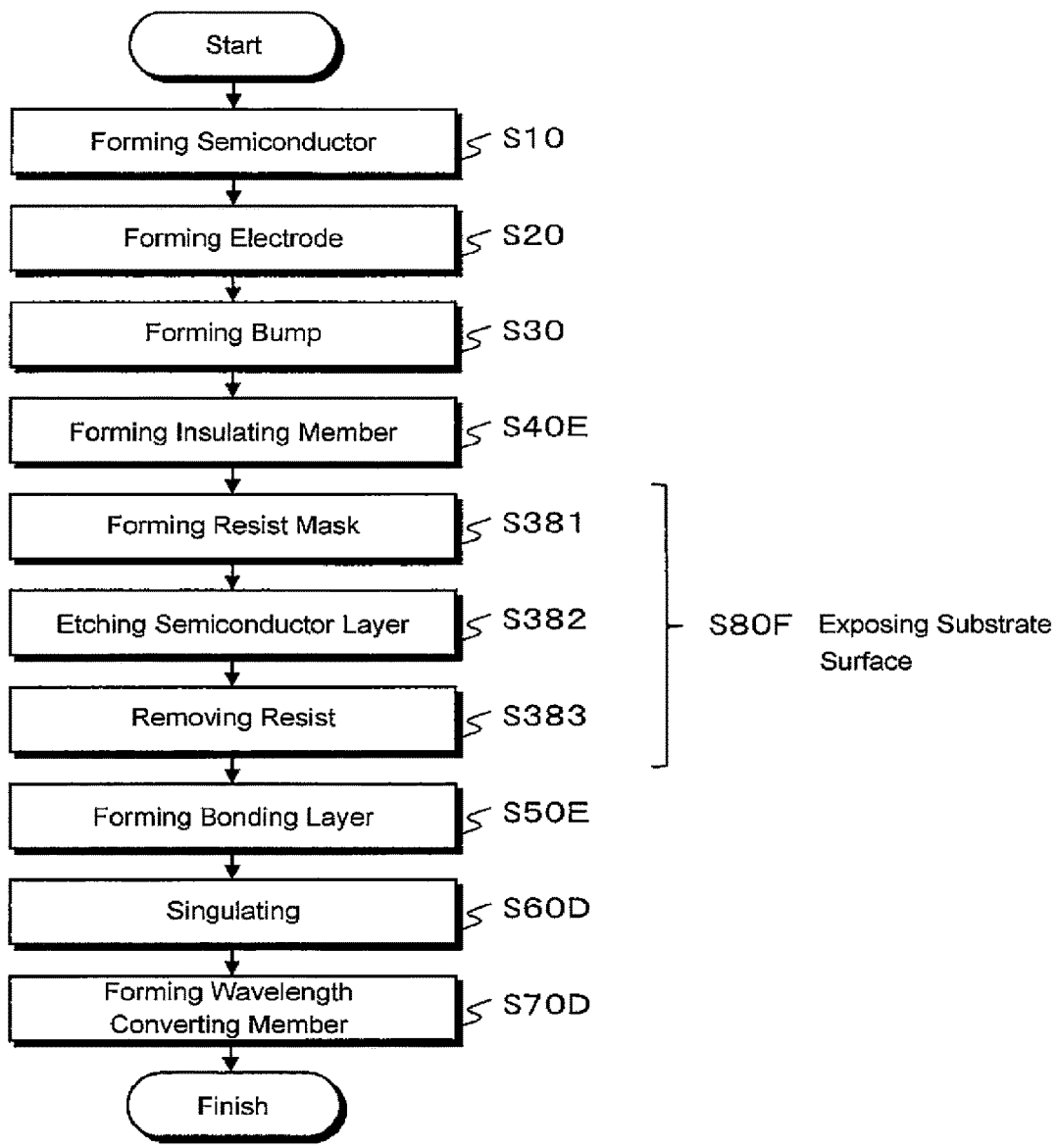

FIG. 33 is a flowchart illustrating a flow of processing in a method of manufacturing light emitting element according to Embodiment 6 of the present invention.

FIGS. 34A to 34D are schematic diagrams illustrating a method of manufacturing light emitting element according to Embodiment 6 of the present invention, in which FIGS. 34A to 34D each corresponds to a cross-section viewed from the direction of arrows along line A-A of FIG. 32A.

FIGS. 35A to 35D are schematic diagrams illustrating a method of manufacturing light emitting element according to Embodiment 6 of the present invention, in which FIGS. 35A to 35D each corresponds to a cross-section viewed from the direction of arrows along line A-A of FIG. 32A.

Figure 36A:
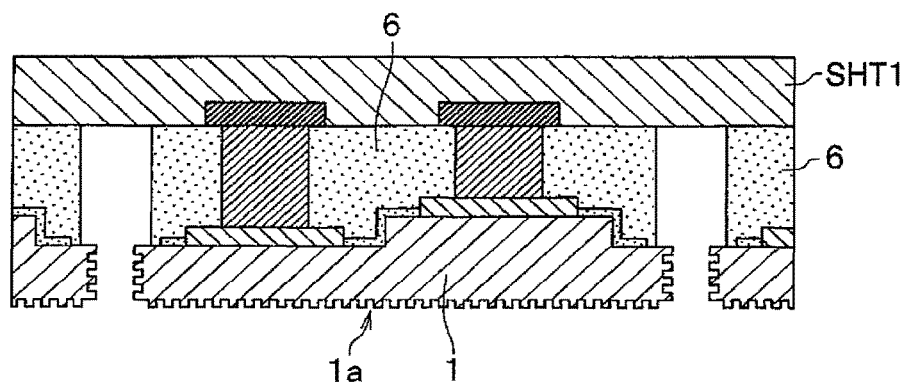
Figure 36B:
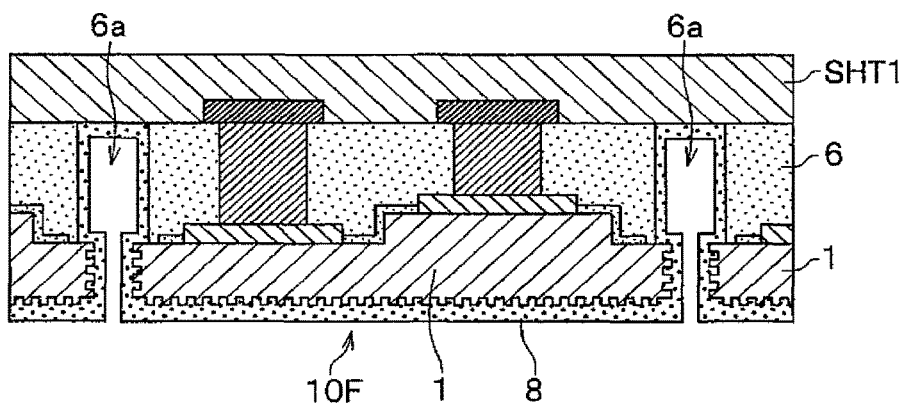

FIGS. 36A and 36B are schematic diagrams illustrating a method of manufacturing light emitting element according to Embodiment 6 of the present invention, in which FIGS. 36A and 36B each corresponds to a cross-section viewed from the direction of arrows along line A-A of FIG. 32A.

Figure 37A:
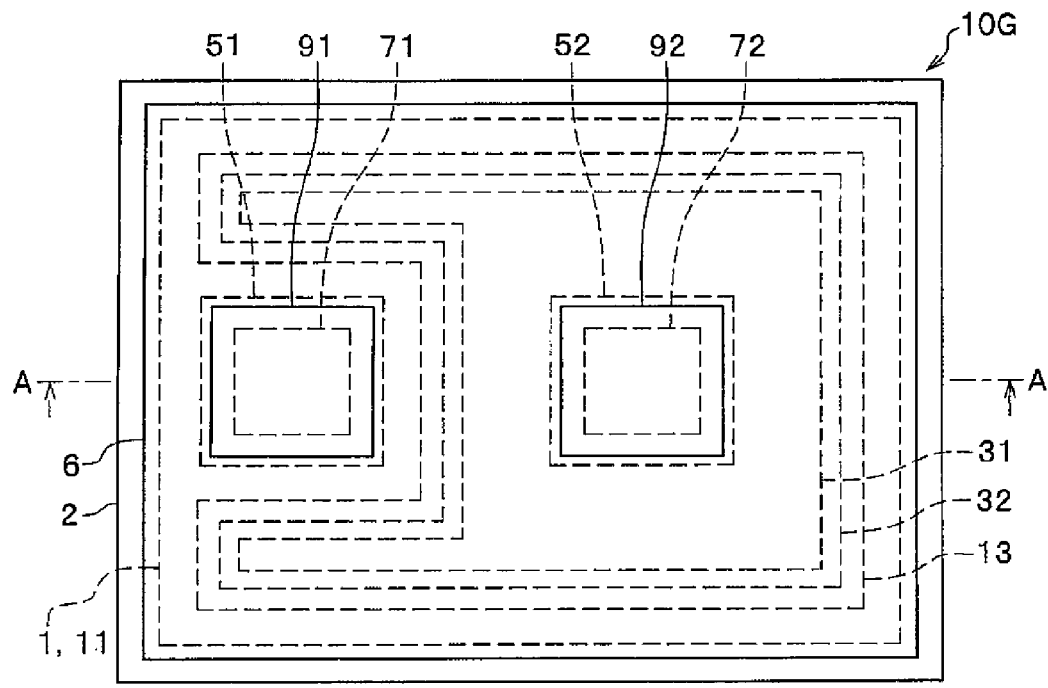
Figure 37B:
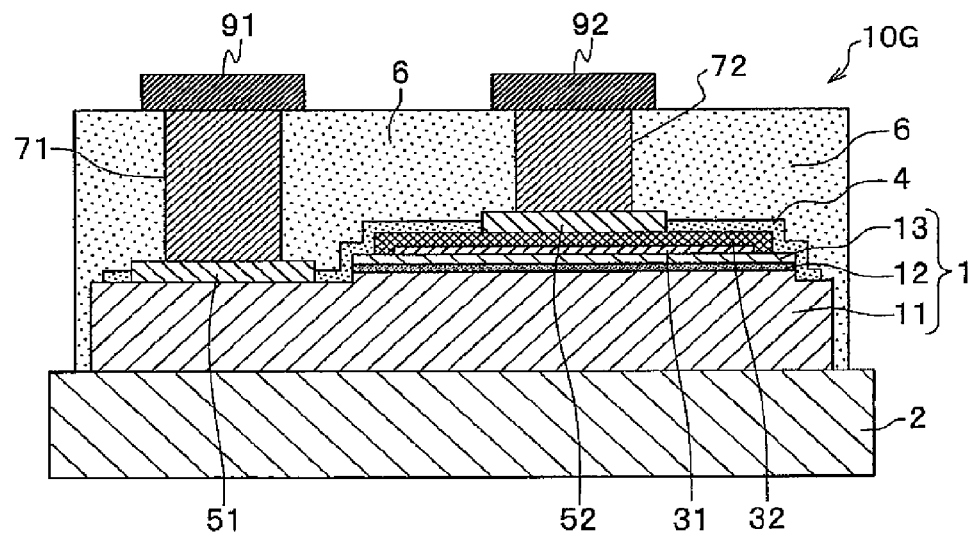

FIGS. 37A and 37B are schematic diagrams illustrating a structure of light emitting element manufactured by using a method of manufacturing a light emitting element according to Embodiment 7 of the present invention, in which FIG. 37A is a plan view, and FIG. 37B is an cross-sectional view taken along line A-A of FIG. 37A.

Figure 38:
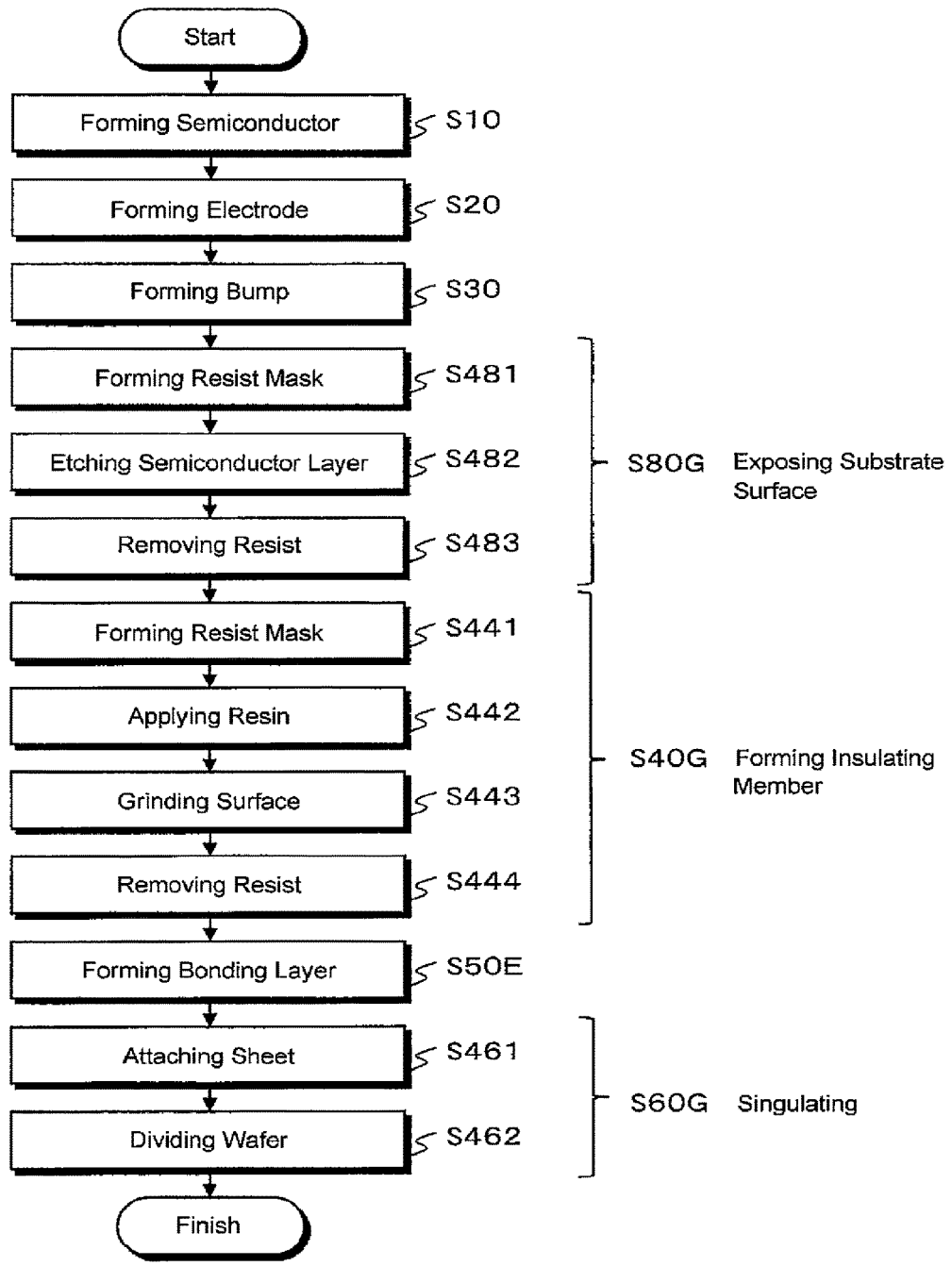

FIG. 38 is a flowchart illustrating a flow of processing in a method of manufacturing light emitting element according to Embodiment 7 of the present invention.

FIGS. 39A to 39D are schematic diagrams illustrating a method of manufacturing light emitting element according to Embodiment 7 of the present invention, in which FIGS. 39A to 39D each corresponds to a cross-section viewed from the direction of arrows along line A-A of FIG. 37A.

FIGS. 40A to 40D are schematic diagrams illustrating a method of manufacturing light emitting element according to Embodiment 7 of the present invention, in which FIGS. 40A to 40D each corresponds to a cross-section viewed from the direction of arrows along line A-A of FIG. 37A.

FIGS. 41A to 41D are schematic diagrams illustrating a method of manufacturing light emitting element according to Embodiment 7 of the present invention, in which FIGS. 41A to 41D each corresponds to a cross-section viewed from the direction of arrows along line A-A of FIG. 37A.

Figure 42:
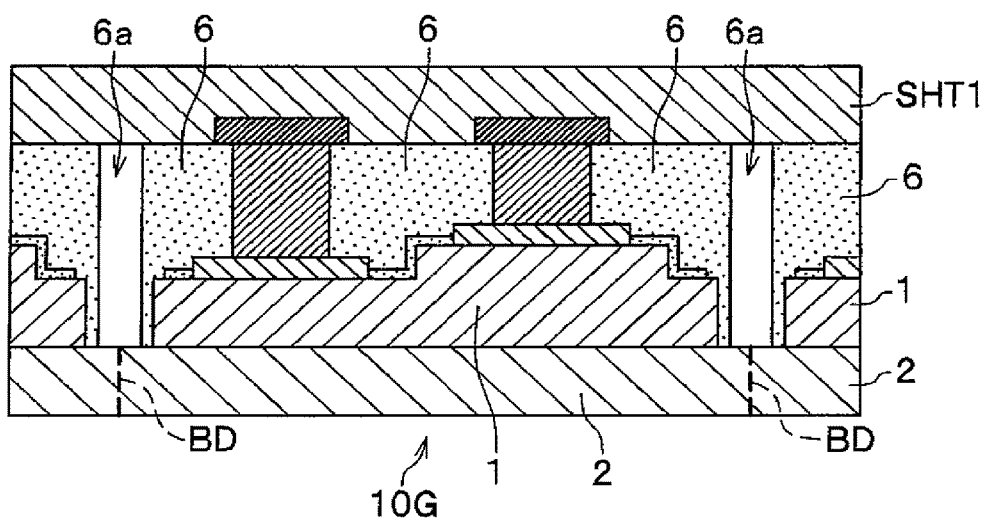

FIG. 42 is a schematic diagram illustrating a method of manufacturing light emitting element according to Embodiment 7 of the present invention, and corresponds to a cross-section viewed from the direction of arrows along line A-A of FIG. 37A.

DETAILED DESCRIPTION OF THE EMBODIMENTS

Referring to the drawings, a method of manufacturing light emitting element according to each embodiment of the present invention will be described below. First, a method of manufacturing light emitting element according to Embodiment 1 of the present invention will be described with reference to FIG. 1. In the specification, upper or lower of the light emitting element correspond to the stacking direction of the layers in the manufacturing (stacking layers from the lower side upward), or when illustrating referring to the drawings, unless specifically limited, correspond to upper or lower side in the drawings. The drawings are intended to illustrate details of the main components respectively, so that the dimensional relationships may differ.

First Embodiments: Light Emitting Element

The light emitting element 10 is a semiconductor element (semiconductor light emitting element) which emits light upon applied with a voltage, and for example, a light emitting diode (LED) made of a nitride semiconductor or the like can be employed. As shown in FIG. 1, in the present embodiment, the light emitting element 10 has a rectangular shape with a side (a longitudinal side) in a plan view (hereinafter may be referred to as a chip length) L0. In the light emitting element 10, a semiconductor structure 1 is formed on a light transmissive substrate 2, and on it, a protective layer 4, an n-side pad electrode 51 as an n-side electrode, a full-surface electrode 31 as a p-side electrode, a cover electrode 32, and a p-side pad electrode 52 are respectively disposed, and further, bumps 71, 72 are disposed on the n-side pad electrode 51 and the p-side pad electrode 52 respectively, and an insulating member 6 is disposed to enclose those components and the upper surface is formed in a flat surface. Further, the light emitting element 10 includes respectively, on the bumps 71, 72, bonding layers 91, 92 as electrically conductive bonding members for mounting.

Figure 1A:
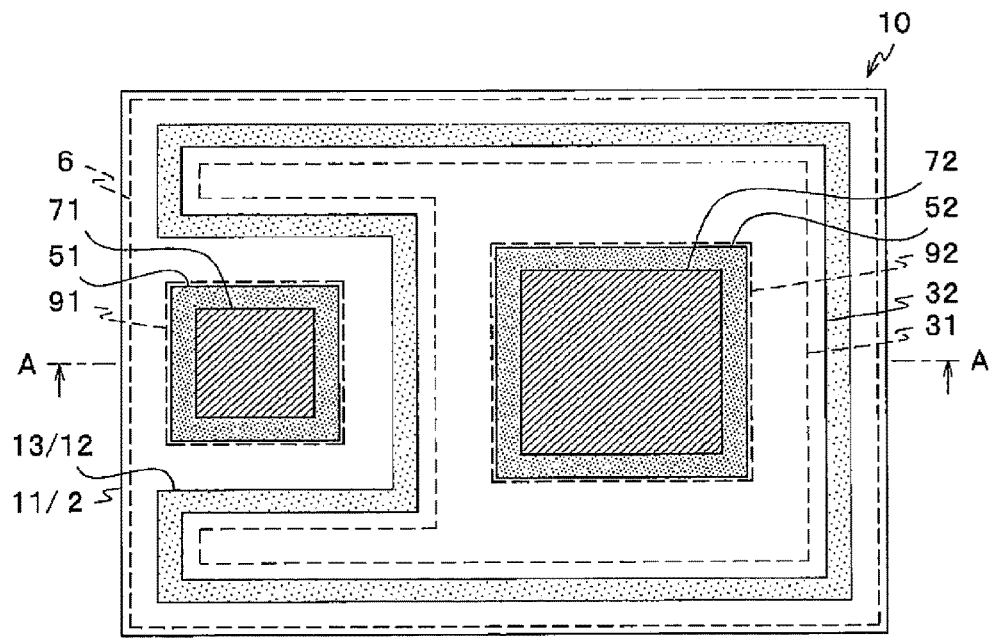

In FIG. 1A, the protective layer 4 is omitted and the insulating member 6 and the bonding layers 91, 92 are shown only by the outline with the dashed lines. Further in FIG. 1B, the insulating member 6 is viewed as transparent and shown only by the outline. For those members, a similar manner may be applied in the variations and Example 2 to be described below, unless specifically described. The light emitting element 10 is adopted for flip-chip mounting, in which, the upper surface serves as the mounting surface to a wiring substrate and the substrate 2 side, that is the lower surface, serves as the main emission surface. Components of the light emitting device 10 will now be described in detail below.

(Substrate)

A material of the substrate 2 is to be sufficient for allowing light emitted from the semiconductor structure 1 (active layer 12) to pass through and also allowing epitaxial growth of a nitride semiconductor as described below, and the size and the thickness, etc., of the material are not specifically limited. Examples of such a material of the substrate include, an insulating substrate such as sapphire having C-plane, R-plane or A-plane as a main surface, spinel ($MgAl_2O_4$) having (111) plane as a main surface, silicon oxide (SiC), ZnS, ZnO, Si, GaAs, diamond, and an oxide substrate such as lithium niobate and neodymium gallate that lattice matches with the nitride semiconductor. The semiconductor structure 1 which to be divided into a larger number of individual light emitting elements in a later manufacturing step is fabricated on a single substrate 2 (wafer), so that the substrate 2 is needed to have a certain degree of mechanical strength as a base member with a sufficient thickness. On the other hand, after fabricating semiconductor structures 1 and bumps 71, 72 etc., which constitute light emitting elements 10, in order to facilitate dividing, the thickness of the substrate 2 is preferably reduced by grinding the substrate 2 from the back-side surface (back-grinding).

(Semiconductor Structure)

The semiconductor structure 1 is made in such a way that an n-type semiconductor layer (first semiconductor layer) 11, an active layer 12, and a p-type semiconductor layer (second semiconductor layer) 13 are epitaxially grown in the order and stacked. Each of those layers is not specifically limited, but for example, a gallium nitride-based compound semiconductor such as $In_XAl_YGa_{1-X-Y}N$ ($0 \leq X$, $0 \leq Y$, $X+Y<1$) can be suitably used. The n-type semiconductor layer 11, the active layer 12, and the p-type semiconductor layer 13 may have a single-layer structure, respectively, or may have a stacked-layer structure, a superllatice structure etc., with layers having different compositions and thicknesses. Particularly, the active layer 12, which is the light emitting layer, preferably has a single quantum well structure or a multiquantum well structure, where thin layers are stacked and a quantum effect can occur, and further, the well layer is preferably a nitride semiconductor containing In. Also, on the substrate 2, an n-type semiconductor layer 11 maybe optionally formed via an under layer (not shown) such as a buffer layer for easing mismatch of lattice constant with the substrate 2.

In the light emitting element 10, the electrodes respectively connected to the n-type semiconductor layer 11 and the p-type semiconductor layer 13 are formed on the upper side of the light emitting element 10. Therefore, in a plan view, the active layer 12 and the p-type semiconductor layer 13 are not stacked on a part of the semiconductor structure 1 which leaves only the n-type semiconductor layer 11, so that the n-side pad electrode 51 can be connected on the n-type semiconductor layer 11. Such a semiconductor structure 1 can be formed by stacking the n-type semiconductor layer 11, the active layer 12, the p-type semiconductor layer 13 in this order on the substrate 2, then, using photolithography and etching, a part of the p-type semiconductor layer 13 and the active layer 12 are removed to expose the n-type semiconductor layer 11 in the region (n-side contact region) for forming the n-side pad electrode 51. Further, it is preferable that in the semiconductor structure 1, a part of the p-type semiconductor layer 13 and the active layer 12 are also removed in the peripheral region in a plan view, in a similar manner as in the n-side contact region. That is, the light emitting element 10 has a step differences on the four surfaces of the side surfaces (end surfaces). The semiconductor structure 1 is formed with such a shape, so that in the manufacturing of the light emitting element 10, grooves to facilitate singulating (scribing or dicing) can be formed with the light emitting elements 10 are in a state of being connected in a planar direction (refer to wafer 20, see FIG. 8). In FIG. 1A, the substrate 2 and the n-type semiconductor layer 11, and the active layer 12 and the p-type semiconductor layer 13 are respectively stacked with their outlines in plan view and are overlapped, and thus respectively referred to as "11/2", and "13/12", in which the layers of upper side are shown on the left.

(Electrode)

On the p-type semiconductor layer 13, the full-surface electrode 31, the cover electrode 32, and the p-side pad electrode 52 are stacked, thus, the p-type semiconductor layer 13 is electrically connected to the p-side bump 72. The full-surface electrode 31 is an electrode to diffuse the current uniformly in the plane of the p-type semiconductor layer 13, and in the light emitting element 10 to be mounted in flip-chip manner, also serves as a reflecting layer to reflect light emitted by the active layer 12 toward the substrate 2 which serves as the light extracting surface. The cover electrode 32 is to diffuse the electric current uniformly in the entire plane of the p-type semiconductor layer 13 as the full-surface electrode 31, and also covers the upper surface and the side surfaces of the full-surface electrode 31 so that the full-surface electrode 31 does not contact the p-side pad electrode 52, to serve as a barrier layer to prevent migration of the material of the full-surface electrode 31, particularly Ag. Therefore, the full-surface electrode 31 is formed on as much surface of the upper surface of the p-type semiconductor layer 13 as possible, but in order to allow formation of the cover electrode 32 to cover the end surfaces of the full-surface electrode 31, the full-surface electrode 31 is formed rather smaller than the cover electrode 32 in a plan view. The n-side pad electrode 51 and the p-side pad electrode 52 are the terminals to supply electric current from outside of the light emitting element 10, and also serve as the seed electrodes at the time of formation of the bumps 71, 72 by way of electrolytic plating.

The full-surface electrode 31 is preferably an ohmic electrode which can provide good electrical connection to the p-type semiconductor layer 13, and also preferably has good reflectance at least to the wavelength of light emitted at the active layer 12. Accordingly, for the full-surface electrode 31, a single layer made of Ag which has high optical reflectance or an alloy of Ag, or a multilayer which has the layer of Ag etc., as the lowermost layer and other layers made of Ni, Ti, etc. can be suitably employed. More preferably, a multilayer such as Ag/Ni/Ti/Pt, Ag/Ni/Ti/Ru, Ag/Ni/Ru, etc., in which Ag is employed as a lowermost layer (p-type semiconductor layer 13-side) can be employed, and the thickness of such a multilayer can be about 1000 nm. The full-surface electrode 31 can be made, for example, by sequentially stacking those materials by way of sputtering or vapor deposition.

For the cover electrode 32, for example, metal such as Ti, Au, W, Al, Cu, etc., or a single layer of an alloy of those metals, or a multilayer of those metals or alloys of those metals can be employed. Particularly, a multilayer of Ti/Au/W/Ti in which Ti is used as the lowermost layer (the full-surface electrode 31-side) is preferably employed.

The p-side pad electrode 52 is electrically connected to the p-type semiconductor layer 13 via the cover electrode 32 and the full-surface electrode 31, whereas the n-side pad electrode 51 is directly connected to (in contact with) the n-type semiconductor layer 11. For the pad electrodes 51, 52, in a similar manner as for general semiconductor element, a single layer or a multilayer of a metal electrode material such as a metal such as Au, Cu, Ni, Ti, Al, Pt, etc., or an alloy of those can be employed. The pad electrodes 51, 52 can be, for example, a multilayer having a lower layer of a Cu single layer or a Cu/Ni stacked layer and an upper layer of Au or an AuSn alloy. For the n-side pad electrode 51, in order to obtain good electrical contact with the n-type semiconductor layer 11, Ti, Al, or AlCuSi alloy, AlCu alloy, etc., is preferably employed for the lowermost layer, and more specifically, a multilayer such as, from the lower side, Ti/Au, Ti/Ni/Au, Al/Ti/Au, Al/Ti/Pt/Au, Ti/Pt/Au, or AlCuSi/Ti/Pt/Au may be employed.

(Protective Layer)

The protective layer 4 covers the exposed surfaces (upper surfaces and end surfaces) of the semiconductor structure 1 and the surfaces of the electrodes except the connecting surfaces to outside. In the light emitting element 10 fabricated according to the present embodiment, the protective layer 4 is formed on the surface of the semiconductor structure 1 and the upper surface of the cover layer 32 in the regions where the pad electrodes 51, 52 are not formed. Accordingly, in FIG. 1A, the outlines of the openings of the protective layer 4 (not shown) is in conformity to the outlines of the pad electrodes 51, 52. This can be achieved as described below in a method of manufacturing, the pad electrodes 51, 52 and the protective layer 4 are respectively formed with using the same mask. For the protective layer 4, an oxide of Si, Ti, Ta, Nb, Zr, Mg (such as $SiO_2$, $TiO_2$, $Ta_2O_5$, $Nb_2O_5$, $ZrO_2$, MgO), a nitride of Si (such as $Si_3N_4$), a nitride such as AN, or magnesium fluoride ($MgF_2$), or the like, can be used. A layer of those materials can be formed by using a known method such as vapor deposition, sputtering, or the like, during manufacturing the light emitting element 10.

(Insulating Member)

The insulating member 6 serves to fill the difference in the heights of the pad electrodes 51 and 52 to flatten the upper surface of the light emitting element 10 including the upper surfaces of the bumps 71, 72 formed on the pad electrodes 51, 52, and also has an effect of increasing the chip strength of the light emitting element 10. The insulating member 6 is, as shown in the dotted lines in FIG. 1A, in the light emitting element 10, formed so that in a plan view, the outline of the insulating member 6 is at inner side with respect to the outline of the light emitting element 10 (the substrate 2 and the n-type semiconductor layer 11). On the other hand, in the present embodiment, the insulating member 6 is disposed outer side with respect to the outlines of the p-type semiconductor layer 13 and the active layer 12 of the semiconductor structure 1, and with this shape, light emitted sideward from the active layer 12 is reflected to increase the downward (substrate-side) emission.

The insulating member 6 is preferably made of a material having a low optical transmittance to the light emitted from the semiconductor structure 1 (active layer 12) and outer light. Although the details will be described below in a method of manufacturing, the insulating member 6 is, in the manufacturing, formed to fill the gaps between the bumps 71, 72 etc., which are formed earlier on the semiconductor structure 1, and for this, a liquid material can be used and hardened to form the insulating member 6, in which, grinding is carried out on the hardened material together with the bumps 71, 72 which are made of a metal material, so that a material having a certain degree of mechanical strength (hardness) in its hardened state is employed. Also, the insulating member 6 is shaped by way of lift-off, so that a material having chemical-resistance is employed to endure removal of resist-mask and formation (developing) and removal of resist mask while disposing the bonding layers 91, 92 which are subsequently performed. Examples of such a material include a thermosetting resin and thermoplastic resin, more specifically, a phenol resin, an epoxy resin, a BT resin, a PPA, and a silicone resin. Also, in order to reflect light emitted from the side surfaces (end surfaces) of the semiconductor structure 1, the insulating member preferably has a white color which has a high reflectance. Further, in order to further enhance the reflectance, powder of a reflecting material (for example, $TiO_2$, $SiO_2$, $Al_2O_3$, $ZrO_2$, MgO) which does not tend to absorb light emitted from the semiconductor structure 1 and has a difference in reflectance to the resin material which serves as a parent material, may be dispersed beforehand in the resin material.

(Bump)

In the light emitting element 10, the bumps 71, 72 are formed to electrically connect the pad electrodes 51, 52 which have different heights with each other to the wirings (lead electrodes) which are on a same plane of the mounting substrate (not shown). Thus, the bottom surfaces of the bumps 71, 72 are connected to the pad electrodes 51, 52 respectively and the top surfaces are formed on a same plane which serves as the mounting surface of the light emitting element 10. Accordingly, the bump of the n-side has a greater thickness than the bump of the p-side. With a method of manufacturing a light emitting element according to an embodiment of the present invention, all side surfaces (circumference) of the bumps 71, 72 in a light emitting element are embedded in the insulating member 6, so that at the time of flip-chip mounting, the bumps themselves are not pressure bonded by being contactingly pressed by the lead electrodes as in a narrowly defined bumps. Accordingly, as described later, the light emitting element 10 has the bonding layers 91, 92 on the bumps 71, 72 to bond to the lead electrodes.

The Bumps 71, 72 are preferably plated layers so as to be formed in a sufficient thickness with a good productivity, and a metal electrode material which can be disposed by way of electrolytic plating which uses the pad electrodes 51, 52 as the seed electrodes. More specifically, for the bumps 71, 72, a single layer made of Cu, Au, AuSn or the like, or a multilayer made of Cu/Ni/Au, Cu/Ni/AuSn or the like may be employed.

(Bonding Layer)

The bonding layers 91, 92 are formed on the upper surfaces of the insulating members 6 and are electrically connected to the pad electrodes 51, 52 via the bumps 71, 72, respectively. The bonding layers 91, 92 are electrically conductive bonding members which serve to adhere while being electrically connected to the bumps 71, 72 to the wirings (lead electrodes) of the mounting substrate (not shown). The bonding layers 91, 92 are formed on the flattened upper surface of the insulating member 6, so that the bonding layers 91, 92 have a same thickness with each other sufficient to be connected to the lead electrodes respectively. For the bonding layers 91, 92, a eutectic alloy such as Au—Sn, Sn—Cu, or Sn—Ag—Cu may be employed, or so-called narrowly-defined bumps having a ball (hemispherical) shape such as Au bump etc., may be employed.

First Embodiment: Method of Manufacturing Light Emitting Element

Referring to FIGS. 2 to 9B, a method of manufacturing a light emitting element according to Embodiment 1 of the present invention will be described. FIGS. 5A to 9B which are schematic diagrams illustrating the steps of the manufacturing show a single light emitting element (chip) and a part of the other chips connected to the single chip. Also, in FIGS. 5 to 9, each component constituting a light emitting element prior to be processed is also assigned the same reference numeral.

Figure 2:
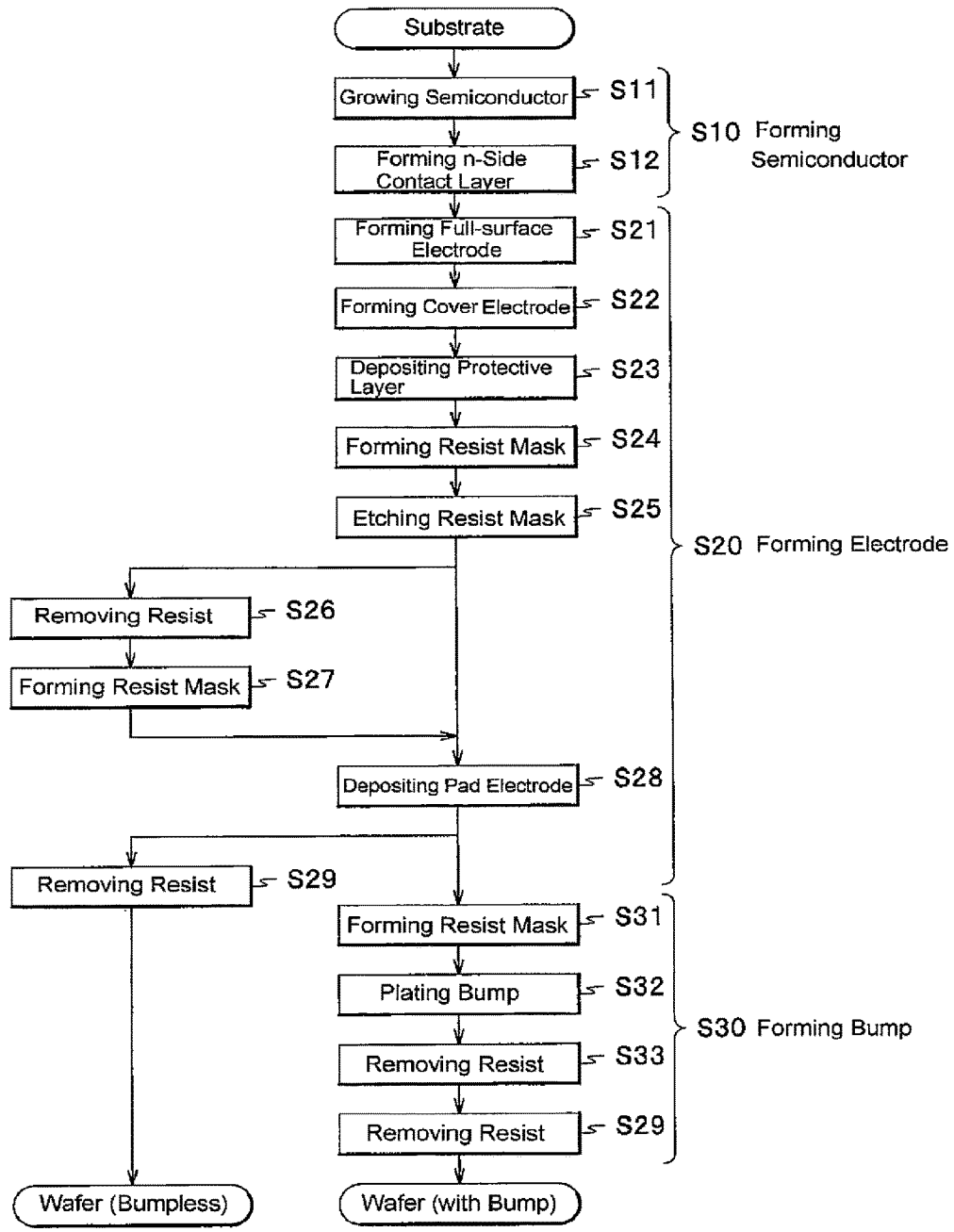
FIG. 2 is a flowchart illustrating manufacturing steps of forming semiconductor, forming electrode, and forming bump in a method of manufacturing light emitting element according to an embodiment of the present invention.
Figure 3:
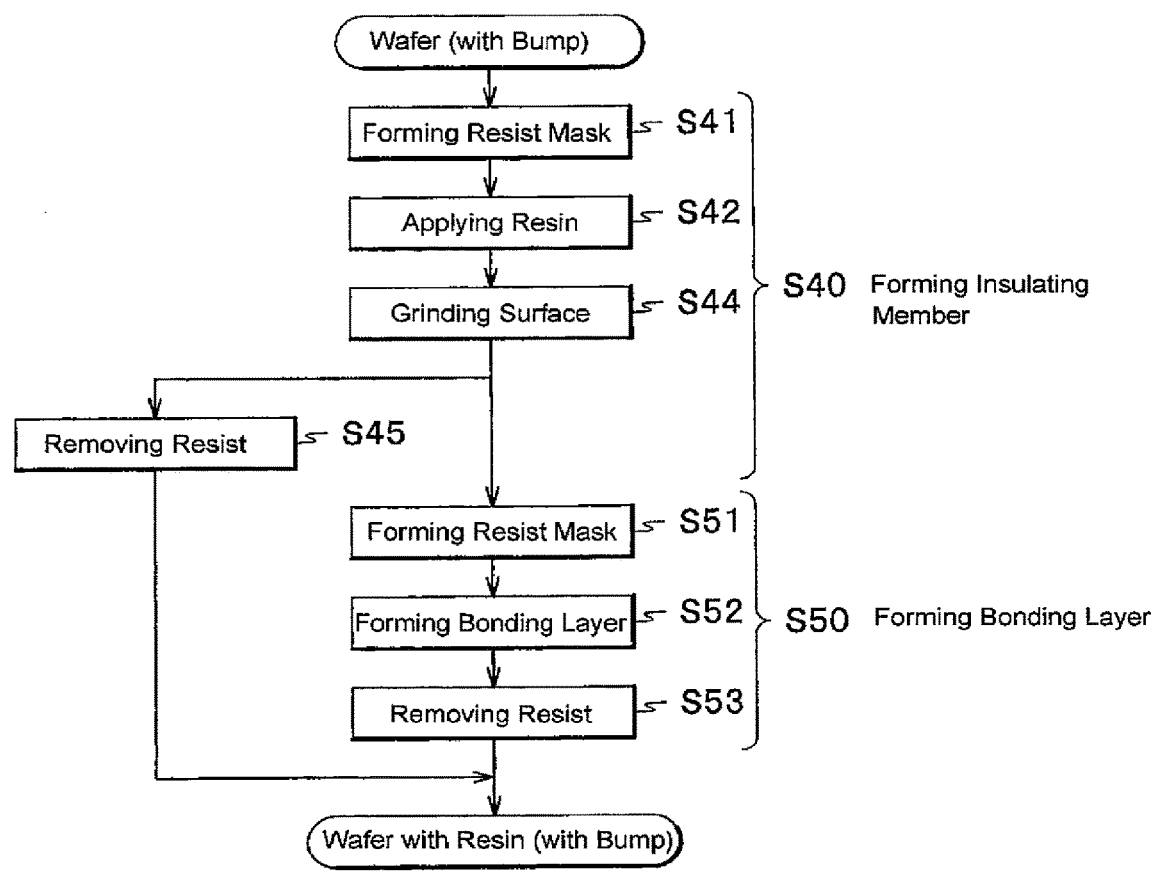
FIG. 3 is a flowchart illustrating forming insulating member and forming bonding layer in a method of manufacturing light emitting element according to Embodiment 1 of the present invention.
Figure 4:
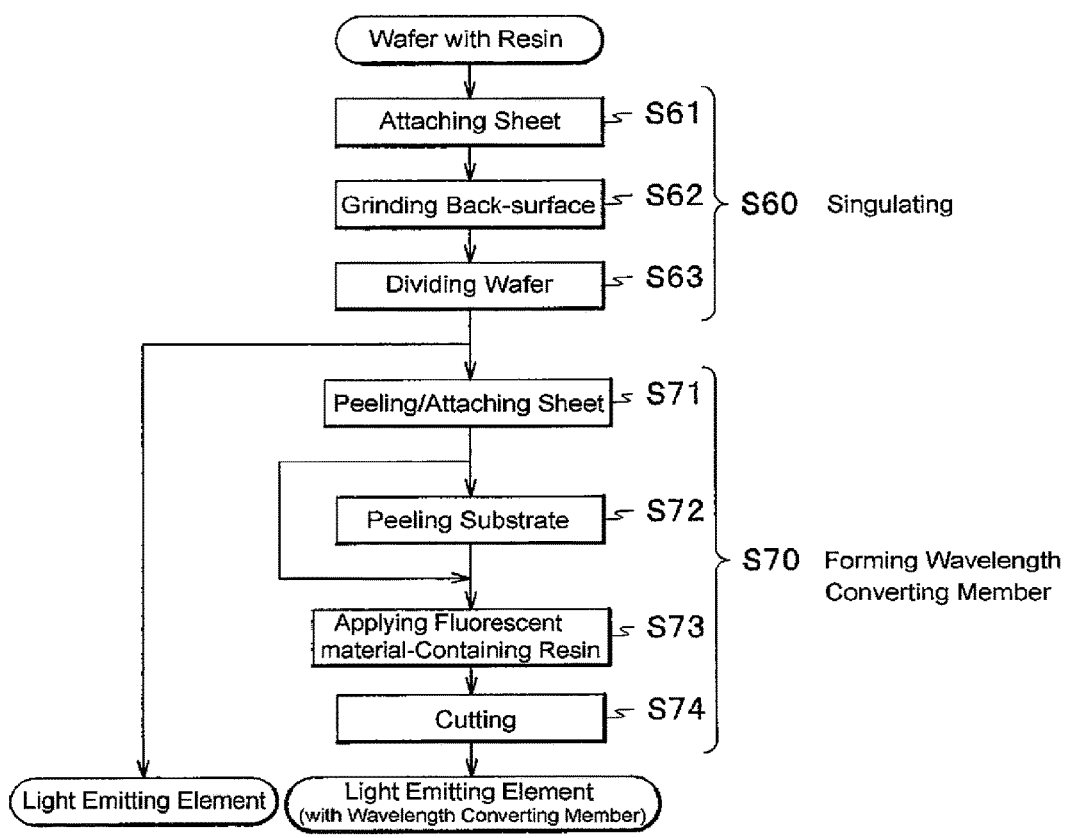
FIG. 4 is a flowchart illustrating singulating and forming wavelength converting member in a method of manufacturing light emitting element according to Embodiment 1 of the present invention.

A wafer of the light emitting elements 10 are, as shown in FIG. 2, produced through the manufacturing steps of Forming Semiconductor: S10 in which the semiconductor structure 1 is formed on the substrate 1, Forming Electrode: S20 in which the full-surface electrode 31, the cover electrode 32, and the pad electrodes 51, 52 are formed, and Forming Bump: S30 in which the bumps 71, 72 are formed. Then, as shown in FIGS. 3, 4, through the manufacturing steps of Forming Insulating Member: S40 in which the insulating member 6 is formed on the wafer, Forming Bonding Layer (Forming Electrode-Bonding Layer): S50 in which the bonding layers 91, 92 are formed, and Singulating: S60 in which the wafer is divided, the light emitting elements 10 (chips) are produced.

Figure 8A:
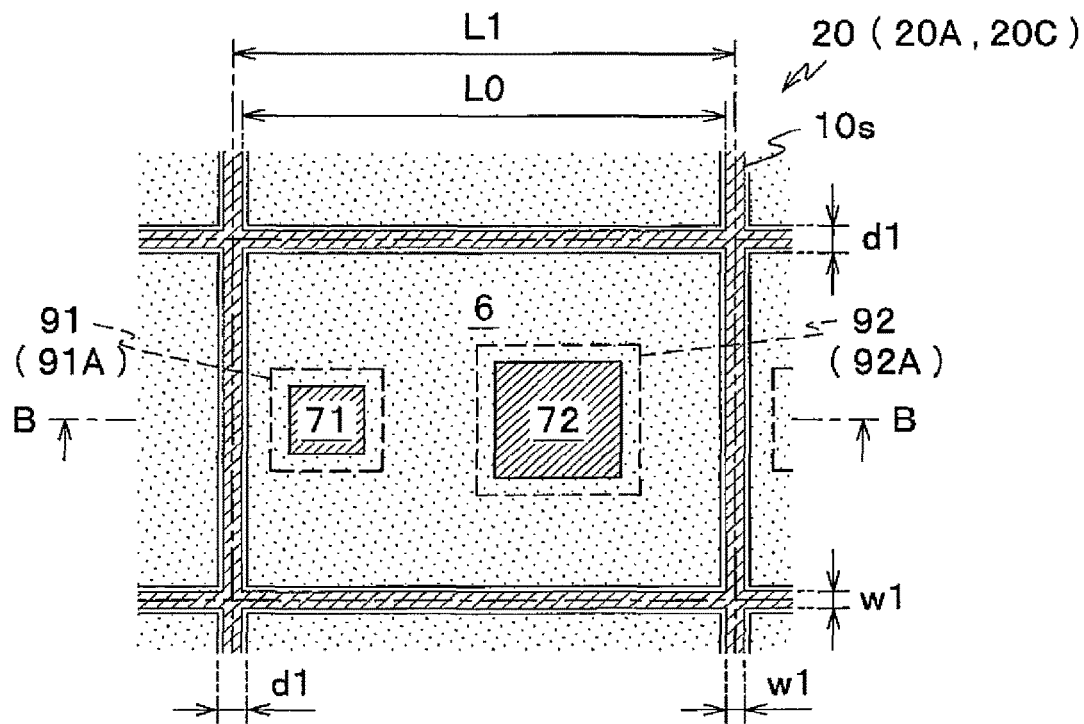

As described above, the light emitting element chips are obtained as completion by dividing the wafer of the light emitting elements 10. FIG. 8 shows a part of the light emitting elements 10 in a connecting state (referred to as a wafer 20) before being divided. As shown in FIG. 8, the wafer 20 is the light emitting elements 10 in a connecting state in a matrix shape, in which the center lines of borders between adjacent chips (light emitting elements 10, 10) are referred to as the dividing lines and shown by alternate long and short dash lines. The wafer 20 is divided along the dividing lines, so that there is a loss of regions of certain widths on the dividing lines. In detail, in the case where the wafer 20 is divided by scribing, grooves for cleaving (breaking) are formed earlier (for example in the Forming Semiconductor: S10), so that a part of the semiconductor structure 1, which is at least a part of the p-type semiconductor layer 13 and a part of the active layer 12 corresponding to the grooves are removed. Also, in the case where the wafer 20 is divided (cut) by dicing, a portion corresponding at least to the width (thickness) of the blade is reduced at the time of cutting. Further, through a process such as breaking or chipping, a small break (chipping) may occur along the dividing lines on the wafer 20, around the chips on the wafer 20. Such a region to be lost, more precisely, a region to be potentially lost also by chipping etc., are provided beforehand to the wafer 20 as "margins" which are not included in the regions of the light emitting elements 10, and are referred to as "streets (or spacing, scribing lines, dicing lanes etc.)". In FIG. 8A, the streets (dividing regions) 10s having a width of w1 are shown with hatching.

First, a method of manufacturing a wafer before forming an insulating member, that is, an example of manufacturing steps S10 to S30 will be described.

(Forming Semiconductor: Growing Semiconductor)

The nitride semiconductors respectively constituting the n-type semiconductor layer 11, the active layer 12, and the p-type semiconductor layer 13 are grown on the substrate 2 (S11), then, annealing is performed in a nitrogen atmosphere to reduce the resistance of the p-type semiconductor layer 13.

In a method of manufacturing a light emitting element according to an embodiment of the present invention, a method of forming the semiconductor structure 1 is not specifically limited, and a method known for growing a nitride semiconductor such as a MOVPE (metalorganic vapor phase epitaxial growth method), a MOCVD (metalorganic chemical vapor deposition growth method), a HVPE (hydride vapor phase epitaxy method), and a MBE (molecular beam epitaxy method) can be employed suitably. Especially, MOCVD is preferable, because good crystallinity can be obtained by using this method. Also, it is preferable that each layer 11, 12, 13 of the semiconductor structure is grown by using a growth method that is selected properly according to its use.

(Forming Semiconductor: Forming n-Side Contact Region)

In order to expose the n-type semiconductor layer 11 on a part of the surface (upper layer) to obtain a contact region for connecting the n-side pad electrode 51, etching is carried out on the p-type semiconductor layer 13 and the active layer 12. At the same time, etching is carried out on the regions to be the periphery of the light emitting elements (chips) 10 to a same depth as the n-side contact region (S12). At this time, for preparation of the Singulating: S60 which to be performed in later steps, upper surface of the street 10s (see FIG. 8A), more precisely regions of the streets 10s having a width of w1 or greater are etched to form grooves. In scribing, the grooves serve as start points of breaking as described above. On the other hand, in dicing, corresponding portions of the semiconductor structure 1 (p-type semiconductor layer 13 and the active layer 12) are removed beforehand so as to avoid physical impact exerted by the blade. In detail, on the substrate 2 (hereinafter may be referred to as a "wafer") on which each layer of the semiconductor structure 1 is grown, a mask is disposed by way of photoresist except on the n-side contact region and the street 10s. Then, using reactive ion etching (RIE), a part of the p-type semiconductor layer 13 and the active layer 12 and further a part of the upper portion of the n-type semiconductor layer 11 are removed to expose the n-side contact layer (not shown) of the n-type semiconductor layer 11.

(Forming Electrode: Forming Full-Surface Electrode and Cover Electrode)

Figure 5A:
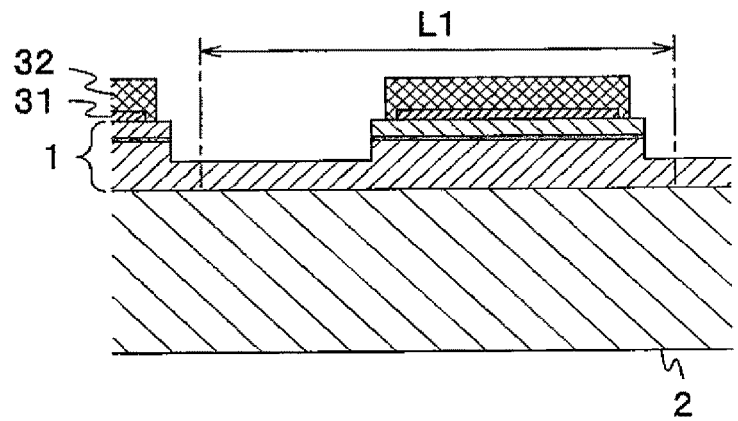
FIGS. 5A to 5D are schematic diagrams illustrating a method of manufacturing light emitting element according to an embodiment of the present invention, in which FIGS. 5A to 5D each corresponds to a cross-section viewed from the direction of arrows along line A-A of FIG. 1A.

On the p-type semiconductor layer 13, the full-surface electrode 31 is formed by using sputtering method and lift-off method, or the like (S21). Further, on the p-type semiconductor layer 13, the cover electrode 32 is formed in a similar manner with a size slightly greater than the full-surface electrode 31 in plan view (S22). FIG. 5A is a cross-sectional view at completion of the manufacturing step S22. In FIG. 5A, the alternate long and short dash lines indicate dividing lines for the Singulating S60 to be performed, and the interval (pitch) between the light emitting elements 10 in the longitudinal direction (the lateral direction in the figure) is indicated as L1 (>L0).

(Forming Electrode: Forming Protective Layer and Pad Electrode)

Figure 5B:
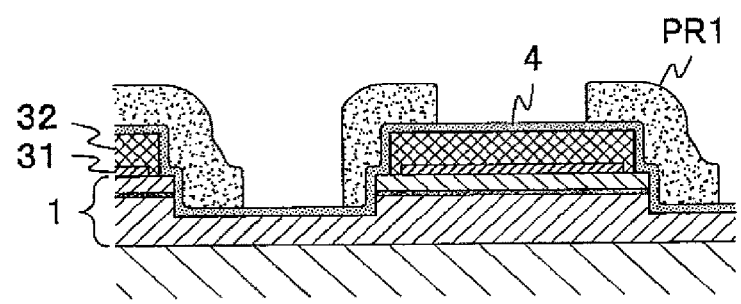
Figure 5C:
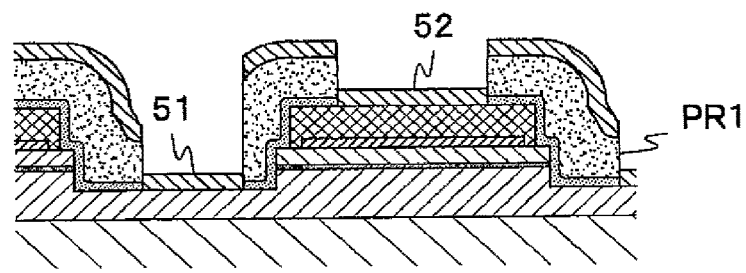

The insulating layer such as SiO2 which serves as a protective layer 4 is formed on the whole upper surface (entire surfaces of the semiconductor structure 1 and the cover electrode 32) of the wafer. Next, as shown in FIG. 5B, the resist mask PR1 is formed on the wafer (insulating layer) except for the regions to form the pad electrodes 51, 52: (S24). Then, etching is carried out to remove the insulating layer to form the protective layer 4: (S25). Next, as shown in FIG. 5C, a metal layer to serve as the pad electrodes 51, 52 is disposed on the resist mask PR1: (S23). With this arrangement, the n-side pad electrode 51 and the p-side pad electrode 52 are formed on the regions which are not covered with the protective layer 4 which is on the surface of the semiconductor structure 1 and the cover electrode 32.

(Forming Bump)

Figure 5D:
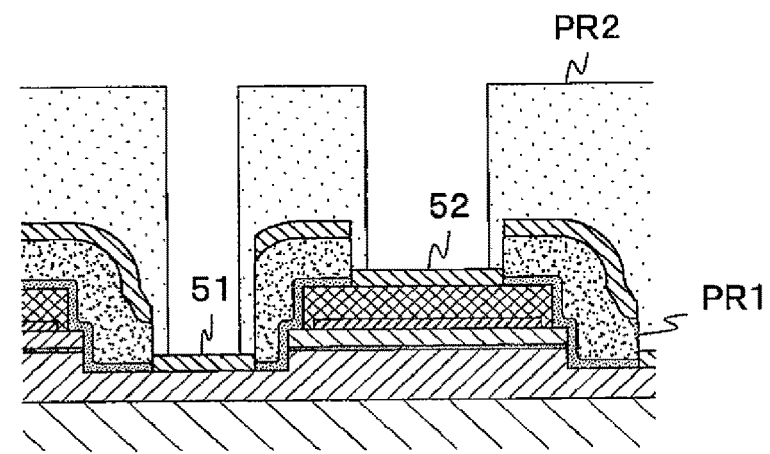
Figure 6A:
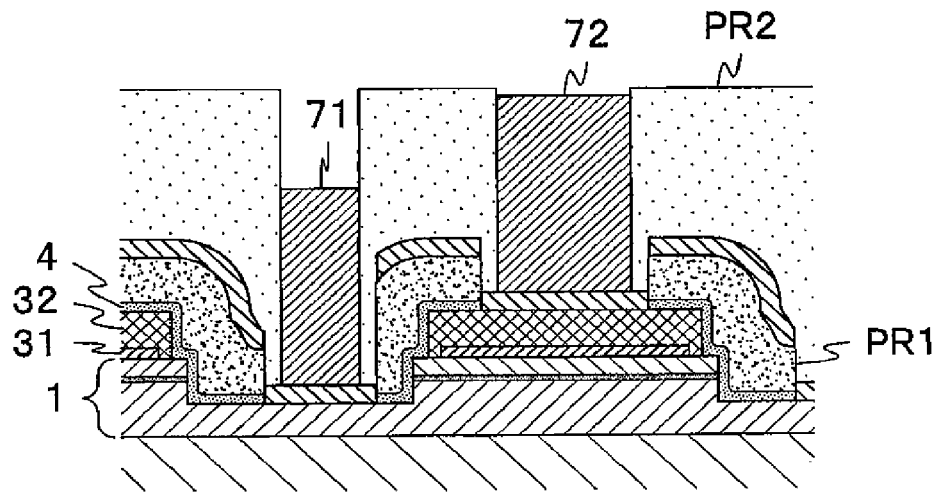
FIGS. 6A to 6C are schematic diagrams illustrating a method of manufacturing light emitting element according to an embodiment of the present invention, in which FIGS. 6A to 6C each corresponds to a cross-section viewed from the direction of arrows along line A-A of FIG. 1A.
Figure 6B:
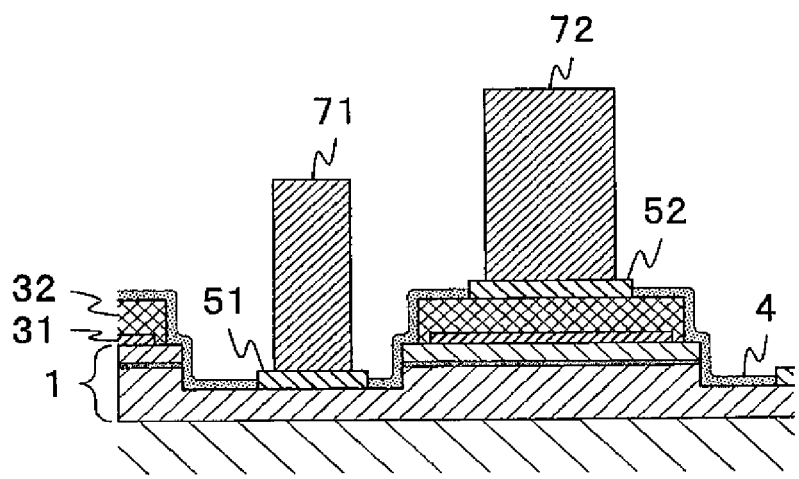

As shown in FIG. 5D, the resist mask PR2 is further formed on the resist mask PR1 and the metal layer on the resist mask PR1 except for the regions for forming the bumps 71, 72: (S31). Then, as shown in FIG. 6A, by way of plating, the bumps 71, 72 are formed on the pad electrodes 51, 52: (S32). Next, the resist mask PR2 is removed (S33) and subsequently, the resist mask PR1 is removed together with the metal layer on the resist mask PR1: (lift-off, S29). Thus, the wafer of the semiconductor structures 1 with bumps as shown in FIG. 6B is manufactured.

A method of manufacturing a light emitting element according to Embodiment 1, in which, from the wafer with bumps thus obtained light emitting elements (chips) whose surfaces (upper surfaces) including the bumps are flattened by the insulating member to be described below.

(Forming Insulating Member)

Figure 6C:
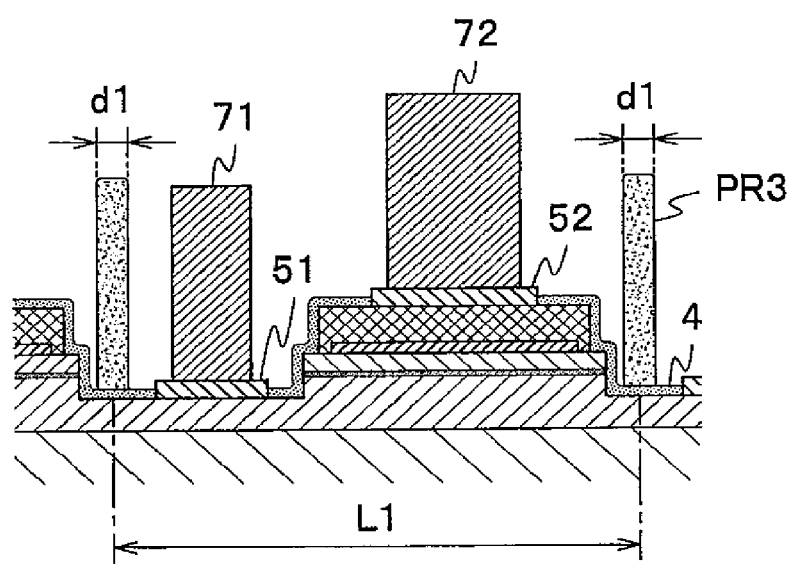

As shown in FIG. 6C, on the wafer, along the dividing lines, the resist masks with a predetermined width d1 are formed: (S41). The width d1 is equal to or greater than the width w1 (d1>w1) of the streets 10s (see FIG. 8A). Also, the resist mask PR3 is formed with a thickness so that the upper surface of the resist mask PR3 is higher than the height of the upper surface of the light emitting elements 10 at completion. Next, a liquid resin material of the insulating member 6 is applied on the wafer with a height as shown by a dotted line in FIG. 7A, greater than the height of the upper surfaces of the light emitting elements 10 at completion, preferably with a height equal to or higher than the height of the upper surface of the bumps 72 at the p-sides, then the liquid resin material is cured: (S42). Then, the cured resin material (insulating member 6) is ground from the top, to expose the top surfaces of the resist mask PR3 and the bumps 71, 72 on the upper surface of the wafer (exposing), and also to flatten the upper surface of the wafer: (S44). With this, the insulating member 6 is applied on the wafer except for the regions where the bumps 71, 72 which are the connection region for establishing electrical connection between a pair of electrodes with outside are disposed, and the region where the resist masks PR3 are formed, that is, the regions which include the streets (dividing region) 10s.

(Forming Bonding Layer)

Figure 7A:
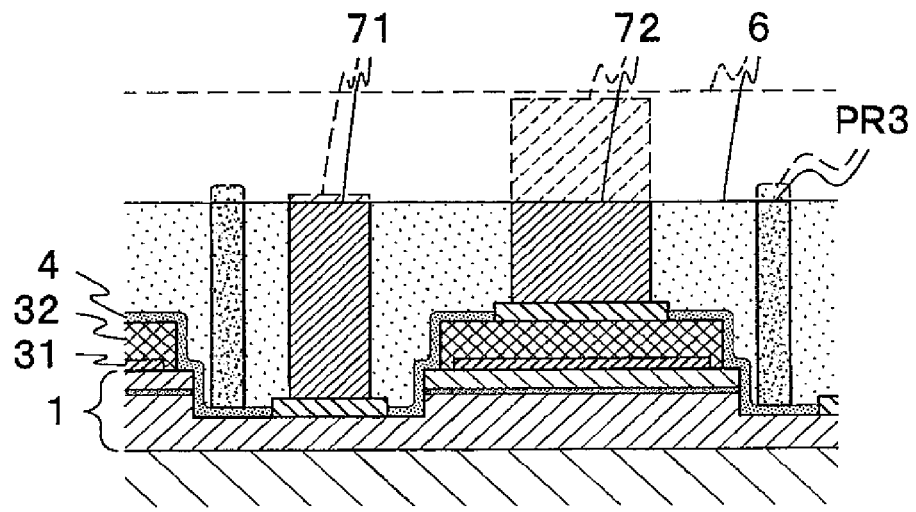
FIGS. 7A to 7C are schematic diagrams illustrating a method of manufacturing light emitting element according to an embodiment of the present invention, in which FIGS. 7A to 7C each corresponds to a cross-section viewed from the direction of arrows along line A-A of FIG. 1A.
Figure 7B:
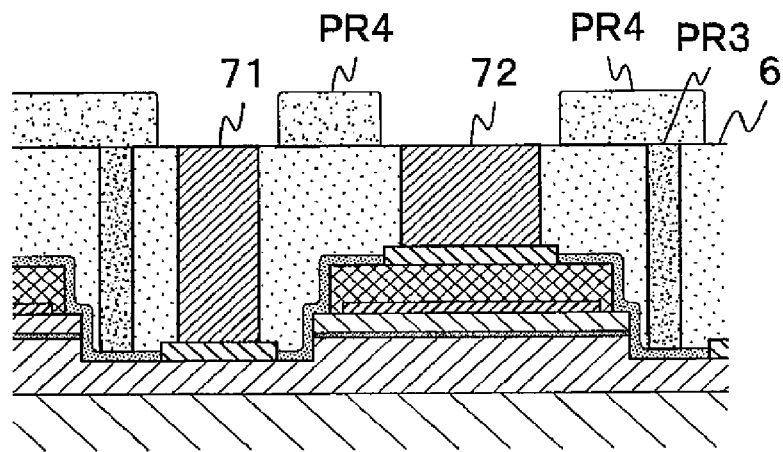
Figure 7C:
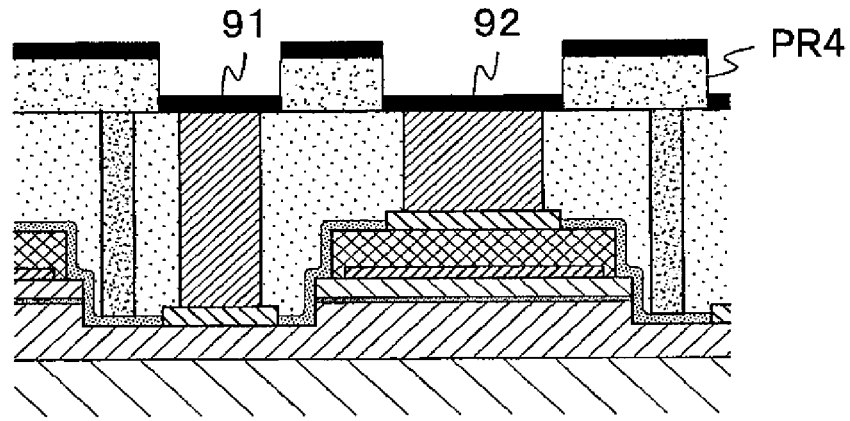
Figure 8B:
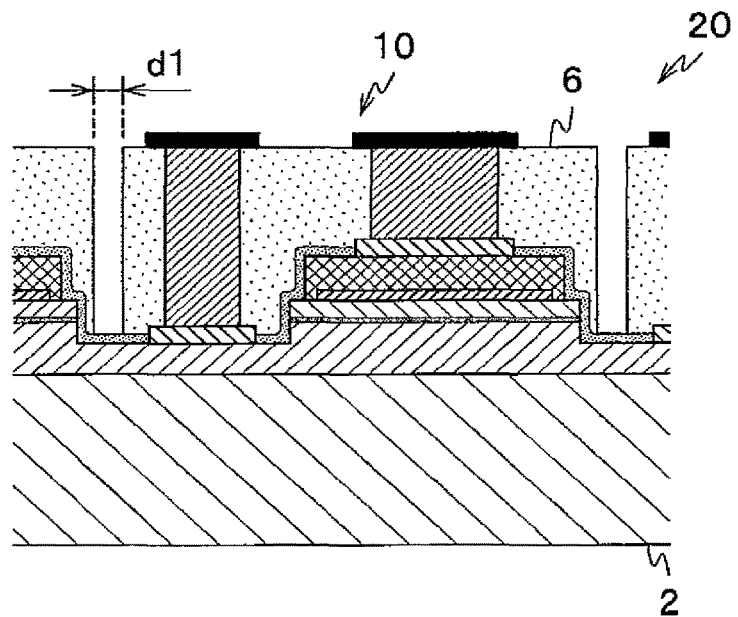

As shown in FIG. 7B, the resist mask PR4 is formed except for the regions on the bumps 71, 72 where the bonding layers 91, 92 to be formed: (S51). Next, as shown in FIG. 7C, a metal layer to form the bonding layers 91, 92 is disposed on the resist mask PR4: (S52). With this, the bonding layers 91, 92 are formed on the regions where the resist mask PR4 is not formed. Next, the resist mask PR4 and the resist mask PR3 on the dividing lines are removed: (S53). Accordingly the wafer 20 is obtained, in which, as shown in FIGS. 8A and 8B, the light emitting elements 10 are connected with each other, and the insulating member 6 is disposed with the gaps of the width d1 which include the streets (dividing regions) 10s. The gaps are formed in a grid shape in a plan view. The grid shape is formed along the dividing lines of the light emitting elements 10. Further, the bonding layers 91, 92 (only the outlines are shown in dotted lines in FIG. 8A) are disposed on the bumps 71, 72 respectively in each light emitting element 10.

(Singulating)

Figure 9A:
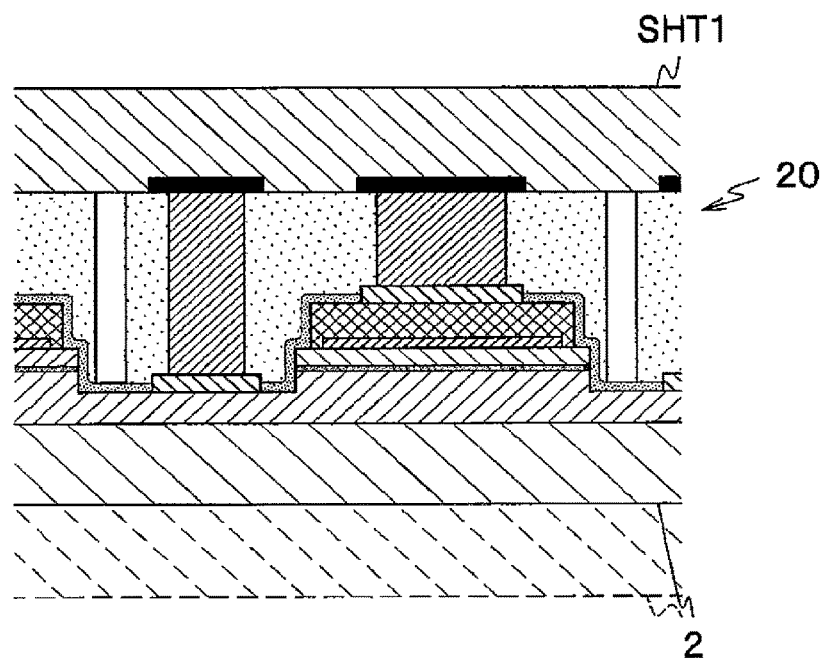
FIGS. 9A and 9B are schematic diagrams illustrating a method of manufacturing light emitting element according to an embodiment of the present invention, in which FIGS. 9A and 9B each corresponds to a cross-section viewed from the direction of arrows along line A-A of FIG. 1A.
Figure 9B:
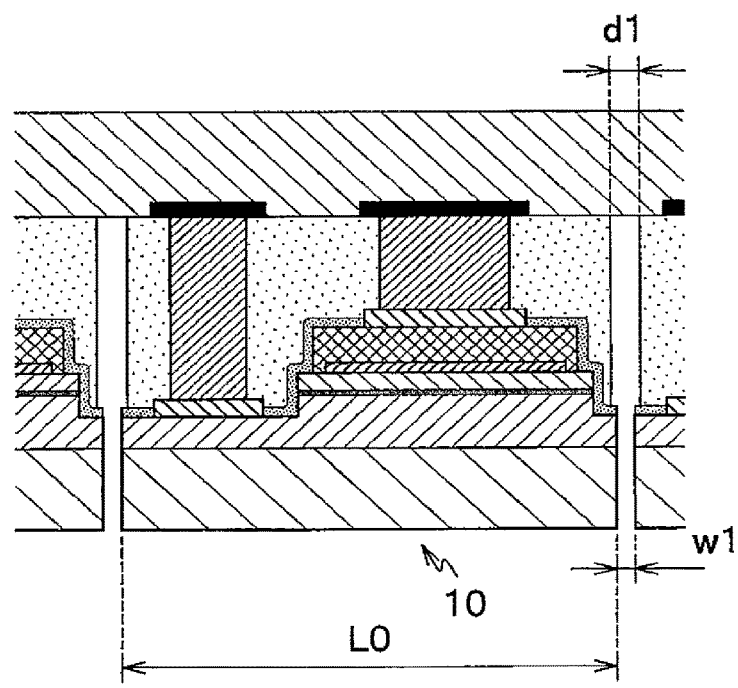

As shown in FIG. 9A, the side of the wafer 20 having the insulating member 6 is adhered to a adhesive sheet SHT1 (S61), and the substrate 2 is ground (back-surface grinding or back-grinding) to reduce the thickness to allow dividing of the wafer 20, as shown in the solid line in FIG. 9A (S62). Next, as shown in FIG. 9B, the wafer 20 is divided along the dividing lines (S63), thus, individual light emitting elements 10 (chips) are completed. In the dividing, the streets 10s on the dividing lines are removed, so that the light emitting elements 10 thus obtained have a chip length L0 of (L1−w1) (see FIG. 8A). The adhesive sheet SHT1 which is used to protect the semiconductor elements (wafer, chips) is employed for back-grinding, dicing, etc., in manufacturing semiconductor elements (semiconductor devices).

According to a method of manufacturing a light emitting element according to Embodiment 1, in the Singulating: S60 (Dividing: S63), the insulating member 6 is not present in the regions (streets 10s) which are removed by cutting (dicing) or by cleaving (breaking). Having the insulating member removed, the substrate 2 with reduced thickness, the n-type semiconductor layer 11 of the semiconductor structure 1, and the protective layer 4 are the only portions to be processed (by cutting or cleaving). Thus, a dicing method which allows a narrow streets w1 can be employed, and the wafer can be divided by a thin blade or laser scribing, and also the detachment of the insulating member 6 can be prevented. Accordingly, at the time of designing a chip layout on a wafer, the width of the streets between adjacent chips can be reduced, which allows an increase of the number of the light emitting element obtained from a single wafer.

According to Embodiment 1 of a method of manufacturing a light emitting element, in the Forming n-side Contact Region (S12) in the Forming Semiconductor: S10, the semiconductor structure 1 may have side surfaces formed in an upwardly narrowing tapered-shape (narrowing toward the p-type semiconductor layer 13 side) (not shown). In such light emitting elements 10, the side surfaces (end surfaces) of the semiconductor structure 1 are at an angle, so that light emitted in lateral directions can be reflected at the insulating member 6, which can facilitate emission to the substrate 2 side. Also, a groove narrowing (thinning) downward (toward the bottom) is formed in each street 10s, which allows an improvement in positional accuracy of breaking particularly when dividing the wafer 20 by scribing in the Singulating: S60.

According to Embodiment 1 of a method of manufacturing a light emitting element, the light emitting elements 10 having a eutectic multilayer as the reflecting layer instead of the full-surface electrode 31 on the p-type semiconductor layer 13 can be fabricated. In such a light emitting element, an electrically conductive oxide layer which is a transparent electrode material is applied on an approximately entire surface of the p-type semiconductor layer, and a multilayer with a number of holes are stacked on the electrically conductive oxide layer, and further, the p-side pad electrode is formed on the multilayer, so that the p-side pad electrode is connected to the electrically conductive oxide layer via the holes of the multilayer (not shown).

In the light emitting element 10 according to Embodiment 1 of a method of manufacturing a light emitting element, the bonding layers 91, 92 which serve as a bonding member at the time of mounting are disposed on the bumps 71, 72. But at the time of mounting, without providing a bonding member to the light emitting elements 10, bonding can be carried out by coating or dripping a solder, an Ag paste, or the like on the surfaces of the bumps 71, 72 or on the lead electrodes of the wiring substrate. Also, for the light emitting elements 10, a structure is employed in which, the end surfaces of the semiconductor structure 1 (active layer 12) is covered with an insulating member 6 via the protective layer 4 to reflect light emitted in lateral directions to emit light toward the substrate 2 side with high efficiency, but a structure which allows emission in lateral directions can also be employed. In order to convert the wavelength of light emitted from the light emitting elements 10, after mounting on the wiring substrate, a light transmissive resin material may be applied to enclose the light emitting elements 10, but the light emitting elements 10 may be covered with a resin which contains a fluorescent material at the time of singulating the light emitting elements 10 (chips). Next, with reference to FIGS. 10A through 12C, a method of manufacturing a light emitting element according to a variation of Embodiment 1 (appropriately referred to as Variation 1) of the present invention and a light emitting element fabricated by the method of manufacturing will be described. In the following, identical members or members of same quality are assigned the same reference numerals and description thereof will be appropriately omitted.

Embodiment 1: Variation 1

Figure 1B:
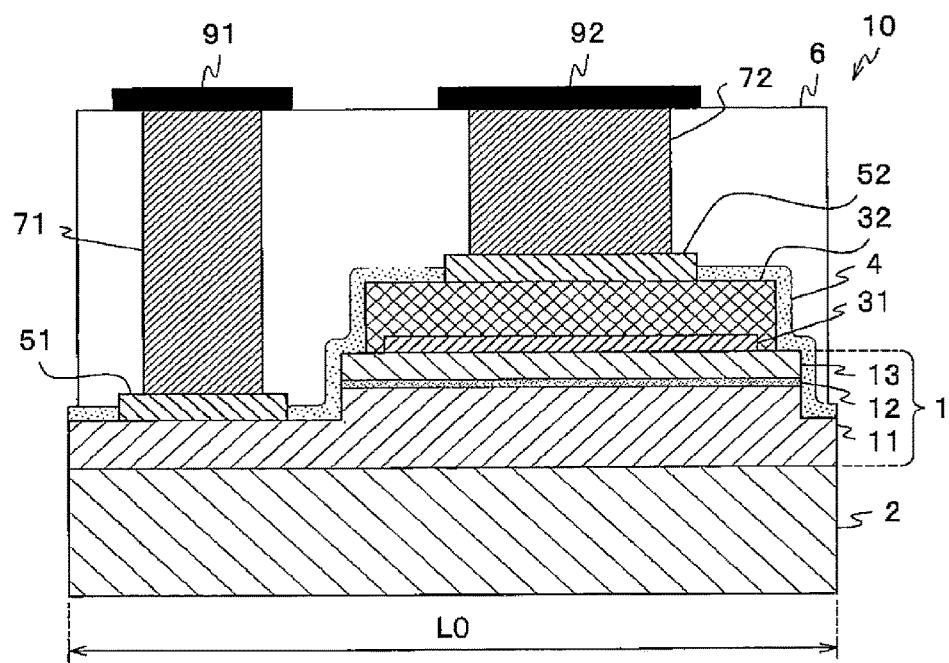
Figure 10A:
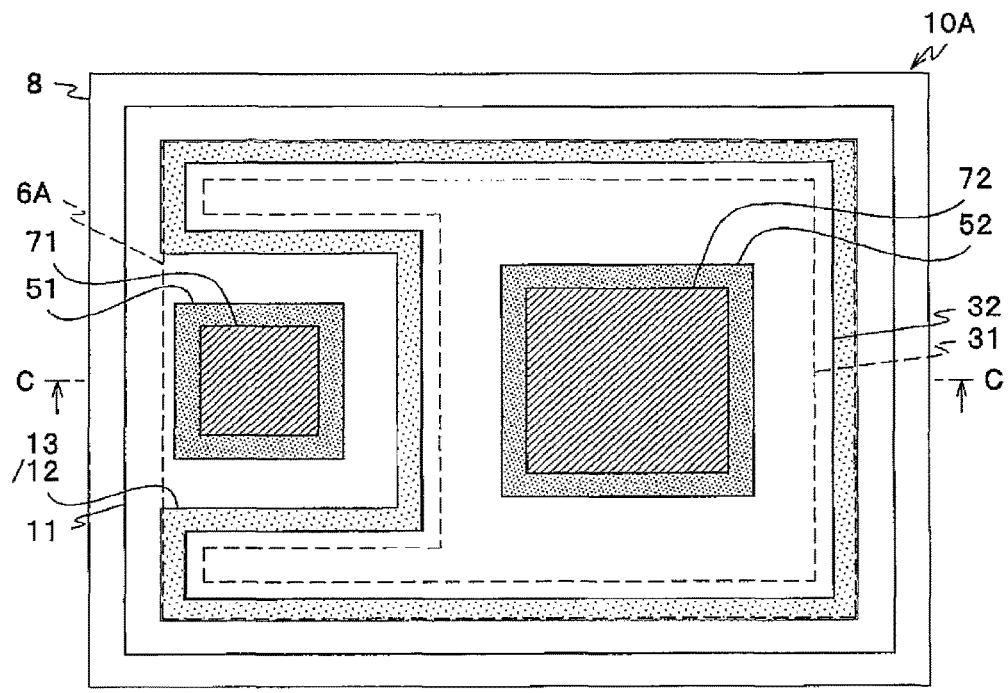
Figure 10B:
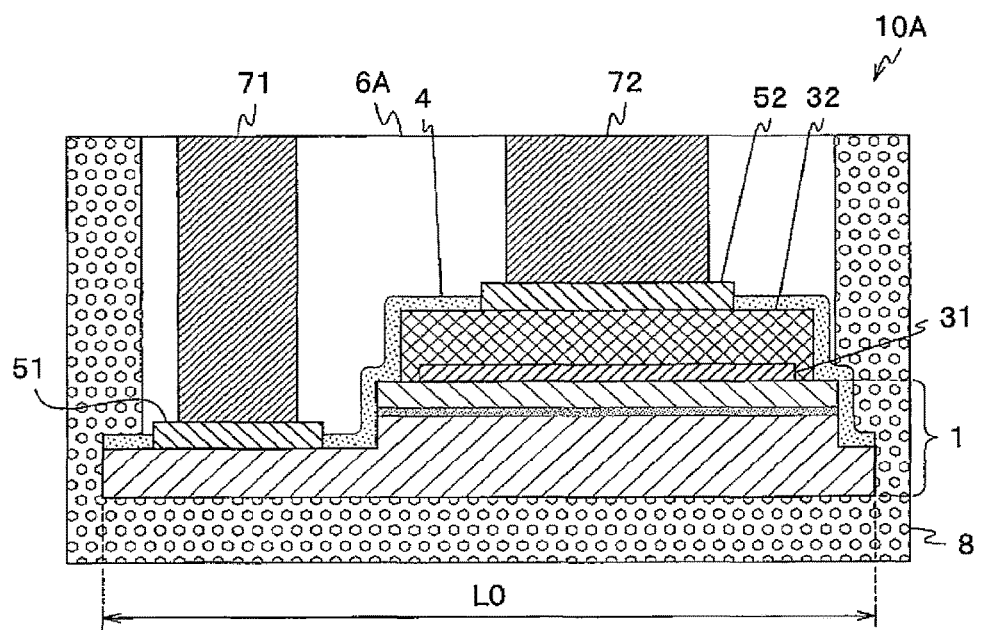

As shown in FIGS. 10A and 10B, in a light emitting element 10A manufactured according to a method of manufacturing a light emitting element according to Variation 1 of Embodiment 1, the substrate 2 is removed and the lower surface (main light emitting surface) and the side surfaces are covered with a wavelength converting member 8 with respect to the light emitting element 10 shown in FIGS. 1A and 1B. Further, the light emitting element 10A does not have the bonding layers 91, 92, so that at the time of bonding on the wiring substrate (not shown), a bonding member such as a solder is used. In the light emitting element 10A, at the peripheral portion in a plan view, the insulating member 6A is disposed inner side with respect to the region where the p-type semiconductor layer 13 and the active layer 12 of the semiconductor structure 1 are not removed (except for n-side contact region). Accordingly, in the light emitting element 10A, light emitted from the semiconductor structure 1 (active layer 12) in lateral directions is not blocked by the insulating member 6A and emitted outside of the semiconductor structure 1, and further, the wavelength of the light is converted by the wavelength converting member 8 which is applied on the side surfaces of the light emitting element 10A and extracted. As in Variation 1, during the manufacturing and in a state before forming the wavelength converting member, a light emitting element provided with a wavelength converting member is referred with a numeral in parentheses, such as a "light emitting element (10A)" The insulating member 6A can be made of the same material as the insulating member 6 disposed in the light emitting element 10, in which a single difference is the shape in a plan view. Next, the wavelength converting member 8 will be described.

(Wavelength Converting Member)

The wavelength converting member 8 is made of a light transmissive resin material to which a fluorescent material is added. The wavelength converting member 8 is formed to cover the lower surface and the side surfaces of the light emitting element 10A in a continuous manner, so that in order to use a liquid material and hardened it to form the wavelength converting member 8, for the resin material to be serve as a binder, a silicone resin, an epoxy resin, a urea resin, etc., can be employed. A known fluorescent material can be employed. Examples thereof include, a YAG (yttrium-aluminum-garnet)-based fluorescent material activated with Ce or the like, a nitride-based fluorescent material or an oxynitride-based fluorescent material that is mainly activated with a lanthanoid element such as Eu or Ce. Of those materials, appropriate materials which can provide a desired color tone with a combination with the emission color of the semiconductor structure 1 are selected. For example, a YAG-based fluorescent material, a silicate-based fluorescent material such as a chlorosilicate fluorescent material to emit green or yellow light, a SCASN-based fluorescent material such as $(Sr,Ca)AlSiN_3$:Eu, or a CASN-based fluorescent material such as $CaAlSiN_3$:Eu to emit red light, or the like can be employed, or a mixture of two or more fluorescent materials can also be employed.

A method of manufacturing a light emitting element according to Variation 1 of Embodiment 1 is conducted in a similar manner as in Example 1 prior to forming an insulating member 6A, that is up to the Forming Bump: S30, and description thereof will be omitted (see FIG. 2, and FIG. 5A to FIG. 6B). Next, manufacturing steps after the Forming Insulating Member: S40 (see FIG. 3, FIG. 4) which are different from Embodiment 1 will be described.

(Forming Insulating Member)

In Variation 1 of Embodiment 1, the Forming Insulating Member: S40 is conducted as that in Example 1, except that the shape of the insulating member 6A in a plan view is different and the successive Forming Bonding Layer: S50 is not conducted (see FIG. 3). In detail, the resist mask PR3 as shown in FIG. 6C is formed wide (width d2, see FIG. 11A) to also cover the end surfaces of the semiconductor structure 1: (S41). Then, in a similar manner as in Embodiment 1, as shown in FIG. 7A, a resin material to form the insulating member 6A (indicated by 6 in the figure) is applied on the wafer and cured: (S42), and the upper surface of the wafer is flattened: (S44). Next, the resist mask PR3 is removed: (S45). Accordingly the wafer 20A (except the bonding layers 91, 92) is obtained, in which, as shown in FIG. 8A, the light emitting elements (10A) are connected with each other, and the insulating member 6A (indicated by 6 in the figure) is disposed with the gaps of the width d2 (indicated by d in the figure), in which the gaps are formed in a grid shape in a plan view along the dividing lines of the light emitting elements (10A).

(Singulating)

Figure 11A:
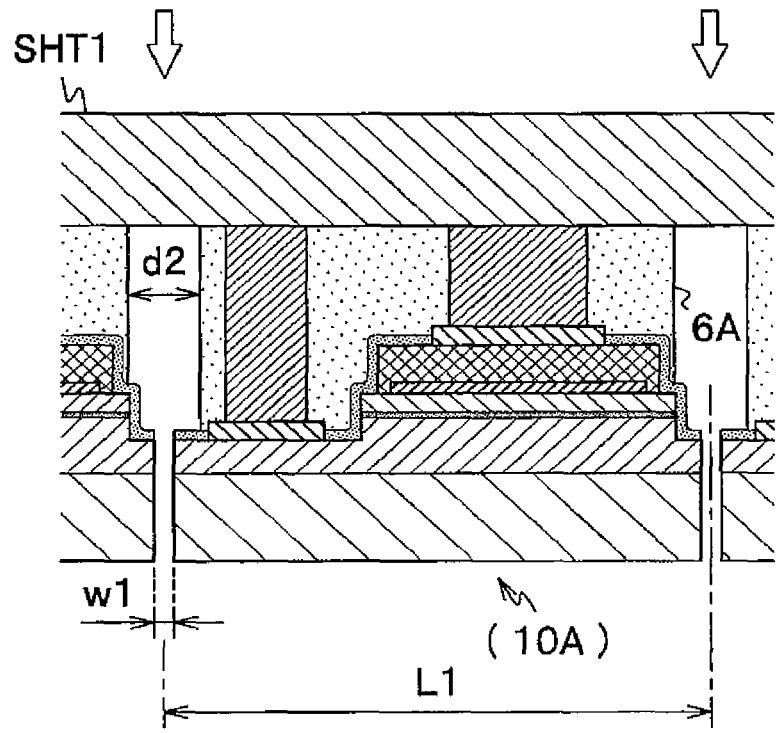
FIGS. 11A and 11B are schematic views illustrating singulating in a method of manufacturing light emitting element according to an embodiment of the present invention, in which FIG. 11A corresponds to a cross-section viewed from the direction of arrows along line C-C of FIG. 10A, and FIG. 11B corresponds to a cross-section viewed from the direction of arrows along line A-A of FIG. 1A.

In a similar manner as in Embodiment 1, stacking the wafer 20A to the adhesive sheet SHT1 (see FIG. 11A): (S61), grinding the substrate 2 to reduce the thickness: (S62), and as shown in FIG. 11A, dividing the wafer 20A along the dividing lines (S63), thus, individual light emitting elements (10A) are obtained. Last, as shown below, the Forming Wavelength Converting Member: S70 in which a wavelength converting member 8 is conducted to complete the individual light emitting elements 10A.

(Forming Wavelength Converting Member)

Figure 12A:
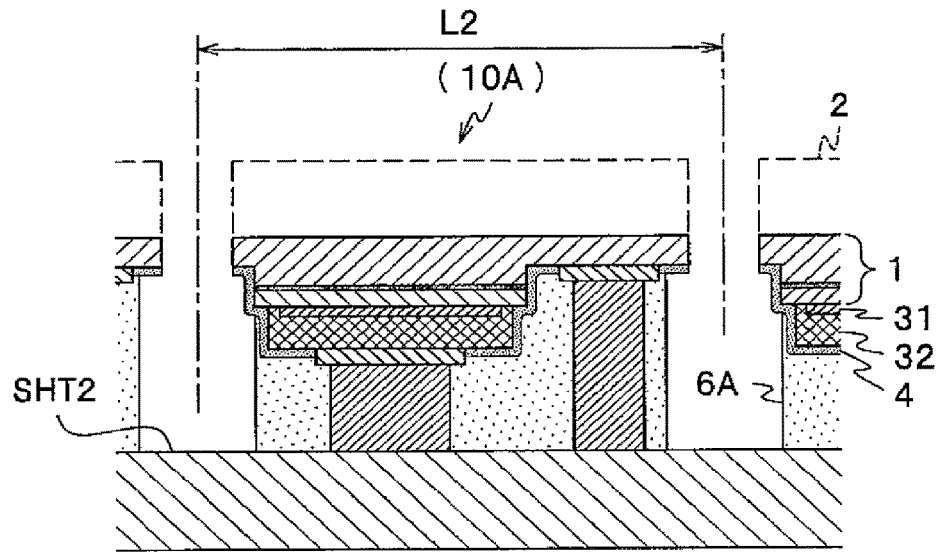
FIGS. 12A to 12C are schematic diagrams illustrating forming wavelength converting member in a method of manufacturing light emitting element according to an embodiment of the present invention, in which FIGS. 12A to 12C each corresponds to a cross-section viewed from the direction of arrows along line C-C of FIG. 10A.

As shown in FIG. 11A, after the Singulating: S60, the light emitting elements (10A) are arrayed in a matrix at an interval of w1, on the adhesive sheet SHT1. With this state, the adhesive sheet SHT1 is placed down side and a resin material to which a fluorescent material is added is applied, thus the side surfaces can also be covered with the wavelength converting member 8. However, this results in disposing the wavelength converting member 8, that is a thick layer of a resin between the light emitting element 10A chips, which makes it difficult to perform cutting with a width of the regions equal to or less than w1. For this reason, before forming the wavelength converting member 8, the light emitting elements (10A) are removed from the adhesive sheet SHT1 and, as shown in FIG. 12A, re-arrayed on the adhesive sheet SHT2 at a pitch L2 (>L1) which provides a wider intervals, then stacked: (S71). In FIGS. 12A to 12A, the light emitting elements 10 (10A) are shown as 180° rotated up and down with respect to the light emitting elements 10 (10A) in the previous manufacturing steps.

Figure 12B:
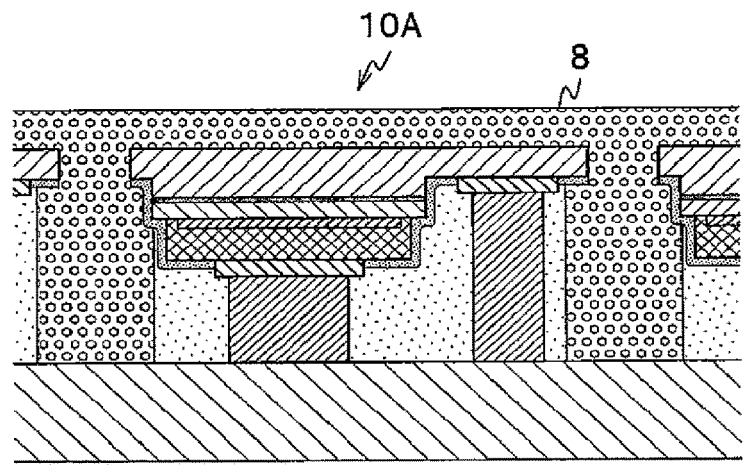
Figure 12C:
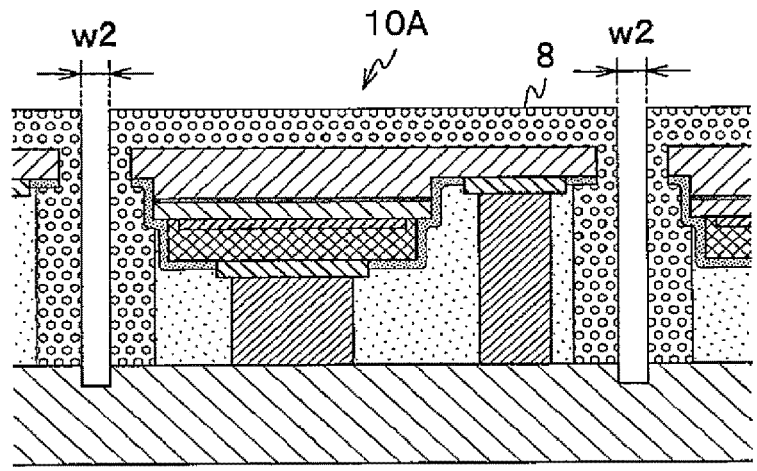

Using laser liftoff (LLO), the substrate 2 is removed from the semiconductor structure 1 (n-type semiconductor layer 11): (S72). Next, as shown in FIG. 12B, a liquid resin material to which a fluorescent material is added is applied to fill the gaps between adjacent light emitting elements (10A), (10A) and cover the upper surface (upside of the semiconductor structure), and then, further flatten the surface (upper surface) and cure the resin: (S73). Next, the wavelength converting member 8 is cut along the center lines (shown by alternate long and short dash lines in FIG.

12A) between the light emitting elements (10A), (10A), to complete the light emitting elements (10A). Further, when needed, the light emitting elements 10A are removed from the adhesive sheet SHT2, and the wavelength converting member 8 at the cut surfaces (side surfaces) and the upper surface (main light extracting surface) of each light emitting element 10A may be polished.

In a method of manufacturing a light emitting element according to Variation 1 of Embodiment 1, in the Forming Wavelength Converting Member: S70, the wavelength converting member 8 is formed after arraying the light emitting element chips with a sufficiently wide intervals. Therefore, even with the use of a thick blade (width of w2) which can cut the wavelength converting member 8 which is a thick resin layer, damage on the semiconductor structure 1 does not occur, while disposing the wavelength converting member 8 on the side surfaces of the light emitting elements 10A with a sufficient thickness. Further, on the wafer 20A, the gaps d2 of the insulating member 6A are provided widely on the streets 10s (see FIG. 8A), which allows easy dividing even to a wafer 20A which has an increased thickness by the insulating member 6A, in the Singulating: S60, as shown by an outline arrow in FIG. 11A, by pressingly bending form the adhesive sheet SHT1 side to cleave.

Figure 11B:
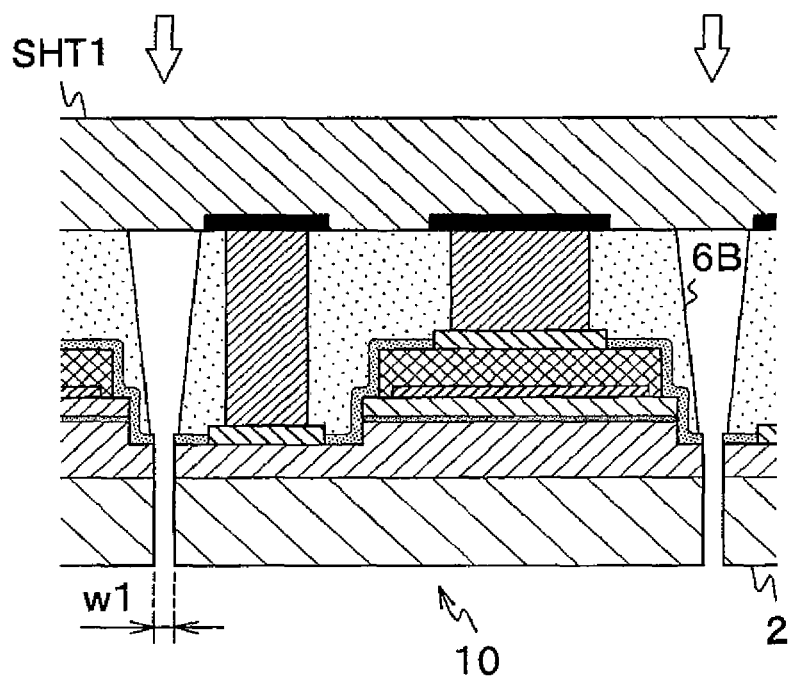

The light emitting element 10A employs a structure in which the insulating member 6A does not cover the end surfaces of the semiconductor structure 1 (active layer 12), so as to widen the gaps d2 to obtain a wafer 20A which allows easy cleaving (S63) in the Singulating: S60. But a structure in which the insulating member 6 covers the end surfaces of the active layer 12 etc., in a similar manner as in the light emitting element 10 (see FIGS. 1A, 1B) which allows efficient downward emission can also be employed. In the case where such a structure is employed, as shown in FIG. 11B, providing the insulating member 6B with the side surfaces formed in an upwardly narrowing tapered-shape (narrowing toward the mounting surface side), a wafer which also allows easy dividing as that described above can be obtained. Such an insulating member 6B can be obtained by, in the Forming Insulating Member: S40, providing the resist mask PR3 (see FIG. 6C) with the side surfaces formed in an upwardly widening reverse-tapered shape (not shown).

In a method of manufacturing a light emitting element according to Variation 1 of Embodiment 1, in the Forming Wavelength Converting Member: S70, the substrate 2 is removed (S72) before forming the wavelength converting member 8, but the remaining substrate 2 may be retained. Also, in a similar manner as in Example 1, conducting the Forming Bonding Layer: S50 (see FIG. 3, FIGS. 7B, 7C), the light emitting elements provided with the bonding layers 91, 92 can be manufactured (not shown).

In the methods of manufacturing a light emitting element according to above-described Embodiment 1 and Variation 1 of Embodiment 1, the n-side, and the p-side bumps which serve as connecting region for electrical connection with outside are formed directly on the n-type semiconductor layer (n-side contact region) and the p-type semiconductor layer respectively, but regardless of the shape in a plan view of the n-side contact region, light emitting elements provided with bumps with a desired arrangement and a desired shape can also be manufactured. Also, for example, large-size light emitting elements provided with each of the n-side, p-side electrodes (pad electrodes, bumps) at two or more locations can also be manufactured. Next, with reference to FIGS. 13A and 13B, a method of manufacturing a light emitting element according to another variation of Embodiment 1 (appropriately referred to as Variation 2) of the present invention and a light emitting element fabricated by the method of manufacturing will be described. In the following, identical members or members of same quality as in Embodiment 1 and Variation 1 of Embodiment 1 are assigned the same reference numerals and description thereof will be appropriately omitted.

First Embodiment: Second Variation

Figure 13A:
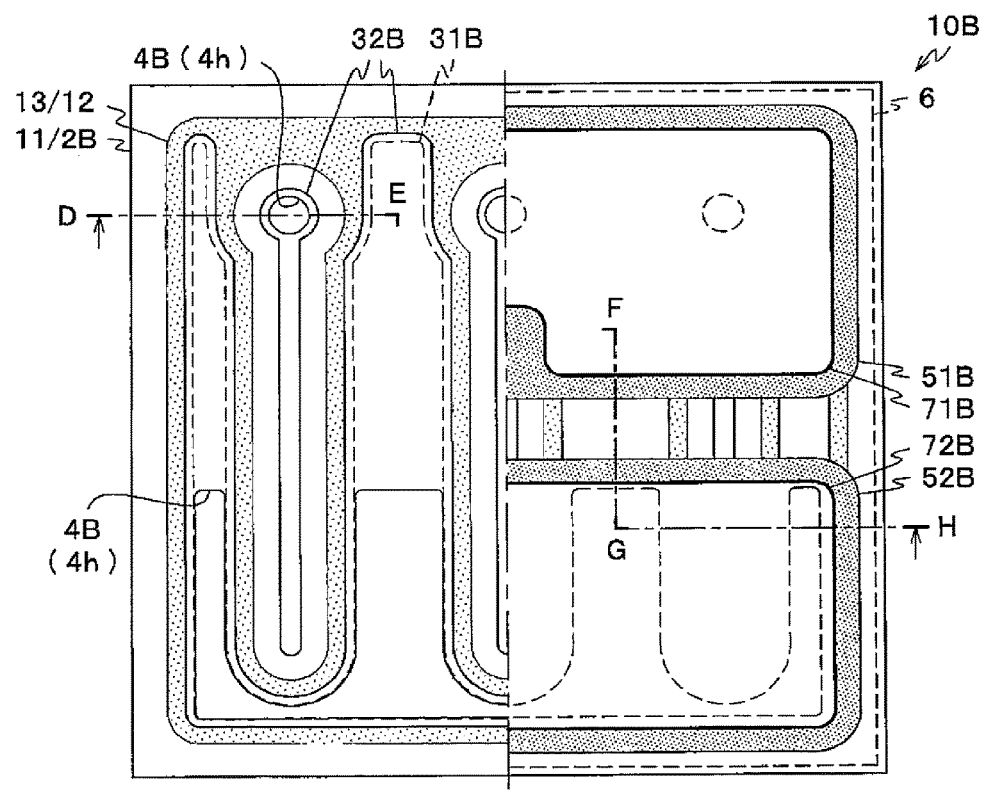
Figure 13B:
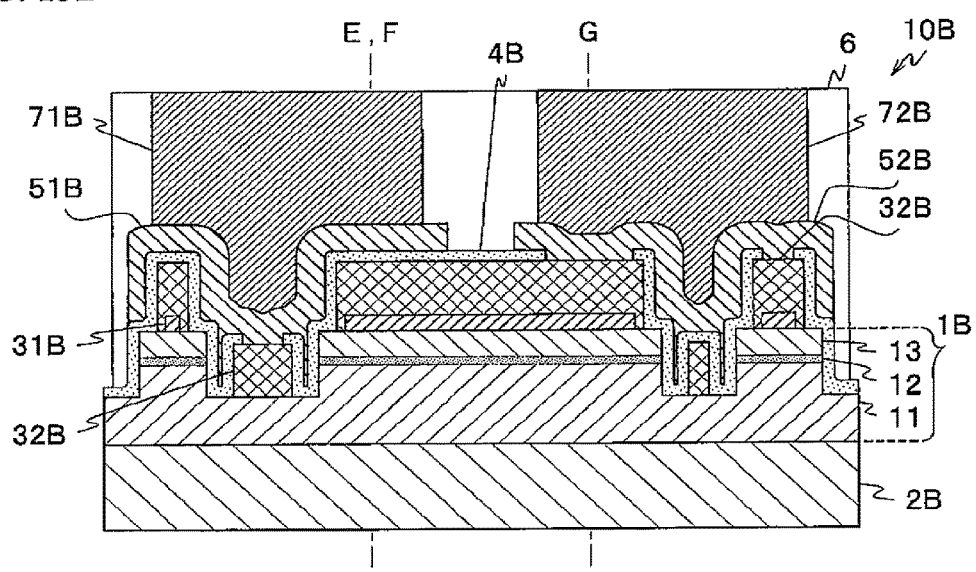

As shown in FIG. 13A, the light emitting element 10B fabricated according to a method of manufacturing a light emitting element according to Variation 2 has an approximately square shape in a plan view and has a symmetrical structure. For this reason, in FIG. 13A, the substrate 2B to the protective layer 4B are shown on the left side of the center line, and the pad electrodes 51B, 52B are shown, with the bumps 71B, 72B and the insulating member 6 shown by their outlines, on the right side of the center line. The light emitting element 10B has a similar structure as the light emitting element 10 (see FIG. 1) of Embodiment 1 except that the light emitting element 10B does not have the bonding layers on the Bumps 71B, 72B respectively, in a similar manner as the light emitting element 10A (see FIG. 10) of Variation 1 described above, and that the components of the light emitting element 10B have different shapes than that of the light emitting element 10.

In the light emitting element 10B, a pair of bumps 71B, 72B are disposed side by side in the longitudinal direction in FIG. 13A, in which, the bumps 71B, 72B are made with approximately similar shapes with each other which are rectangular shapes with longer dimensions extending in the lateral direction and with rounded corners. The n-side bump 71B has a recessed portion in a plan view to distinguish from the p-side bump 72B. In the light emitting element 10B, three n-side contact regions which are arranged laterally in a plane view of FIG. 13A are provided on the semiconductor structure 1B. Further, each of the n-side contact regions is shaped extending in a longitudinal direction with a length approximate to the longitudinal length of the light emitting element 10B, and the n-side electrode is connected onto the approximately entire region of the n-side contact region, thus obtaining uniform supply of electric current to the plane of the n-type semiconductor layer 11.

In this arrangement, if the pad electrode 51B is directly connected to the n-type semiconductor layer 11, the p-side bump 72B is needed to be disposed avoiding directly onto the pad electrode 51B, so that an integral laterally elongated bump as shown in FIG. 13A can not be formed. For this reason, in the light emitting element 10B, the cover electrode 32B is disposed not only on the p-side semiconductor layer 13 (on the full-surface electrode 31B) but also on the n-type semiconductor layer 11, and further, the protective layer 4B is disposed to cover the cover electrode 32B. In the light emitting element 10B, the protective layer 4B is disposed to cover the entire upper surface except for the openings defined at locations where, in a plan view, the n-side cover electrode 32B and the bump 71B, and the p-side cover electrode 32B and the bump 72B, respectively, to be overlapped. Then, in the light emitting element 10B, the pad electrodes 51B, 52B are formed on the protective layer 4B with a size in a plan view slightly greater than the bumps 71B, 72B which are to be formed. With this arrangement, the pad electrodes 51B, 52B are connected to the cover electrodes 32B respectively, only at the openings 4h of the protective layer 4B, so that the pad electrodes 51B, 52B are electrically connected to the n-type semiconductor layer 11 and the p-type semiconductor layer respectively, without causing a short circuit. Also, in a similar manner as in the light emitting element 10 (see FIGS. 1A, 1B), the pad electrodes 51B, 52B are respectively formed with a size, in a plan view, greater than the portions for bumps 71B, 72B, so that using the pad electrodes 51B, 52B as seed electrodes, the bumps 71B, 71B can be easily formed by way of electrolytic plating.

As described above, in the light emitting element 10B, the pad electrodes 51B, 52B are formed respectively partially overlapped on the protective layer 4B. Thus, in Variation 2 of Embodiment 1, the steps up to the Forming Semiconductor: S10 and on and after the Forming Bump: S30 are conducted in a similar manner as in Embodiment 1, and from forming a protective layer 4B to forming pad electrodes 51B, 52B, that is the Forming Electrode: S20 is only different from that in Example 1 (see FIGS. 2 to 4). Next, manufacturing steps which are different from that in Embodiment 1 will be described below.

(Forming Electrode: Forming Full-Surface Electrode and Cover Electrode)

Forming a full-surface electrode 31B on the p-type semiconductor layer 13 of the semiconductor structure 1B (S21). Further, forming the cover electrode 32B to cover the full-surface electrode 31B on the p-type semiconductor layer 13, and at this time, forming the cover electrode 32B also on the n-type semiconductor layer 11 (n-side contact region) (S22).

(Forming Electrode: Forming Protective Layer and Pad Electrode)

Forming the insulating layer which serves as a protective layer 4B on the entire upper-side surface of the wafer (the entire upper-side surfaces of the semiconductor structure 1B and the cover electrode 32B: (S23). Next, forming the resist mask PR1 on the wafer (insulating layer) except for the regions to form the opening 4h of the protective layer 4B: (S24), removing the insulating layer by way of etching and forming the protective layer 4B: (S25), then, removing the resist mask PR1: (S26). Next, forming a resist mask (not shown) on the protective layer 4B except for the regions to form the pad electrodes 51B, 52B: (S27), and forming a metal layer which serve as the pad electrodes 51B, 52B over the resist mask: (S28). As described above, forming the protective layer 4B and the pad electrodes 51B, 52B by using different resist masks allows formation of the pad electrodes 51B, 52B which are greater than the opening 4h in a plan view.

(Forming Bump, Forming Insulating Member, Singulating)

Performing the Forming Bump: S30 (see FIG. 2), and the Forming Insulating Member: S40 (see FIG. 3) in a similar manner as in First Variation 1 of Embodiment 1, the wafer (not shown) is obtained in which, in a plan view, the insulating member 6 is disposed on the light emitting elements 10b which are connected in the plane direction, in a grid shape with the gaps. Last, conducting Singulating: (S60), the light emitting elements 10B (chips) are completed.

According to a method of manufacturing a light emitting element according to Variation 2 of Embodiment 1, the shapes and arrangement of the pair of bumps can be designed respectively regardless of the planar shape of the n-side contact region, which is particularly suitable for manufacturing of a large-size light emitting element in which the n-side contact regions are formed in a dispersed manner in a wide area.

The light emitting element 10B may be formed with a structure in which the insulating member 6 does not cover the end surfaces of the semiconductor structure 1B (active layer 12) which allows sideward emission. The light emitting element 10B may also be formed with a structure in which the side surfaces of the insulating member 6 are formed in a taper shape as shown in the insulating member 613 shown in FIG. 11B. Employing a structure of those as described above, a wafer which can be cleaved easily in the Singulating: S60 can be obtained.

Second Embodiment

In a method of manufacturing a light emitting element according to Embodiment 1 and the variations of Embodiment 1, forming bumps on the wafer then grinding the bumps with the insulating member which cover the surroundings of the bumps, to facilitate electric connection to outside (wiring substrate) at the flat upper surfaces, but a structure in which the bumps are not formed and electrical connection to outside is facilitated with the flat upper surfaces (bumpless structure) can also be employed. Next, referring to FIG. 14 to FIG. 17E, and FIG. 2, a method of manufacturing a light emitting element according to Embodiment 2 of the present invention and a light emitting element obtained by the method will be described below. In the following, identical members or members of same quality as in Embodiment and the variations of Embodiment 1 are assigned the same reference numerals and description thereof will be appropriately omitted.

Figure 14:
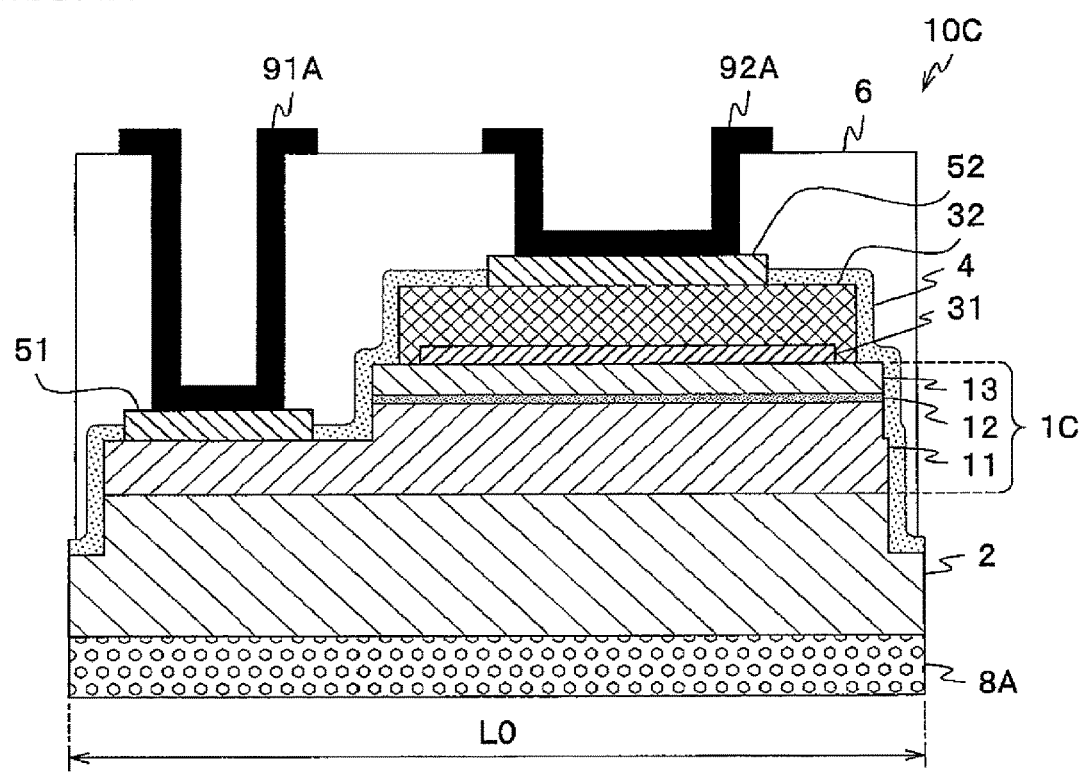
FIG. 14 is a schematic diagram illustrating a structure of a light emitting element manufactured by using a method of manufacturing light emitting element according to Embodiment 2 of the present invention, and corresponds to a cross-section viewed from the direction of arrows along line A-A of FIG. 1A.
Figure 15:
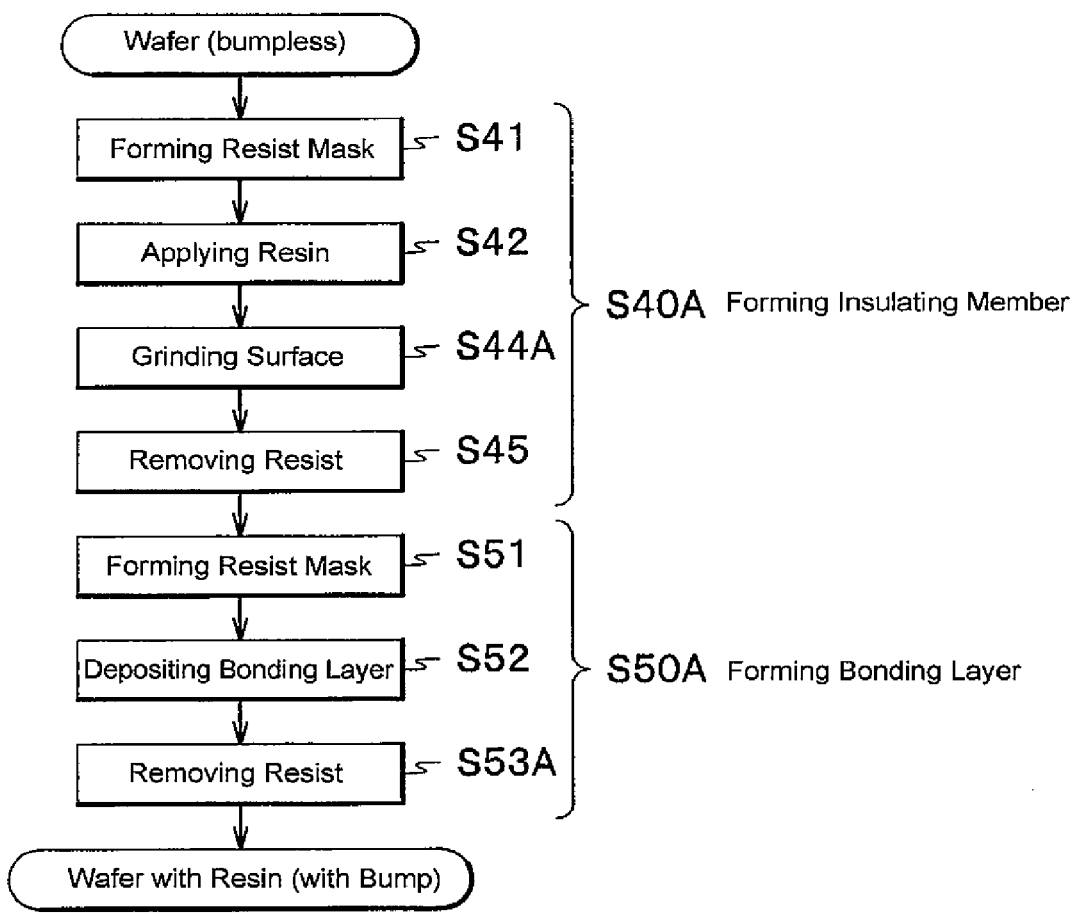
FIG. 15 is a flowchart illustrating forming insulating member and forming bonding layer in a method of manufacturing light emitting element according to Embodiment 2 of the present invention.

As shown in FIG. 14, in the light emitting element 10C fabricated according to a method of manufacturing a light emitting element according to Embodiment 2, the bumps 71, 72 in the light emitting element 10 shown in FIG. 1 are omitted, and the bonding layers 91A, 92A are directly connected to the pad electrodes 51, 52, respectively. Accordingly, in the light emitting element 10C, holes are defined in the insulating member 6 in the upper surface and the bonding layers 91A, 92A are formed along the inner surfaces defining the holes respectively. The holes in the insulating member 6 are arranged to be at the same locations and shapes as the bumps 71, 72 in the light emitting element 10 of Embodiment 1, that is, the insulating layer 6 has the same shape as in the light emitting element 10. Also, the lower surface (the back-side surface of the substrate 2) of the light emitting element 10C is covered with a wavelength converting member 8A. Further in the light emitting element 10C, in the peripheral portion in a plan view, the semiconductor structure 1C is totally removed to the n-type semiconductor layer 11 and further, a part of upper portion of the substrate 2 is removed, then, covered with the protective layer 4 and the insulating layer 6. Thus, in the light emitting element 10C, a large portion of light emitted from the semiconductor structure 1C (active layer 12) in lateral directions can be reflected at the insulating member 6, allowing particularly efficient downward emission, and further, wave-length conversion by the wavelength converting member 8A of the emission can be obtained. The wavelength converting member 8A can be formed with the same material as the wavelength converting member 8 provided in the light emitting element 10A, except only for the shape.

Figure 17A:
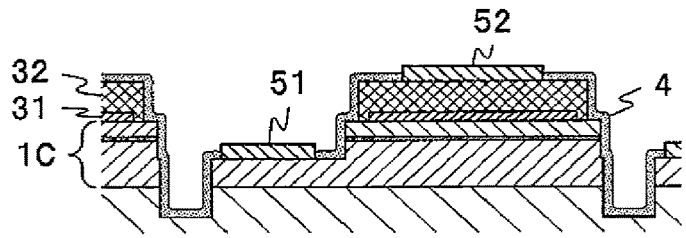
FIGS. 17A to 17E are schematic diagrams illustrating a method of manufacturing light emitting element according to Embodiment 2 of the present invention, in which FIG. 17A to 17E each corresponds to a cross-section viewed from the direction of arrows along line A-A of FIG. 1A.

According to a method of manufacturing a light emitting element according to Embodiment 2, in the Forming Semiconductor: S10, the n-type semiconductor layer 11 is exposed on the n-side contact region and the streets 10s (see FIG. 8A) by way of etching: (S12), then, further conducting etching only on the streets 10a to totally remove the n-type semiconductor layer 11, and further remove an upper portion of the upper surface of the substrate 2 which is under the streets (not shown). Then, the Forming Electrode: S20 (see FIG. 2) is conducted in a similar manner as in Embodiment 1, to form the full-surface electrode 31, the cover electrode 32, and the pad electrodes 51, 52 (see S10 to S20 in FIG. 2, and FIGS. 5A to 5C). In Embodiment 2, the Forming Bump: S30 is not conducted, so that next to the Forming Metal Layer (S28, see FIG. 5C) to form the pad electrodes 51, 52, subsequently, the Removing Resist (S29) is conducted to remove the resist mask PR1 and the metal layer on the resist mask PR1 (lift-off). Accordingly, a wafer 1C in which the semiconductor structures 1C are formed and the pad electrodes 51, 52 are provided on each semiconductor structure 1C as shown in FIG. 17A can be manufactured. To the wafer, the Forming Insulating Member: S40A to form the insulating member 6, the Forming Bonding Layers: S50A to form the bonding layer 91A, 92A are conducted. Next, manufacturing steps which are different from that in Embodiment 1 will be described below.

(Forming Steps of Insulating Member)

Figure 17B:
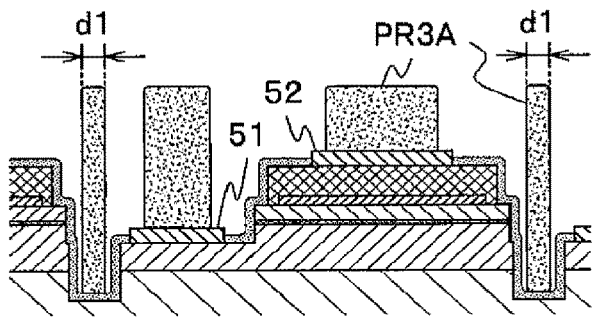
Figure 17C:
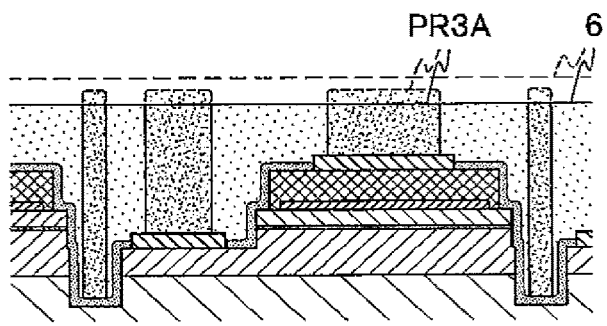
Figure 17D:
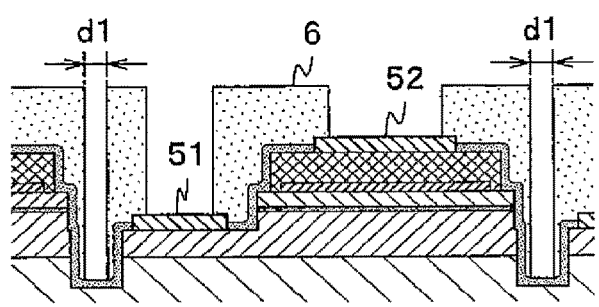

In Embodiment 2, forming an insulating member: S40A is conducted with a similar step to the forming of the insulating member: S40 in Embodiment 1, but the bumps 71, 72 to be exposed from the upper surface are not provided, so that an opening portion is formed respectively on the pad electrodes 51, 52 by using a resist mask. In detail, as shown in FIG. 17B, a resist mask PR3A is formed to mask not only the dividing lines (streets 10s) but also the pad electrodes 51, 52: (S41). The resist mask PR3A is formed in a similar manner as in the resist mask PR3 (see FIG. 6C) of Embodiment 1 to a thickness to form the upper surface of the resist mask PR3A to be higher than the upper surface of the light emitting element 10C at completion. Next, a liquid resin material of the insulating member 6 is applied on the wafer with a height as shown by a dotted line in FIG. 17C, greater than the height of the upper surfaces of the light emitting elements 10C at completion, then the liquid resin material is cured: (S42). Then, as shown in the solid line in FIG. 17C, the cured resin material (insulating member 6) is ground from the top to expose the resist mask PR3A on the upper surface of the wafer (exposing) at all portions over the streets 10s and the pad electrodes 51, 52, and the upper surface is flattened: (S44A). Accordingly, the insulating member 6 is disposed on the wafer except for the respective regions provided with the resist mask PR3A, that is, the regions on the pad electrodes 51, 52 which are the connecting regions for electrically connecting to a pair of outside electrodes, and regions including the streets (dividing region) 10s. Next, as shown in FIG. 17D, completely removing the resist mask PR3A, forming the insulating member 6: (S45).

(Forming Bonding Layer)

Figure 17E:
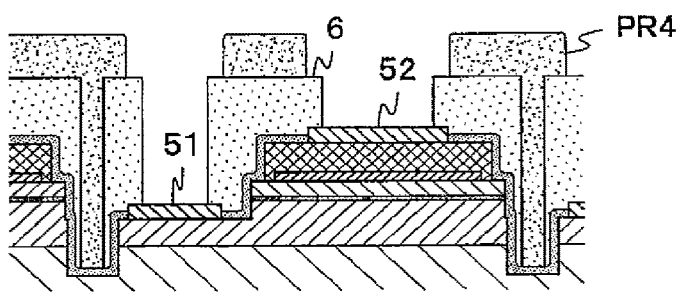

As shown in FIG. 17E, the resist mask PR4 is formed except for the regions on the pad electrodes 51, 52 where the bonding layers 91A, 92A in the openings of the insulating member 6: (S51). Next, on the resist mask PR4, the metal layer serves to the bonding layers 91A, 92A is formed: (S52). Thus, the bonding layers 91A, 92A are formed (not shown) connecting to the pad electrodes 51, 52 in the regions where the resist mask PR4 is not formed. Last, the resist mask PR4 is removed (S53A). With this, as shown in FIG. 8A, the wafer 20C (except for the bumps 71, 72) is obtained, in which, the light emitting elements (10C) are connected with each other, and the insulating member 6 is disposed with the gaps of the width d1 which are formed in a grid shape in a plan view along the dividing lines, and with the openings on the pad electrodes 51, 52. Further, the bonding layers 91A, 92A (only the outlines are shown in dotted lines) which are connected to the pad electrodes 51, 52 are formed.

(Forming Wavelength Converting Member, Singulating)

Figure 16:
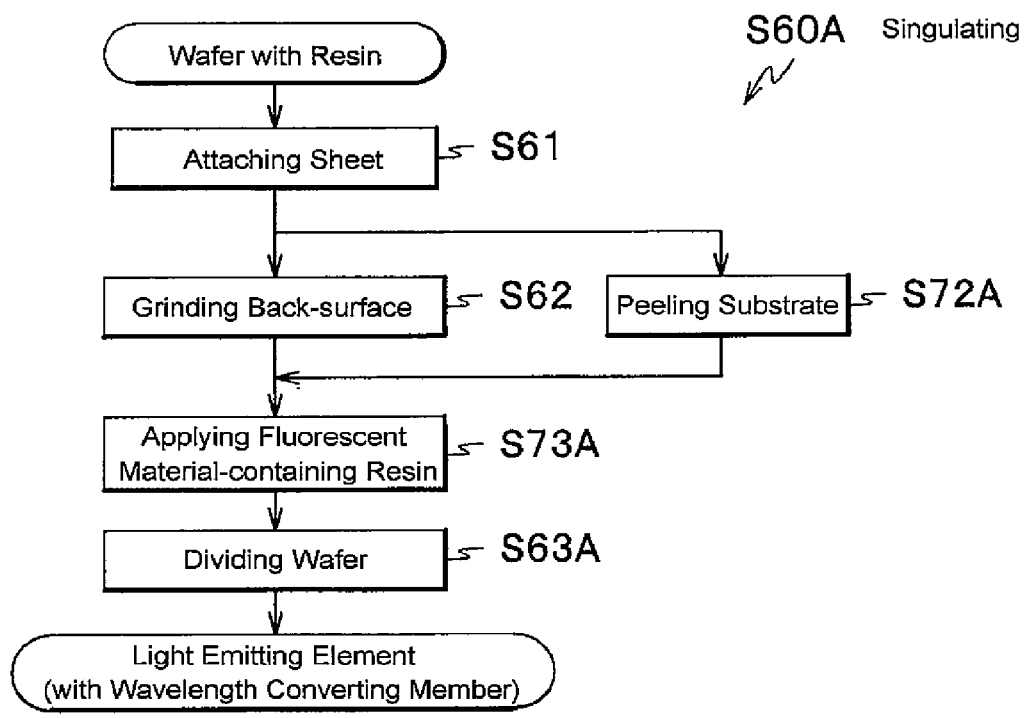
FIG. 16 is a flowchart illustrating singulating in a method of manufacturing light emitting element according to Embodiment 2 of the present invention.

The light emitting element 10C has the wavelength converting member 8A only on the back surface, so that as shown in FIG. 16, the wavelength converting member 8A is formed before dividing the wafer. First, as in a similar manner in Embodiment 1, the side of the wafer 20C having the insulating member 6 is adhered to a adhesive sheet SHT1 (S61), and the substrate 2 is ground (back-surface grinding) to reduce the thickness to allow dividing of the wafer in a state where the wavelength converting member 8A stacked thereon (S62). Next, on the back surface (surface of the substrate 2) of the wafer, in a similar manner as in Variation 1 of Embodiment 1, a liquid resin material to which a fluorescent material is added is applied, and leveled, and cured: (S73A). Last, dividing the wafer 20C (the wavelength converting member 8A, the substrate 2, and the protective layer 4) along the center lines (dividing lines) between the light emitting elements 10C, 10C, thus, the light emitting elements C are completed.

In a method of manufacturing a light emitting element according to Embodiment 2, the wafer 20C having an increased thickness by being covered with the wavelength converting member 8A is cut: (S63A). Therefore, in the case where the cutting of the wafer with a thin blade having a width (thickness) of d1 or smaller is difficult, the wavelength converting member SA is completely cut or further, together with the wavelength converting member, a part of the substrate 2 is cut (half-cut) with using a thicker blade, then, using a thin blade, the wafer 20C is completely cut. In the wafer 20, the wavelength converting member 8A on the dividing lines can is removed by half-cut, so that the wafer 20C can be divided also by using laser, or by breaking. As described above, the wavelength converting member 8A is not formed on the surface of the side where the semiconductor structure 1C is formed, so that the wafer 20C can be divided without affecting the semiconductor structure 1C.

According to the method of manufacturing a light emitting element according to Embodiment 2, the upper surface can be flattened by the insulating member even if the bumps are not provided, and the light emitting elements which can be electrically connected to outside (wiring substrate) with the upper surface can be manufactured. Also, resin members such as the insulating member 6 and the wavelength converting member 8A are not provided on the semiconductor structure 1C side where the regions (streets 10s) with a width w1 which to be lost by cutting or cleaving is formed, so that dividing method with a narrow street width w1 such as dicing with a thin blade or laser scribing can be employed without causing detachment of the insulating member 6.

In the light emitting element C, in forming semiconductor S10, at the time of removing the n-type semiconductor layer 11 (second etching) in the streets, an upwardly widening groove shape may be formed. Also, in a similar manner as in the light emitting element 10 of Embodiment 1, the second etching can be omitted.

In the light emitting element 10C, the wavelength converting member 8A is stacked on the substrate 2, but as in Variation 1 of Embodiment 1 (sec FIGS. 10A, 10B), the substrate 2 may be completely removed and the wavelength converting member 8A can be stacked on the n-type semiconductor layer 11 (not shown). That is, as shown in FIG. 16, instead of the back-surface grinding (S62), the substrate 2 is removed from the semiconductor structure 1C (1) by way of LLO etc.: (S72A). In this case, in the case where the n-type semiconductor layer 11 at the streets 10s is completely removed in the second etching in forming semiconductor S10, the wafer is divided at the same time of removing the substrate 2, which allows the resin material getting into the mounting surface in subsequent Applying Fluorescent Material-containing Resin: (S73A) in which the resin containing fluorescent material 8A is applied to form the wavelength converting member 8A (see FIG. 12B). Therefore, it is preferable that the second etching is not performed, and a semiconductor structure 1 has the n-type semiconductor layer 11 remaining at least on the streets 10s (preferably on all surfaces of the wafer) (see the wafer 20 of FIG. 9A).

In the light emitting element 10C, as in Variation 1 of Embodiment 1, the insulating member 6A having a wide gap width d2 in the wafer can be formed (see FIG. 11A). In the light emitting element 10C, as in the insulating member 6B shown in FIG. 11B, an insulating member can be formed with the side surfaces of a tapered shape. In the case where such an insulating member to be formed, the opening portions on the pad electrodes 51, 52 are formed at the same time by using the resist mask PR3A, thus the opening portions of the insulating member can be formed in a shape where the opening portions of the insulate g member are broadening upward (not shown).

The light emitting elements 10A in which the bumps are not provided, the wavelength converting member 8 can be provided on the side surfaces as in Variation 1 (see FIGS. 10A, 10B), a structure in which the wavelength converting member 8 are not provided as shown in Variant Embodiment 1 (see FIGS. 1A, 1B), or a structure in which the n-side contact region is formed in a wire area as in Variation 2 (see FIGS. 13A, 13B) of Embodiment 1. Also, the wavelength converting member 8A (not shown) may be provided on the back surface of the light emitting element 10 (wafer 20) provided with the bumps according to Embodiment 1.

Third Embodiment

Figure 18:
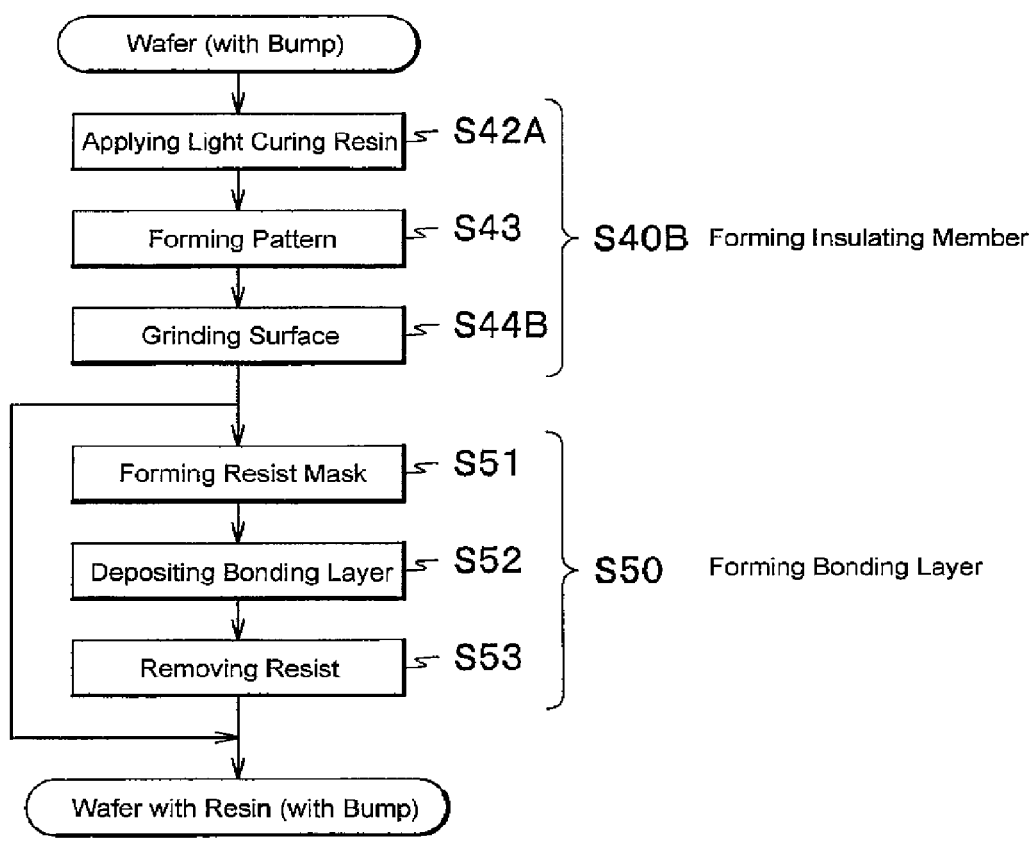
FIG. 18 is a flowchart illustrating forming insulating member and forming bonding layer in a method of manufacturing light emitting element according to Embodiment 3 of the present invention.

In a method of manufacturing a light emitting element according to Embodiment 1, and Embodiment 2, a pattern of the insulating member is formed by using a combination of lift-off method and surface-grinding (exposing), but forming the insulating member by a photosensitive material as used in the resist mask, without using the resist mask, the insulating member can be formed in a similar shape as in Embodiment 1 and Embodiment 2. Next, referring to FIG. 18 to FIG. 20, a method of manufacturing a light emitting element according to Embodiment 3 of the present invention will be described below. In the following, identical members or members of same quality as in Embodiment 1 or in Embodiment 2 are assigned the same reference numerals and description thereof will be appropriately omitted.

In a method of manufacturing a light emitting element according to Embodiment 3, forming an insulating member is only different from that in Embodiment 1, Embodiment 2. Here, the insulating member 6 has, as described above, at the completion of the light emitting element, the same shape as in Embodiment 1, Embodiment 2, so that the same names and reference numerals are used in the description, but in Embodiment 3, the materials below are used.

(Insulating Member)

It is preferable that the insulating member 6 is made of an insulating material as in Embodiment 1, Embodiment 2, which has a low light transmissivity and a high reflectance. The insulating member 6 can be formed by curing a liquid material, and a material having a certain degree of mechanical strength (hardness) after cured, and has a chemical resistance at the time of forming (development) and removing a resist mask in the subsequent formation of the bonding layer 91, 92 (forming bonding layer: S50A) is employed. Further in Embodiment 3, a desired pattern is formed by not using a lift-off method, but by using a light curing resin. Specific examples thereof include a photosensitive silicone resin and an epoxy resin.

A method of manufacturing a light emitting element 10A shown in FIGS. 1A, 1B and a light emitting element shown in FIGS. 10A, 10B according to a method of manufacturing a light emitting element according to Embodiment 3 will be described. The method of manufacturing a light emitting element according to Embodiment 3 is similar to Embodiment 1 except for forming an insulating member: S40, so that description will be appropriately omitted (see FIG. 2 and FIG. 3 to FIG. 6B). Next, referring to FIG. 18 and FIGS. 19A, 19B, forming an insulating member: S40B according to a method of manufacturing a light emitting element according to Embodiment 3 will be described below.

(Forming Steps of Insulating Member)

Figure 19A:
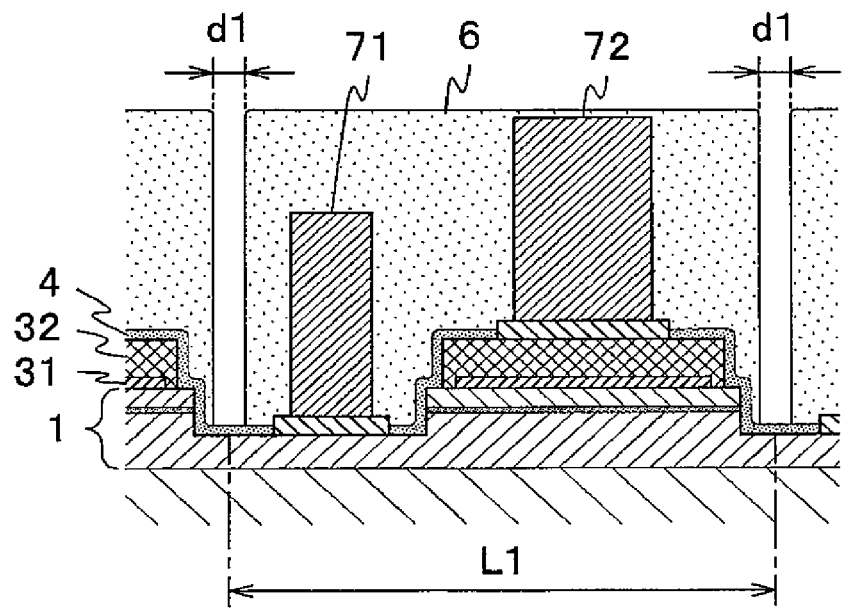
FIGS. 19A and 19B are schematic diagrams illustrating a method of manufacturing light emitting element according to Embodiment 3 of the present invention, in which FIGS. 19A and 19B each corresponds to a cross-section viewed from the direction of arrows along line A-A of FIG. 1A.
Figure 19B:
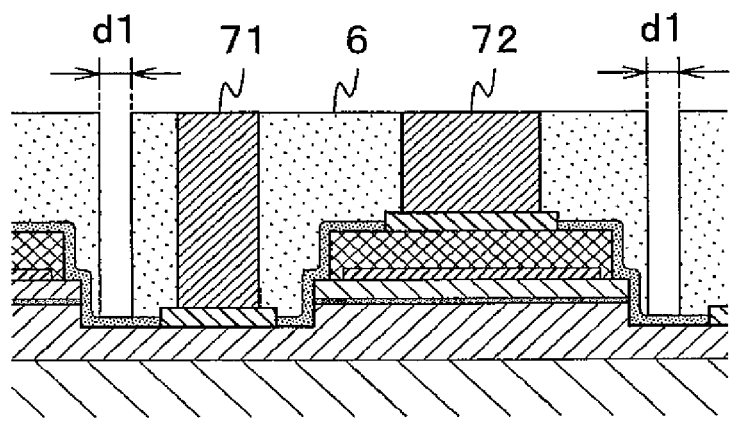
Figure 20:
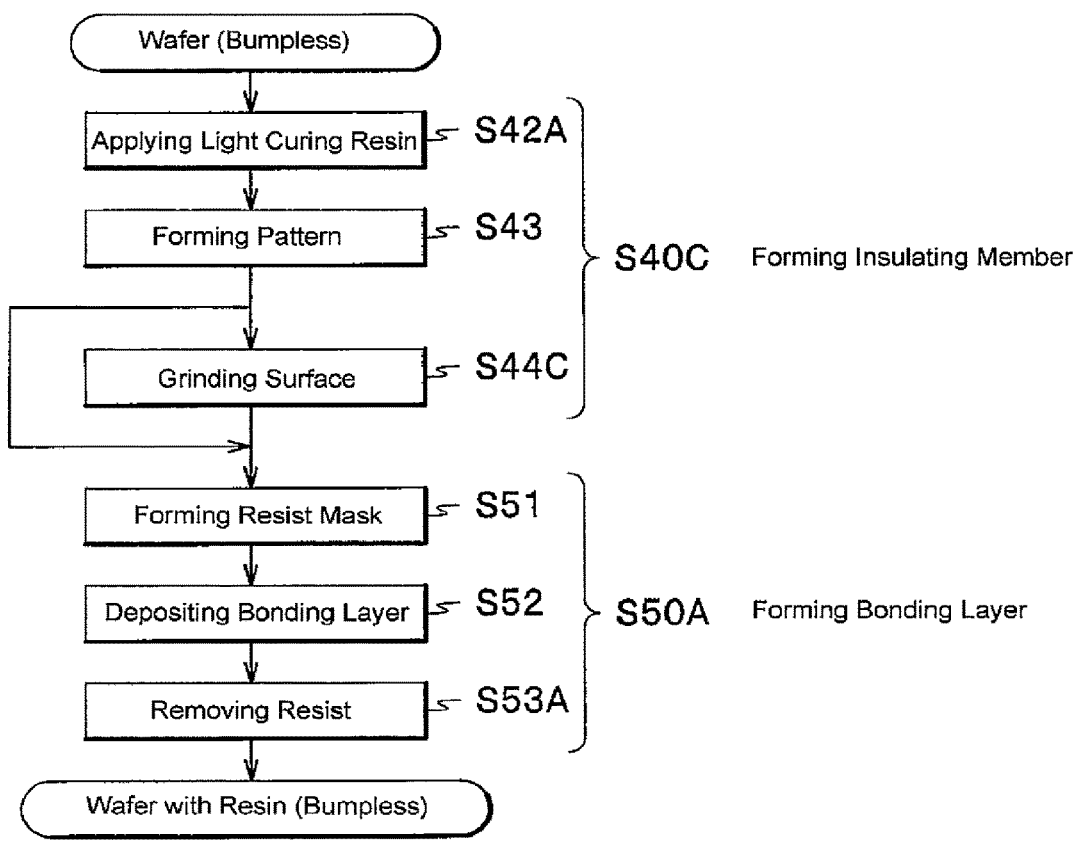
FIG. 20 is a flowchart illustrating forming insulating member and forming bonding layer in a method of manufacturing light emitting element according to a variation of Embodiment 3 of the present invention.

On the entire surface of the upper surface of a wafer, a resin material constituting the insulating member 6 is applied with a height which is higher than the upper surface of the light emitting element 10 at completion, preferably higher than the upper surface of the p-side bump 72: (S42A). Next, by exposure using a reticle mask (not shown), the resin material is processed in a pattern, as shown in FIG. 19A, in a plan view, with gaps with a width d1 formed in a grid along the dividing lines, and then cured: (S43). Then, the cured resin material (insulating member 6) is ground from the top to expose the bumps 71, 72 at the upper surface of the wafer (exposing) as shown in FIG. 19B, and the upper surface is flattened: (S44B), thus the insulating member 6 is formed.

With conducting forming bonding layers: S50 next to the forming an insulating layer: S40B, in a similar manner as a method of manufacturing a light emitting element according to Embodiment 1, as shown in FIG. 8, a wafer 20 in which the light emitting elements 10 are connected with each other, and the insulating member 6 is disposed with the gaps of the width d1, in which the gaps are formed in a grid shape in a plan view along the dividing lines of the light emitting elements, and further, the bonding layers 91, 92 are formed on the bumps 71, 72. Last, conducting singulating: S60 (see FIG. 4 and FIGS. 9A, 9B), the light emitting elements 10 are completed. In the case where the light emitting elements 10A which do not have the bonding layers 91, 92 to manufacture, after forming an insulating member: S40B, without performing the forming bonding layers: S50, singulating: S60, further forming a wavelength converting member: S70 may be conducted (see FIG. 4, FIG. 11A, and FIGS. 12A, 12B).

Third Embodiment: Variation

In a method of manufacturing a light emitting element according to Embodiment 3, light emitting elements 10C which do not have the bumps as shown in FIG. 14 can also be fabricated. Next, referring to FIG. 20 and appropriately to FIGS. 17A to 17E, forming an insulating member: S40C according to a method of manufacturing a light emitting element according to Variation of Embodiment 3 will be described below.

(Forming Steps of Insulating Member)

On the entire upper surface of the wafer shown in FIG. 17A in which removing resist: (S29) in Forming electrode: S20 is completed, a resin material to constitute the insulating member 6 is applied with a height which is higher than the upper surface of the light emitting element 10C at completion: (S42A). Next, by exposure using a reticle mask (not shown), in a plan view, a pattern having a grid-shape gaps with a width of d1 along the dividing lines and having opening portions on the pad electrodes 51, 52 is processed and then cured: (S43). Then, the cured resin material (insulating member 6) is ground from the top to flatten the upper surface: (S44C), thus the insulating member 6 as shown in FIG. 17D is formed.

Next to forming an insulating member: S40B, conducting forming bonding layers: S50A as shown in FIG. 17E. Thus, in a similar manner as in a method of manufacturing a light emitting element according to Embodiment 2, as shown in FIG. 8A, the wafer 20C (except for the bumps 71, 72) is obtained, in which, as shown in FIG. 8A, the light emitting elements (10C) are connected with each other, and the insulating member 6 is disposed with the gaps of the width d1 which are formed in a grid shape in a plan view along the dividing lines, and with the openings on the pad electrodes 51, 52. Further, the bonding layers 91A, 92A which are connected to the pad electrodes 51, 52 are formed. Last, conducting Singulating: S60A (see FIG. 16), the light emitting elements 10C are completed.

The forming an insulating member: S40C in the Variation of Embodiment 3 may also be conducted such that, in the Applying Resin Material: (S42A), the thickness of the resin material is designed with consideration of cure shrinkage, to be the height of the upper surface of the light emitting element 10C at completion, further, the upper surface is formed with a required flatness, thus, the insulating member 6 is formed in the subsequent manufacturing step of Forming Pattern: (S43), thus, the Grinding Insulating Member 6: (S44C) can be avoided. Also, in Embodiment 3 and Variation of Embodiment 3, with adjusting the exposure conditions etc., in the Forming Pattern: (S43), the insulating member 6B having a taper-shaped side surfaces as shown in FIG. 11B can be formed.

In a method of manufacturing a light emitting element according to Embodiment 3 and Variation of Embodiment 3, the use of a photosensitive resin material for the insulating member 6 can eliminate the resist mask in one manufacturing step. The shape of the insulating member 6 formed by the Forming Pattern: (S43) in the Forming Insulating Member: S40B, S40C is an inverted shape of a pattern of the resist mask PR3, PR3A (see FIG. 6C, FIG. 17B) in the method of manufacturing a light emitting element according to Embodiments 1, 2.

According to the method of manufacturing a light emitting element according to Embodiment 3 and Variation of Embodiment 3, the insulating member 6 is formed in a shape similar to that obtained according to Embodiments 1, 2. Further, the insulating member 6 is not disposed in the regions (streets 10s) which will be lost by cutting or cleaving in the Singulating: S60, S60A, so that a dividing method with narrow street width w1 such as dicing with a thin blade or laser scribing can be employed.

Fourth Embodiment

Next, a method of manufacturing a light emitting element according to Embodiment 4 of the present invention and a light emitting element fabricated by the method of manufacturing will be described. In the following, identical members or members of same quality as in other Embodiments and the variations the Embodiments are assigned the same reference numerals and description thereof will be appropriately omitted.

Structure of Light Emitting Element

Figure 21A:
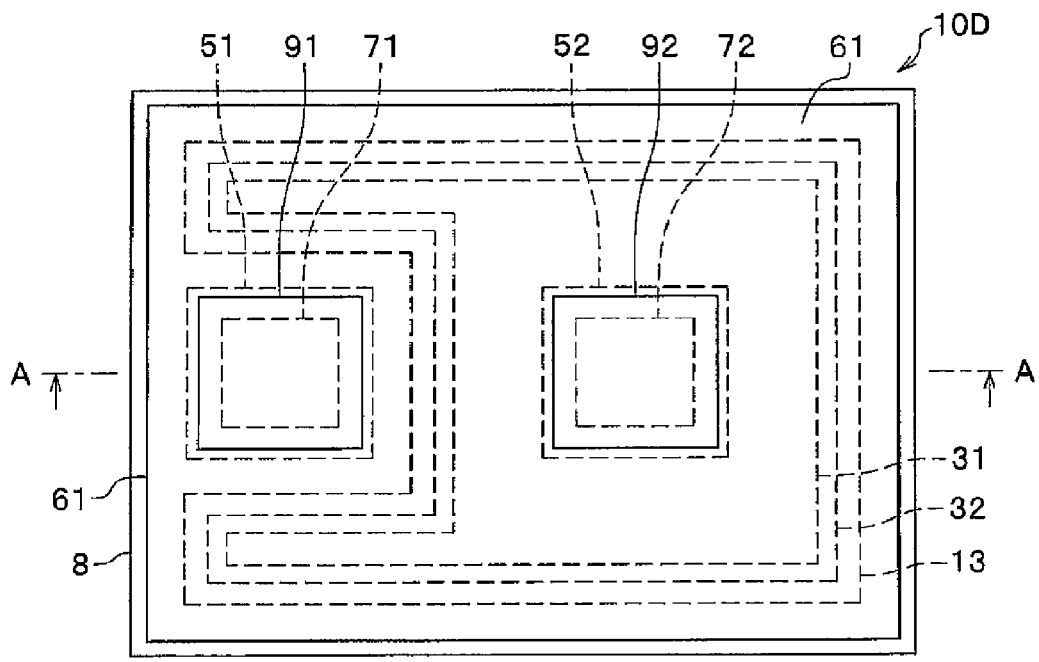
Figure 21B:
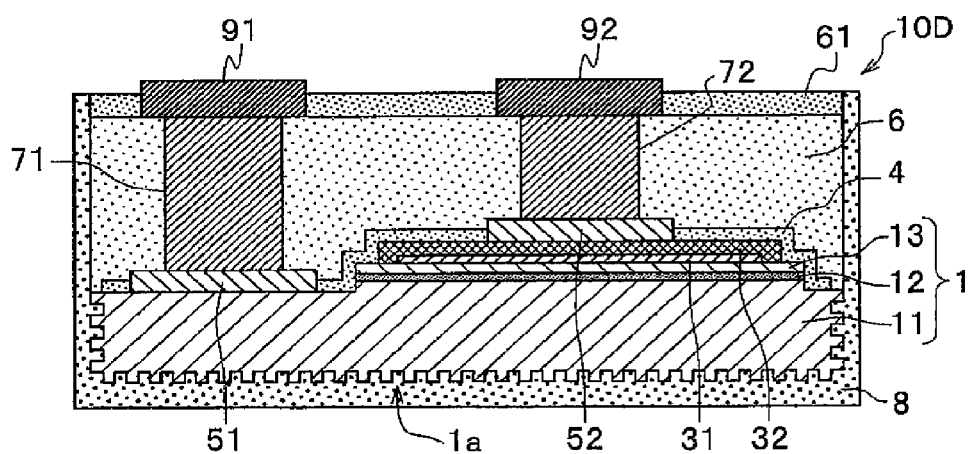
Figure 22:
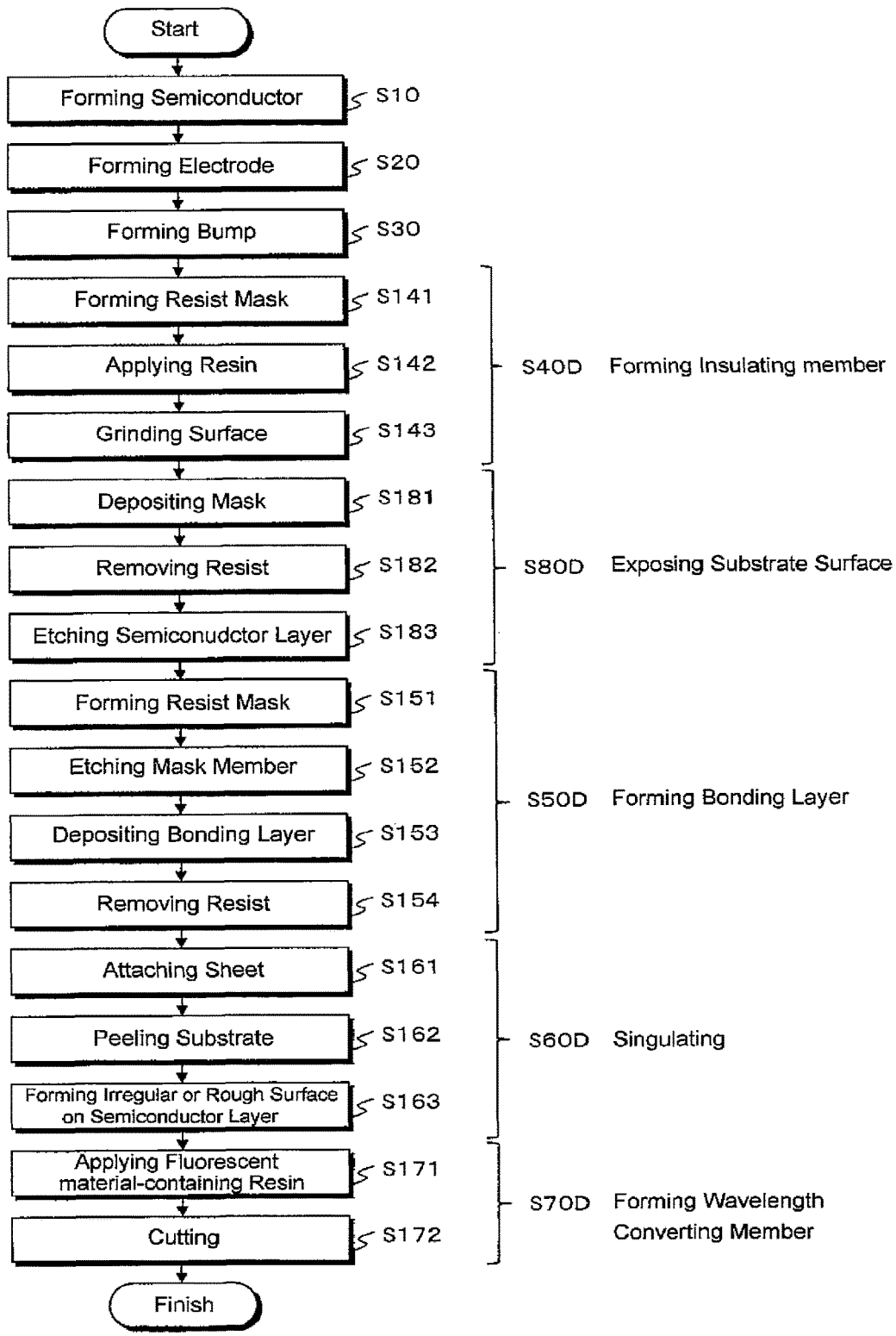
FIG. 22 is a flowchart illustrating a flow of processing in a method of manufacturing light emitting element according to Embodiment 4 of the present invention.

First, referring to FIGS. 21A, 21B, a light emitting element 10D fabricated according to a method of manufacturing a light emitting element according to Embodiment 4 will be described. As shown in FIGS. 21A, 21B, the light emitting element 10D is, in a similar manner as in the light emitting element 10A according to Variation 1 of Embodiment 1 shown in FIGS. 10A, 10B, includes a semiconductor structure 1 in which the substrate 2 (see FIG. 23A) for growing crystal of a semiconductor material, and the wavelength converting member 8 is disposed to cover the side surfaces and the lower surface of the semiconductor structure 1 and the side surfaces of the insulating member 6 and the mask member 6. Also, the light emitting element 10D is formed so that in a plan view, the outer shape of the semiconductor structure 1 and the outer shape of the insulating member 6 and the outer shape of the mask member 61 are in conformity with one another.

Also, the side surfaces of the border portions of the steps formed on the upper surface of the semiconductor structure, that is, the side surfaces of the p-type semiconductor layer 13 and the active layer 12 are covered with the insulating member 6 provided with light reflectivity via the light transmissive protective layer 4. With this arrangement, light emitted from the active layer 12 and propagating in a lateral direction in the semiconductor structure 1 is reflected by the insulating member 6 and returned, then, extracted to outside from the lower surface or the side surfaces of the semiconductor structure 1, through the wavelength converting member 8. Accordingly, the light distribution characteristic of the light emitted from the light emitting element 10D can be improved. The wavelength converting member 8 is disposed to cover the surface from which the light from the semiconductor structure 1 is extracted to outside, so that in the case where the insulating member 6 has light reflectivity, the wavelength converting member may not to be disposed on the side surfaces of the insulating member 6.

The light emitting element 10D according to Embodiment 4 is different from the light emitting element 10A in that the bonding layers 91, 92 are disposed on the upper surface of the bumps 71, 72, and the mask member 61 is disposed to cover the upper surface of the insulating member 6. Also, the lower surface and the side surfaces of the n-type semiconductor layer 11 which is a lower portion of the semiconductor structure 1 are formed to have irregular or rough surfaces 1a. With the irregularity 1a on the surfaces, the extracting efficiency from the semiconductor structure 1 can be improved. As shown above, also in the light emitting element 10A and in other embodiments, in the case employing a structure in which the substrate 2 is removed, the lower surface, or the lower surface and the side surfaces of the n-type semiconductor layer 11 may be formed to have irregular or rough surfaces.

In the light emitting element 10D according to Embodiment 4, in a plan view, the bonding layers 91, 92 are formed smaller than the pad electrodes 51, 52 which have corresponding polarities respectively, but is not limited thereto, the bonding layers 91, 92 may be formed in a larger size than the corresponding pad electrodes 51, 52. Further, the umber, shape, arranging regions, or the like of the pad electrodes 51, 52, the bumps 71, 72, and the bonding layers 91, 92 can be changed appropriately.

(Masking Member)

For the mask member 61, a material resistant to etching of the semiconductor structure 1 and has good adhesion with the insulating member 6 is preferably used, and for example, an insulating material such as $SiO_2$ can be employed. The mask member 61 is a remnant of the mask used in etching at the time of removing the semiconductor structure 1 from the dividing regions of the light emitting element 10D in the wafer formed with the semiconductor structure 1. The mask member 61 may not present in the light emitting element 10D at completion, and may be removed after used as the etch mask.

Method of Manufacturing Light Emitting Element

Next, referring to FIG. 22 to FIGS. 26A to 26C (and also FIGS. 21A, 21B), a method of manufacturing a light emitting element according to Embodiment 4 will be described.

(Forming Semiconductor, Forming Electrode, Forming Bump)

First, in a similar manner as in Embodiment 1, the forming a semiconductor: S10, the forming electrodes: S20, and the forming bumps: S30 are conducted, and as shown in FIG. 23A, on the substrate 2, the semiconductor structure 1, a full-surface electrode 31 (see FIG. 21B), the cover electrode 32 (see FIG. 21B), the protective layer 4, the pad electrodes 51, 52, and the bumps 71, 72 are formed in this order.

In the cross sectional views for illustrating the manufacturing steps of FIG. 23A to FIG. 26C as well as in FIG. 29A to FIG. 31D, FIG. 34A to FIG. 36B, and FIG. 39A to FIG. 42 which are to be described below, the detailed structure of the semiconductor structure 1, the full-surface electrode 31, and the cover electrode 32 are omitted. In those figures, step differences are formed in the semiconductor structure 1, in which, in the region at the lower step-side, the p-type semiconductor layer 13, the active layer 12, and a prt of the n-type semiconductor layer 11 are removed, so that the upper surface of the region is the n-type semiconductor layer 11. Also, the region at the upper step-side of the semiconductor structure 1 has the active layer 12 and the p-type semiconductor layer 13, and the full-surface electrode (not shown) and the cover electrode 32 (not shown) are disposed to cover approximately the entire upper surface of the p-type semiconductor layer 13. Also, in the region at the upper step-side of the semiconductor structure 1, the p-pad electrode 52 is disposed on the cover electrode 32, and except for the region where the p-side pad electrode 52 is formed, the cover electrode 32 is covered with the protective layer 4.

Figure 23A:
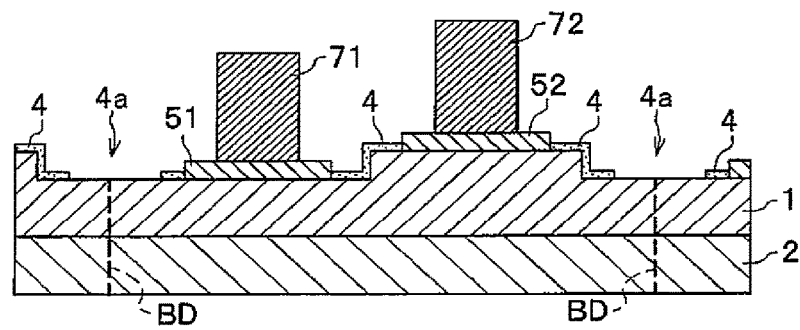
FIGS. 23A to 23D are schematic diagrams illustrating a method of manufacturing light emitting element according to Embodiment 4 of the present invention, in which FIGS. 23A to 23D each corresponds to a cross-section viewed from the direction of arrows along line A-A of FIG. 21A.

Also, as shown in FIG. 23A, in Embodiment 4, in the dividing regions along the dividing lines BD of the light emitting elements, the protective layer 4 is removed in the etching the protective layer: S25 (see FIG. 2) to form the openings 4a in the protective layer 4. Thus, the n-type semiconductor layer 11 of the semiconductor structure 1 is exposed in the openings 4a. Also, the openings 4a are formed equal to or wider than the width d1 of the gaps in the insulating member 6. Also, the protective layer 4 is not disposed in the regions along the dividing lines BD, so that in exposing the substrate surface: S80D to be described below, the mask member 61 (see FIG. 24A to FIG. 24D) is formed using an insulating material which is a similar kind employed for the protective layer 4, and can be used as the mask at the time of etching the semiconductor structure 1.

(Forming Steps of Insulating Member)

Next, in forming an insulating member: S40D, the insulating member 6 is formed. The Forming Insulating Member: S40D in Embodiment 4 includes three sub-manufacturing steps of Forming Resist Mask: S141, Applying Resin: S142, and Grinding Surface: S143.

Figure 23B:
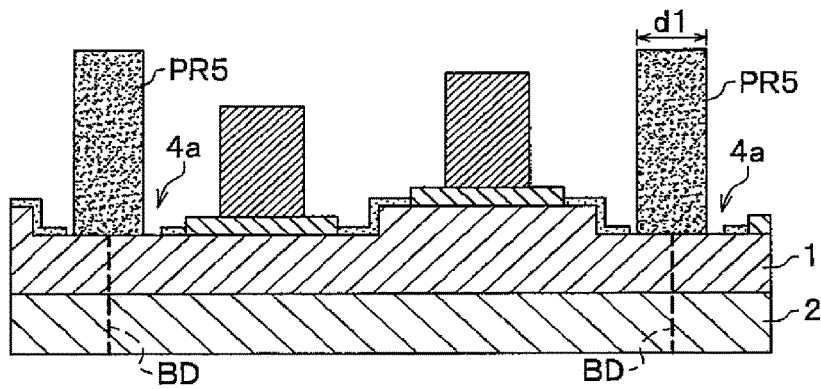

First, In Forming Resist Mask: S141, by way of photolithography, as shown in FIG. 23B, a resist mask PR5 is formed with a pattern to cover the regions with a width d1 along the dividing lines ED. In Embodiment 4, the resist mask PR5 is formed on the n-type semiconductor layer 11 of the semiconductor structure 1 exposed in the openings 4a of the protective layer 4. Also, the resist mask PR5 is preferably disposed spaced apart from the boundaries of the step differences formed in the semiconductor structure 1. With this arrangement, in Applying Resin: S142 to be described below, the insulating member 6 can be disposed so that the side surfaces of the p-type semiconductor layer 13 and the active layer 12 are covered with the insulating layer 6 via the protective layer 4. The Forming Resist Mask: S141 can be conducted in a similar manner as in the Forming Resist Mask: S41 (see FIG. 3) to form the resist mask PR3 (see FIG. 6C) in Embodiment 1.

Figure 23C:
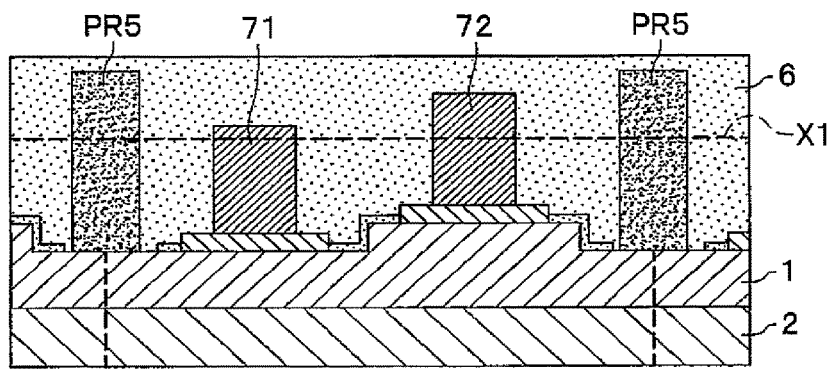

Next, in the Applying Resin: S142, as shown in FIG. 23C, a liquid resin material to form the insulating member 6 is applied on the wafer with a thickness higher than the grinding line Xi, then the resin thus applied is cured. With this arrangement, the bumps 71, 72 and the resist mask PR5 are buried in the insulating member 6. In Embodiment 4, the grinding line X1 indicates the height of the insulating member 6 in the light emitting element 10D at completion. The Applying Resin: S142 can be conducted in a similar manner as in the Applying Resin: S42 in Embodiment 1.

Figure 23D:
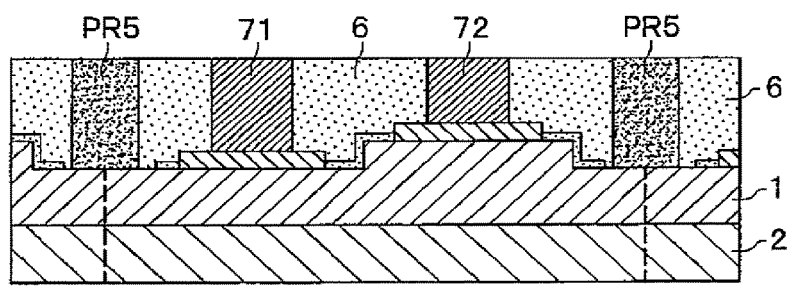

Next, in Grinding Surface: S143, the insulating member 6 is ground together with the bumps 71, 72 and the resist mask PR5 which are buried in the insulating member 6 to the height of the grinding line X1 to obtain a flat upper surface. Thus, as shown in FIG. 23D, the upper surfaces of the bumps 71, 72, and the upper surfaces of the resist masks PR5 are exposed from the insulating member 6, and the shape of the insulating member 6 is completed. The Grinding Surface: S143 can be conducted in a similar manner as in the Grinding Surface: S44 in Embodiment 1.

(Exposing Substrate Surface)

Next, in Exposing Substrate: S80D, the semiconductor structure 1 in the dividing regions can be removed. The Exposing Substrate: S80D includes three sub-manufacturing steps of Forming Mask: S181, Removing Resist: S182, and Etching Semiconductor layer: S183.

Figure 24A:
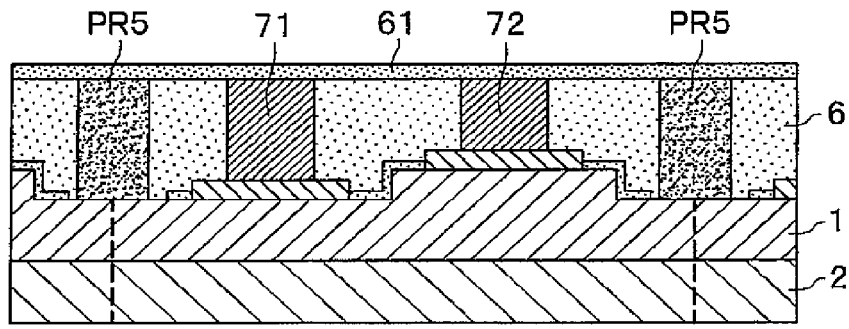
FIGS. 24A to 24D are schematic diagrams illustrating a method of manufacturing light emitting element according to Embodiment 4 of the present invention, in which FIGS. 24A to 24D each corresponds to a cross-section viewed from the direction of arrows along line A-A of FIG. 21A.
Figure 24B:
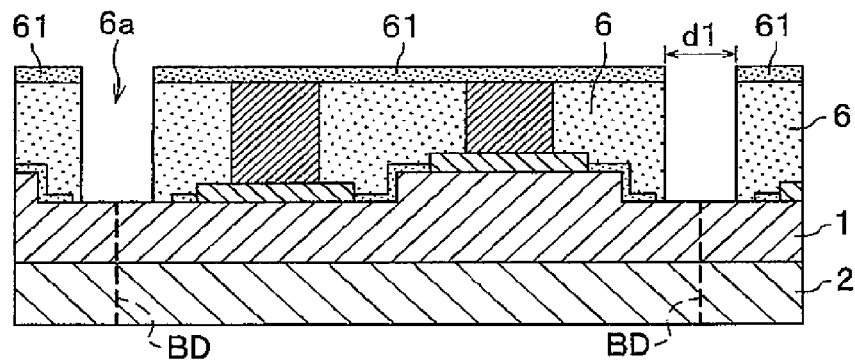

In the Forming Mask: S181, with the use of sputtering method or vapor deposition method, as shown in FIG. 24A, a mask material (for example, $SiO_2$) is disposed on the wafer to form the mask member 61. Next, in the Removing Resist: S182, the resist mask PR5 is removed together with the mask member formed on the resist mask PR5. Thus, as shown in FIG. 24B, the openings 6a are formed in the mask member 61 and the insulating member 6, with a width d1 along the dividing lines BD, and the semiconductor structure 1 is exposed in the openings 6a.

Figure 24C:
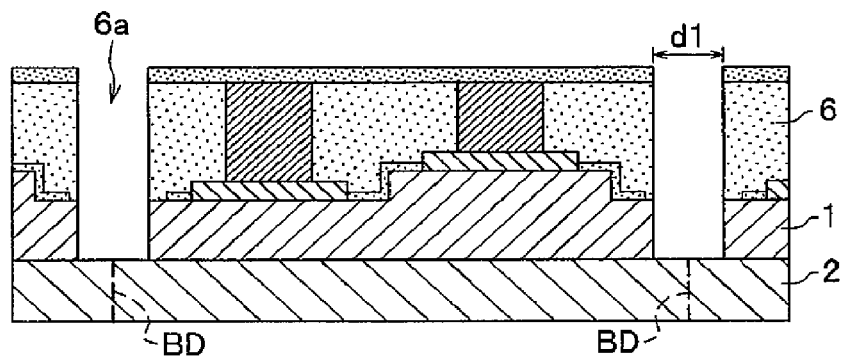

Next, in the Etching Semiconductor Layer: S183, the semiconductor structure 1 is etched with using the mask member 61 as the mask. Thus, as shown in FIG. 24C, the substrate 2 is exposed in the regions with a width d1 along the dividing lines BD, that is, in a plan view, the substrate 2 is exposed in the openings 6a of the insulating member 6. After finishing the Etching Semiconductor Layer: S183, the mask member 61 may be removed by using an appropriate chemical.

(Forming Bonding Layer)

Next, in Forming Bonding Layer: S50D, the bonding layers 91, 92 are formed. The Forming Bonding Layer: S50D of Embodiment 4 employs a pattern forming method by liftoff, in a similar manner as in the Forming Bonding Layer: S50 (see FIG. 3) in Embodiment 1. The Forming Bonding Layer: S50D includes four sub-manufacturing steps of Forming Resist Mask: S151, Etching Mask Member: S152, Forming Bonding Layer: S153, and Removing Resist: S154.

Figure 24D:
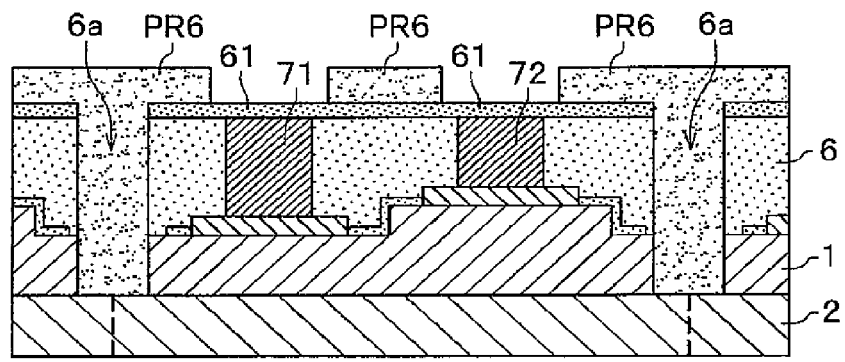
Figure 25A:
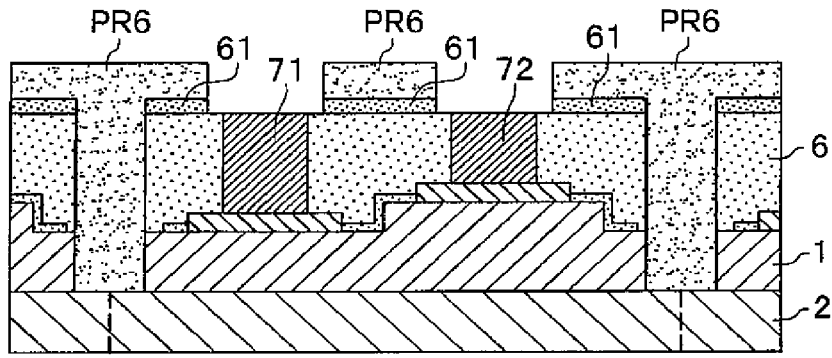
FIGS. 25A to 25D are schematic diagrams illustrating a method of manufacturing light emitting element according to Embodiment 4 of the present invention, in which FIG. 25A to 25D each corresponds to a cross-section viewed from the direction of arrows along line A-A of FIG. 21A.

First, in the Forming Resist Mask: S151, as shown in FIG. 24D, the resist mask PR6 which has openings over the bumps 71, 72, in conformity with the regions where the bonding layers 91, 92 to be disposed, is formed on the wafer by using photolithography. Next, in the Etching Mask Member: S152, using the resist mask PR6 as the mask, the mask member 61 is etched to expose the upper surfaces of the bumps 71, 72, as shown in FIG. 25A.

Figure 25B:
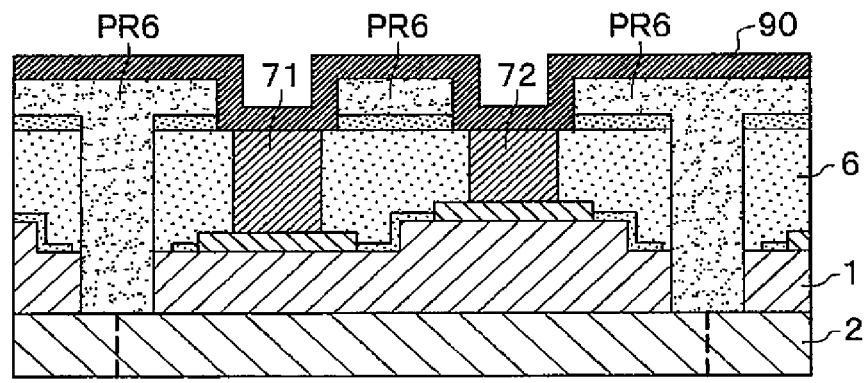
Figure 25C:
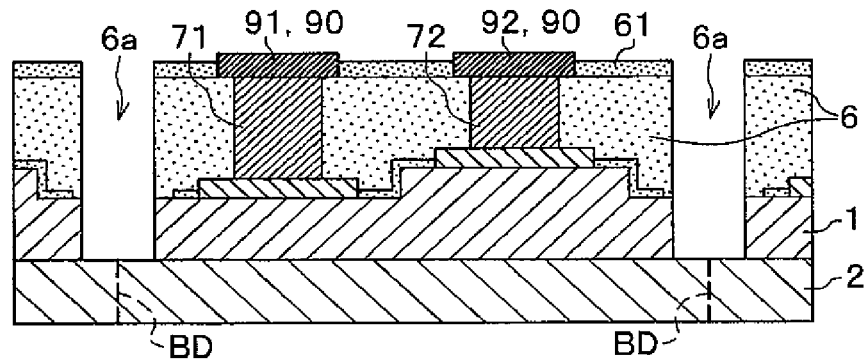

Next, in the Forming Bonding Layer: S153, as shown in FIG. 25B, the metal layer 90 which is to serve as the bonding layers 91, 92 is formed on the wafer. The Forming Bonding Layer: S153 can be conducted in a similar manner as in the Forming bonding layer: S52 in Embodiment 1. Next, in the Removing Resist: S154, the resist mask PR6 is removed together with the metal layer 90 formed on the resist mask PR6. Thus, the metal layer 90 is patterned and as shown in FIG. 25C, the bonding layers 91, 92 are formed. Also, by removing the resist mask PR6, the gaps with a width of d1 are formed in the regions along the dividing lines BD in the insulating member 6 and the mask member 61.

(Singulating)

Next in the Singulating: S60D, the light emitting elements 10D are singulated. The Singulating: S60D in Embodiment 4 includes three sub-manufacturing steps of Attaching sheet: S161, Peeling Substrate: S162, and Forming Irregular or Rough Surface on Semiconductor Layer: S163.

Figure 25D:
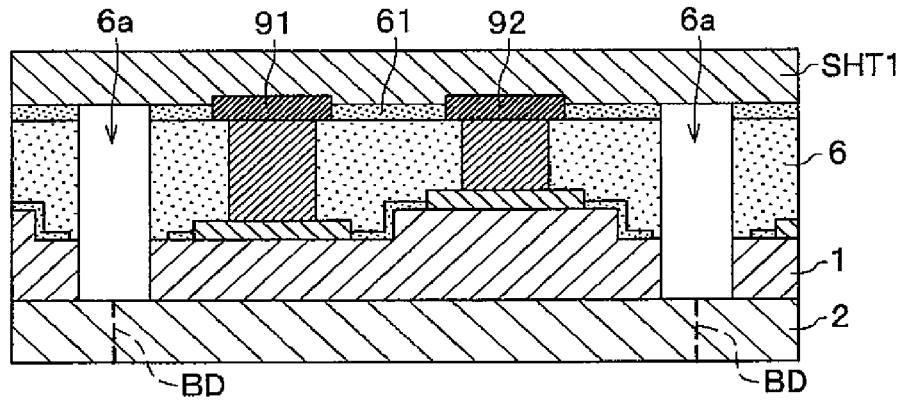

First, in the Attaching Sheet: S161, as shown in FIG. 25D, the surface of the wafer on the side where the insulating member 6 is formed is attached to the adhesive sheet SHT1. For the adhesive sheet SHT1, a sheet similar to the adhesive sheet SHT1 used in the Attaching Sheet: S61 (see FIG. 4) in Embodiment 1 can be used.

Figure 26A:
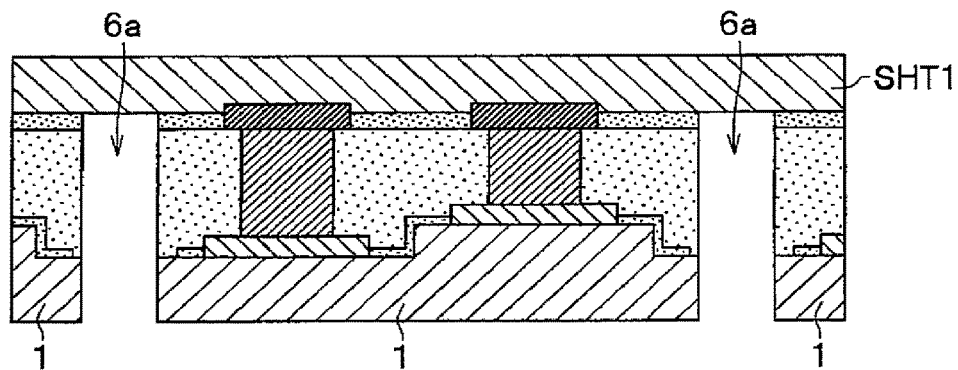
FIGS. 26A to 26C are schematic diagrams illustrating a method of manufacturing light emitting element according to Embodiment 4 of the present invention, in which FIGS. 26A to 26C each corresponds to a cross-section viewed from the direction of arrows along line A-A of FIG. 21A.

Next, in the Peeling Substrate: S162, by using LLO method etc., the substrate 2 is peeled and removed as shown in FIG. 26A. In Embodiment 4, after the Forming Bonding Layer: S50D, the light emitting elements are connected only with the substrate 2. Therefore, with peeling and completely removing the substrate 2, the light emitting elements are singulated. The singulated light emitting elements are only connected with the adhesive sheet, so that individual light emitting elements can be picked out from the adhesive sheet with the use of a collet or the like.

As described above, at the time of dividing the wafer, the width of the regions which are actually removed by dicing or laser scribing is indicated as w1, and the width of the regions which to be secured for dividing regions including a predetermined margin in consideration of positional accuracy at the time of dividing is indicated as d1 (see FIGS. 7A to 7C, and FIGS. 8A, 8B). On the other hand, as in Embodiment 4, in the case where the light emitting elements are singulated by completely removing the substrate 2 by using LLO method or the like, in the Exposing Substrate: S80D, the width of the semiconductor structure 1 removed by etching corresponds to the width w1. Therefore, at the time of singulating, the width w1 of the regions necessary for dividing the substrate 2 is not needed to separately take into consideration, so that the width d1 can be set based on the processing accuracy of etching the semiconductor structure 1.

Figure 26B:
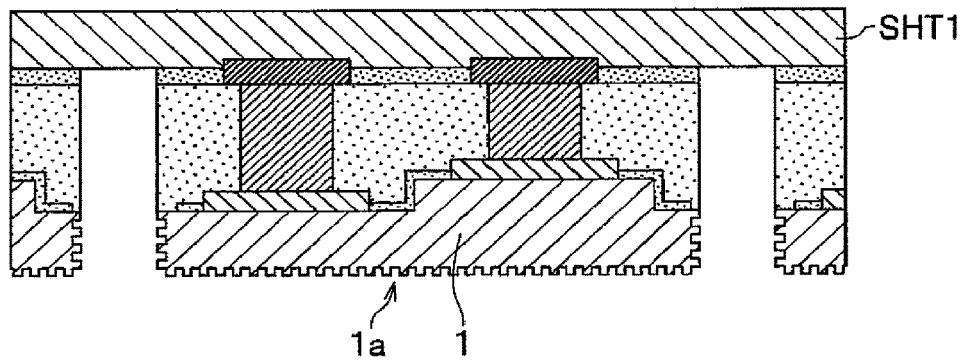

Next, in the Forming Irregular or Rough Surface on Semiconductor Layer: S163, as shown in FIG. 26B, the lower surface and the side surfaces of the semiconductor structure 1 exposed by removing the substrate 2 are formed into the irregular or rough surfaces by, for example, using wet etching to form the irregular shape 1a. This manufacturing step can be omitted, but forming the lower surface and the side surfaces which are to be the light extracting surfaces into irregular or rough surfaces allows an increase in the light extracting efficiency.

(Forming Wavelength Converting Member)

Next, in the Forming Wavelength Converting Member: S70D, the wavelength converting member 8 is formed on the lower surface and the side surfaces of the singulated light emitting elements. The wavelength converting member 8 can be formed in a similar manner as in the Forming Wavelength Converting Member: S70 (see FIG. 4) in Variation 1 of Embodiment 1.

The wavelength converting member 8 can be formed by further simplified method with the use of spraying method. Next, a forming method of the wavelength converting member 8 using a spraying method will be described below. In Forming Wavelength Converting Member: S70D in Embodiment 4 includes two sub-manufacturing steps of Applying Fluorescent Material-containing Resin: S171 and Cutting: S172.

Figure 26C:
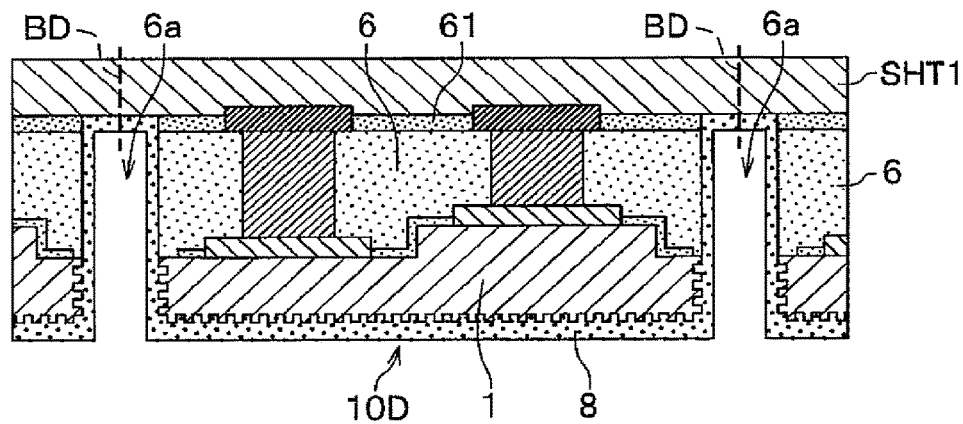

First, in Applying Fluorescent Material-containing Resin: S171, as shown in FIG. 26C, a liquid resin which contains particles of a fluorescent material (fluorescent material-containing resin) is applied on the lower surface and the side surfaces of the semiconductor structure 1, and on the side surfaces of the insulating member 6, and then cured, to form the wavelength converting member 8.

A spraying method is preferably used in the applying the fluorescent material-containing resin, and a pulse spraying method, which uses a thermosetting resin as the resin material and discharges spray in pulses, is more preferably used. With the use of a pulse spraying method, a slurry, in which particles of a fluorescent material and a thermosetting resin are contained in a solvent, is discharged in pulses, that is, by intermittent spraying. Thus, the amount of spraying per unit time can be reduced. With this method, the spraying device can be moved at a low speed while discharging a low volume of the spray, so that the coating can be applied uniformly also on the side surfaces or corners having irregular surfaces. Also, the wavelength converting member 8 may be formed by repeating a cycle of applying a small amount of slurry, applying heat to cure the applied layer to form a thin layer. The wavelength converting member 8 can be formed to a desired thickness with high accuracy by adjusting the number of repetition of the operation, that is, the number of stacking of the thin layers containing a fluorescent material.

Also, applying the slurry with a small amount at a time using a spray method allows obtaining a coating in which the amount of coating decreases as the distance from the spraying nozzle increases above a certain value. Accordingly, in FIG. 26C, the resin containing a fluorescent material can be applied thinner toward the bottom of the openings 6 (the adhesive sheet SHT1-side), more preferably, not to be applied near the bottom of the openings 6a. Here, the term "(the) lower side" refers to a lower side in FIG. 26C and is not intend to refer to a lower side in the gravitational field. In an opposite manner, the wafer may be placed with the adhesive sheet SHT1 at a lower side in the gravitational field and the spray coating can be applied from above.

Also, in the Applying Fluorescent Material-containing Resin: S171, in the case where the width d1 (see FIG. 24C) of the openings 6a is insufficient to the thickness of the wavelength converting member 8 to be formed on the side surfaces, before forming the wavelength converting member 8, the light emitting elements 10D may be picked up from the adhesive sheet SHT1 and rearranged on another adhesive sheet to provide an interval sufficient for the coating of the side surfaces of the light emitting elements 10D. Alternatively, an expandable sheet having stretching properties may be used for the adhesive sheet SHT1, and the adhesive sheet SHT1 is extended prior to applying the resin containing a fluorescent material to widen the interval between the light emitting elements 10D.

Next, in the Cutting: S172, the light emitting elements 10D connected with the wavelength converting member 8 are once again singulated by cutting along the dividing lines BD. The wavelength converting member 8 can be cut by using a dicing method, but a simpler method can be employed. In the Applying Fluorescent Material-containing Resin: S171, applying the resin containing a fluorescent material in the openings 6a with a thickness decreasing toward the bottom of the openings (the adhesive sheet SHT1 side) allows avoiding firm connection between the light emitting elements by the wavelength converting member 8. Thus, for example, using an expandable sheet having stretching properties for the adhesive sheet SHT1, and stretching the adhesive sheet SHT1 in a plane direction, the wavelength converting member 8 can be cut by tearing. Further, in the Applying Fluorescent Material-containing Resin: S171, applying the resin containing a fluorescent material in the openings 6a so as not to coat the bottom-side (the adhesive sheet SHT1 side) allows avoiding the connection of the light emitting elements by the wavelength converting member 8, so that the Cutting: S172 can be omitted. According to the manufacturing steps as described above, the individual light emitting elements 10D can be completed.

Fifth Embodiment

Next, a method of manufacturing a light emitting element according to Embodiment 5 of the present invention and a light emitting element produced by the method will be described. Herein, components of the same quality as other embodiments or the variations thereof are assigned the same reference numerals and description thereof will be appropriately omitted.

Structure of Light Emitting Element

Figure 27A:
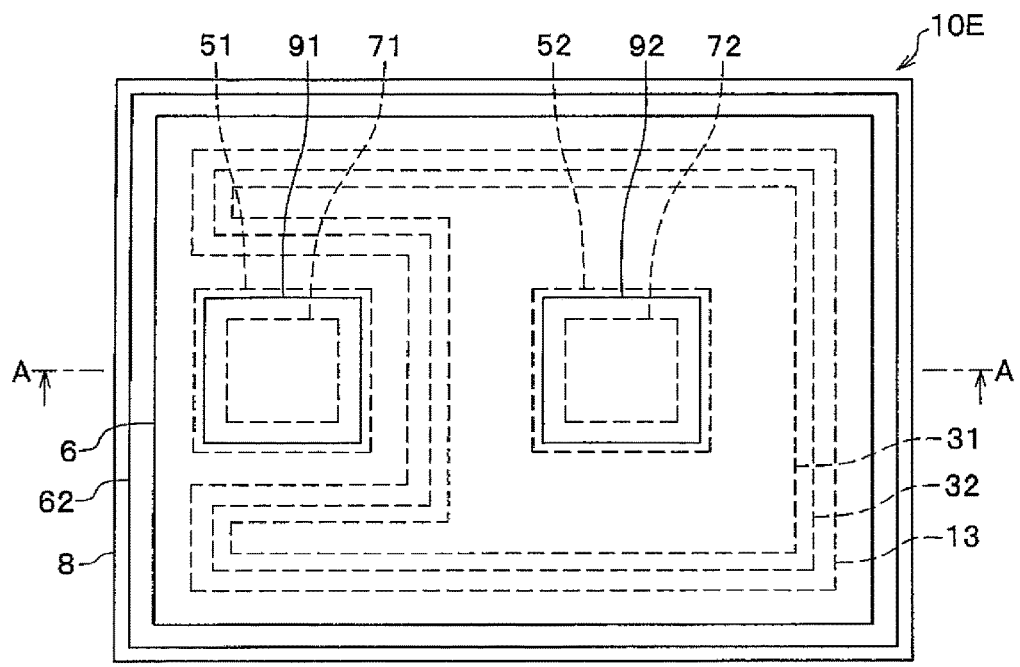
Figure 27B:
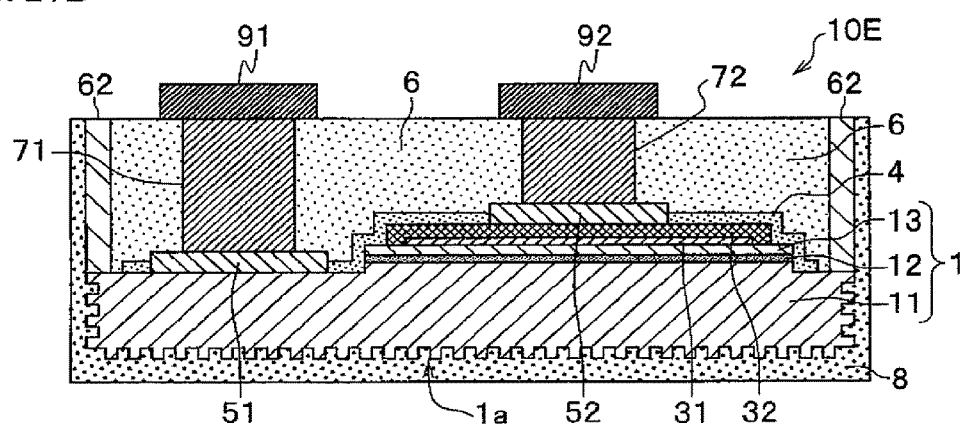

First, referring to FIGS. 27A, 27B, the light emitting element 10E produced by a method of manufacturing a light emitting element according to Embodiment 5 will be described. The light emitting element 10E shown in FIGS. 27A, 27B is different from the light emitting element 10D of Embodiment 4 shown in FIGS. 21A, 21B, in that, the light emitting element 10E does not have the mask member 61 which covers the upper surface of the insulating member 6 but has the mask member 62 which covers the side surfaces of the insulating member 6. Also, in the light emitting element 10, the wavelength converting member 8 covers the side surfaces of the wavelength converting member 6 via the mask member 62. Also, in the light emitting element 10E, in a plan view, the outline of the semiconductor structure 1 and the outline of the mask member 62 are formed to overlap with each other.

(Masking Member)

The mask member 62 is a remnant of the mask used in etching at the time of removing the semiconductor structure 1 from the dividing regions of the light emitting element 10E in the wafer formed with the semiconductor structure 1. Different from the mask member 61 employed in Embodiment 4, for the etching mask, the mask member 62 in Embodiment 5 is disposed to cover the upper surface of the insulating member 6 as well as to cover the inner side surfaces defining the openings 6a (see FIG. 24B). The mask member 62 in the completed light emitting element 10E is a remaining portion of the mask member disposed on the side surfaces defining the openings 6a of the insulating member 6. Also, the mask member 62 in Embodiment 5 is formed by using photoresist, and patterned by using photolithography.

Method of Manufacturing Light Emitting Element

Next, referring to FIG. 28 to FIGS. 31A to 31D (also to FIGS. 27, 27B), a method of manufacturing a light emitting element according to Embodiment 5 will be described.

(Forming Semiconductor, Forming Electrode, Forming Bump)

First, in a similar manner as in Embodiment 4, the Forming Semiconductor: S10, the Forming Electrode: S20, and the Forming Bump: S30 are conducted to form, as shown in FIG. 23A, the semiconductor structure 1, the full-surface electrode 31 (see FIG. 21B), the cover electrode 32 (see FIG. 21B), the protective layer 4, the pad electrodes 51, 52, and the bumps 71, 72, in this order on the substrate 2.

(Forming Steps of Insulating Member)

Next, conducting the Forming Insulating Member: S40E, the insulating member 6 is formed. The Forming Insulating Member: S40E in Embodiment 5 includes four sub-manufacturing steps of the Forming Resist Mask: S241, the Applying Resin: S242, the Grinding Surface: S243, and the Removing Resist: S244.

Figure 29A:
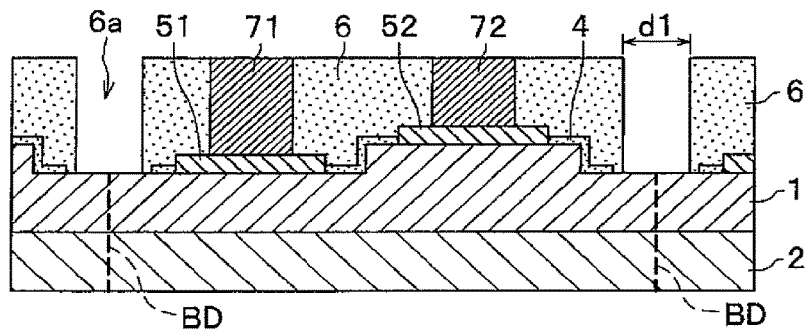
FIGS. 29A to 29D are schematic diagrams illustrating a method of manufacturing a light emitting element according to Embodiment 5 of the present invention, in which FIGS.
Figure 29B:
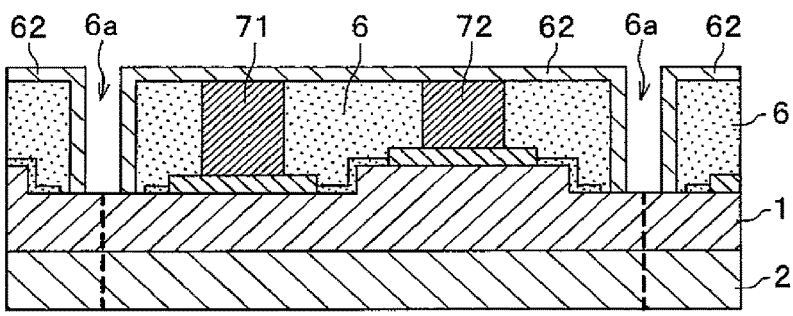

First, the Forming Resist Mask: S241, the Applying Resin: S242, and the Grinding Surface: S243 are conducted in a similar manner as in the Forming Resist Mask: S141, the Applying Resin: S142, and the Grinding Surface: S143 in Embodiment 4, respectively. Accordingly, after conducting the Grinding Surface: S243, as shown in FIG. 23D, the upper surfaces of the bumps 71, 72, and the upper surface of the resist mask PR5 are exposed all in a same plane. Next, conducting the Removing Resist: S244, the resist mask PR5 is removed, and as shown in FIG. 29A, the semiconductor structure 1 is exposed in a region of a width d1 along the dividing lines BD.

(Exposing Substrate Surface)

Next, conducting the Exposing Substrate Surface: S80E, the semiconductor structure 1 in the dividing regions is removed to expose the substrate 2 in the dividing regions. The Exposing Substrate Surface: S80E includes three sub-manufacturing steps of the Forming Resist Mask: S281, the Etching Semiconductor Layer: S282, and the grinding Surface: S283.

Figure 29C:
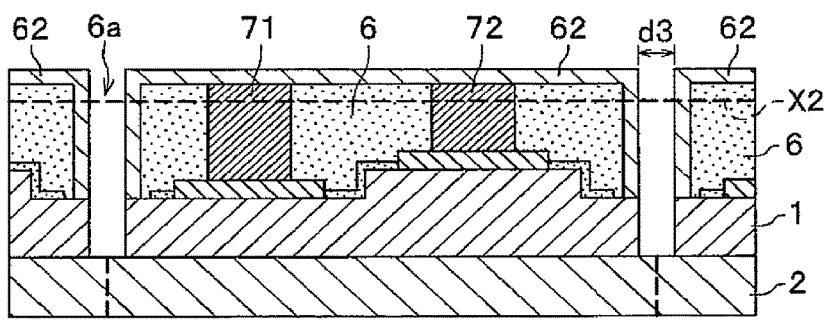
Figure 29D:
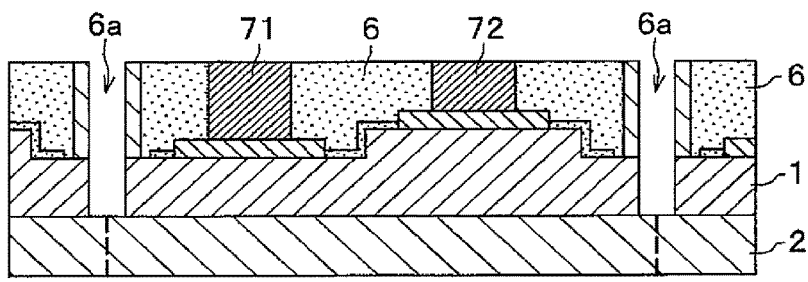

First, the Forming Resist Mask: S281 is conducted, and by using a photolithographic technique, as shown in FIG. 29D, the mask member 62 is formed. The mask member 62 is disposed to cover the entire wafer except for the bottom surface in the openings 6a of the insulating member 6. Note that, in each opening 6a, a part of the upper surface of the semiconductor structure 1 is covered by the thickness of the mask member 62 which covers the side walls of the insulating member 6. Thus, the width of the openings 6*a* of the insulating member 6 decreases only by the thickness of the mask member 62. The decreased width is indicated as d3, then d3<d1 (compare FIG. 29A and FIG. 29C).

Next, in the Etching Semiconductor Layer: S282, the semiconductor structure 1 is etched by using the mask member 62 as the etching mask. Thus, as shown in FIG. 29C, the substrate 2 is exposed in the region of a width d3 along the dividing lines BD.

Next, in Grinding Surface: S283, the wafer is ground from the upper surface side to a predetermined height indicated by grinding line X2, to obtain a flat upper surface. Accordingly, as shown in FIG. 29D, the mask member 62 disposed on the upper surface of the wafer is removed and the upper surfaces of the bumps 71, 72 are exposed.

(Forming Steps of Bonding Layer)

Next, in the Forming Bonding Layer: S50E, the bonding layers 91, 92 are formed. The Forming Bonding Layer: S50E in Embodiment 5 employs a pattern formation method by way of etching. For this reason, the Forming Bonding Layer: S50E includes four sub-manufacturing steps of the Disposing Bonding layer: S251, the Forming Resist Mask: S252, the Etching Bonding Layer: S253, and the Removing Resist: S254.

Figure 30A:
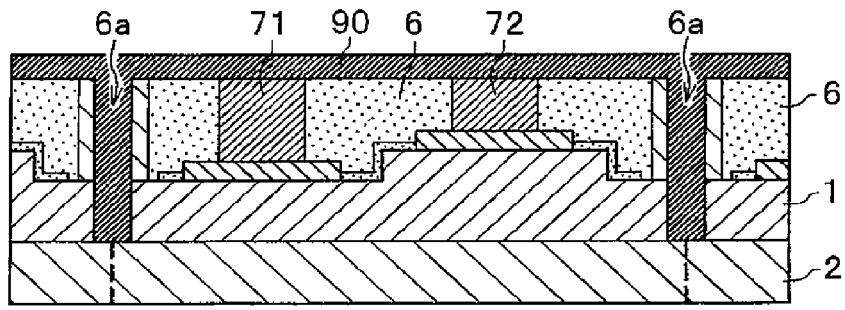
Figure 30B:
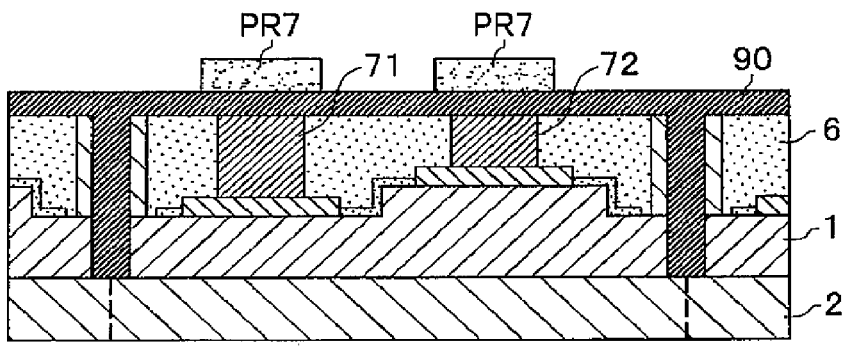

First, in the Disposing Bonding Layer: S251, as shown in FIG. 30A, a metal layer 90 to serve the bonding layers 91, 92 are disposed on the wafer. The Disposing Bonding Layer: S251 can be conducted in a similar manner as the Disposing Bonding Layer: S52 in Embodiment 1. Next, in Forming Resist Mask: S252, using a photolithographic technique, as shown in FIG. 30B, on the wafer, the resist mask PR7 is formed to cover the regions over the bumps 71, 72 where the bonding layers 91, 92 are to be provided.

Figure 30C:
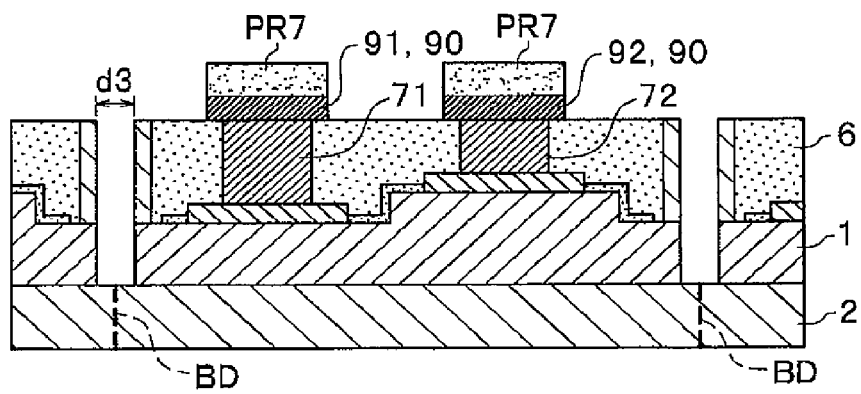
Figure 30D:
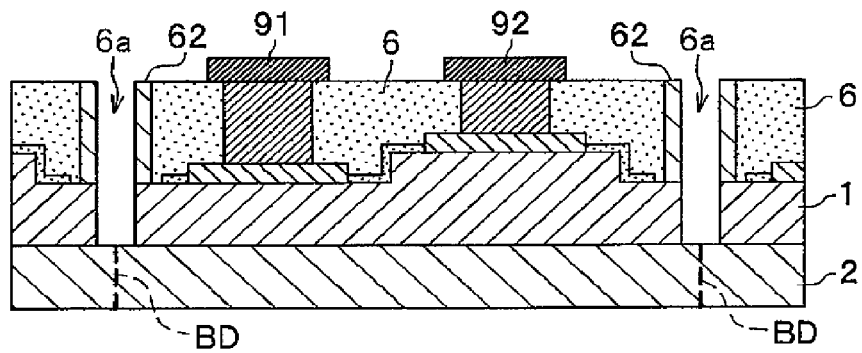

Next, in the Etching Bonding Layer: S253, as shown in FIG. 30C, using the resist mask PR7 as the etching mask, the metal layer 90 is etched to form the pattern of the bonding layers 91, 92. Also, with the etching, unnecessary portions of the metal layer 90 are removed. Thus, the gaps are formed again in the regions with a width along the dividing lines BD, which provides a state in which the light emitting elements are connected only by the substrate 2. Next, in Removing Resist: S254, as shown in FIG. 30D, the resist mask PR7 is removed, thus, the bonding layers 91, 92 are formed.

(Singulating)

Figure 31A:
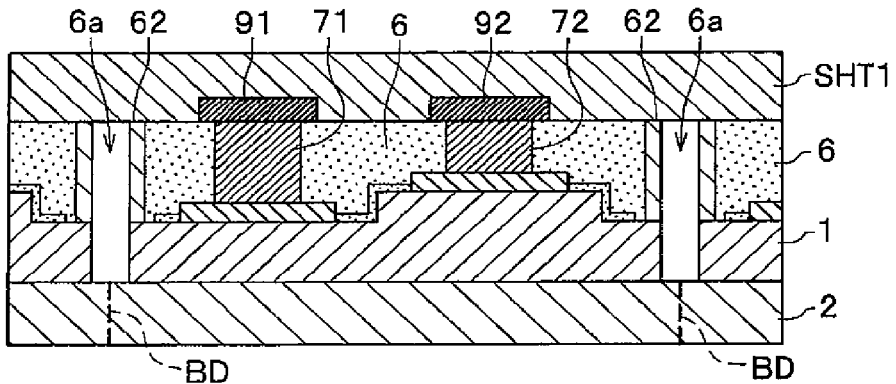

Next, the Singulating: S60D is conducted to obtain individual light emitting elements. The Singulating of the light emitting elements in Embodiment 5 is conducted in a similar manner as in the Singulating: S60D in Embodiment 4. That is, first, in the Attaching Sheet: S161 (see FIG. 22), as shown in FIG. 31A, the surface of the wafer on the side where the insulating member 6 is formed is attached to the adhesive sheet SHT1.

Figure 31B:
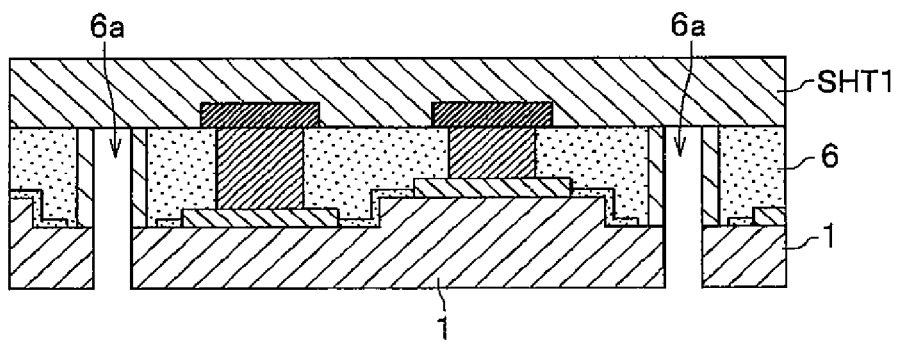
Figure 31C:
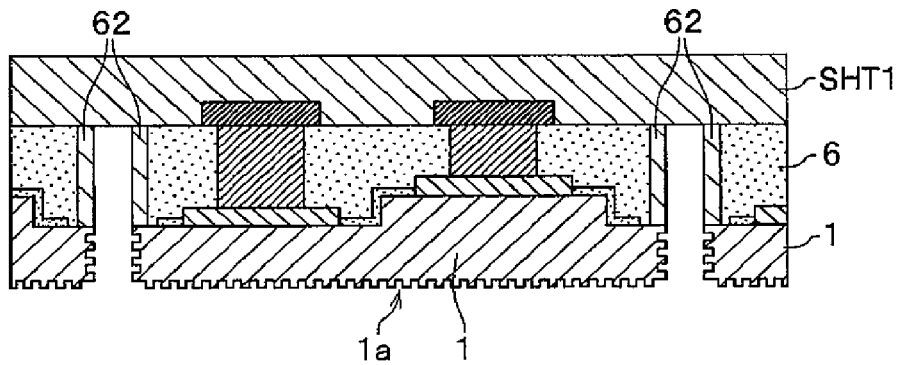

Next, in the Peeling Substrate: S162 (see FIG. 22), by using LLO technique or the like, as shown in FIG. 31B, the substrate 2 is removed by peeling. Also in Embodiment 5, after Forming Bonding Layer: S50E, the individual light emitting elements are connected only by the substrate 2. Accordingly, completely removing the substrate 2 by peeling, individual light emitting elements are singulated. Next, in Forming Irregular Surface of Semiconductor Layer: S163 (see FIG. 22), as shown in FIG. 31C, the lower surface and the side surfaces of the semiconductor structure 1 are formed into the irregular or rough surfaces 1*a*.

(Forming Steps of Wavelength Converting Member)

Figure 31D:
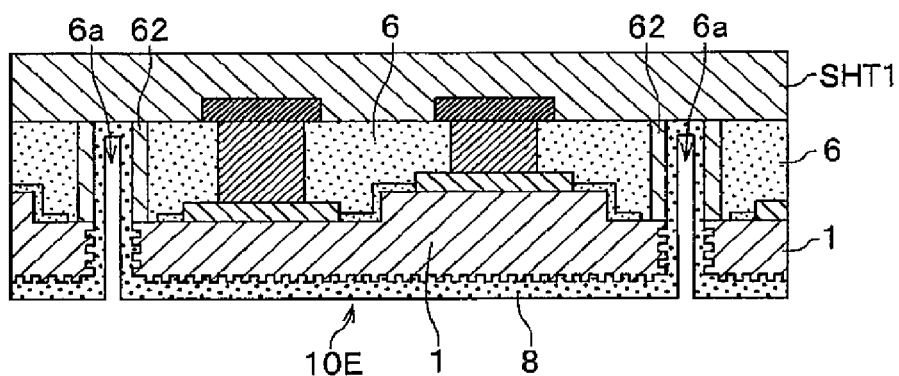

Next, in a similar manner as in Embodiment 4, Forming Wavelength Converting Member: S70D is conducted, and as shown in FIG. 31D, the wavelength converting member 8 is formed on the lower surface and the side surfaces of the singulated light emitting elements. According to the manufacturing steps as described above, the individual light emitting elements 10E are fabricated.

In Embodiment 5, the width of the openings 6*a* which are gaps formed along the dividing lines BD in the insulating member 6 is reduced by the mask member 62 applied on the insulating member, but in a similar manner as in Embodiment 4, at the time of forming the wavelength converting member 8 or/and at the time of cutting into the individual light emitting elements 10E, the arrangement interval of the light emitting elements 10E may be increased.

Sixth Embodiment

Next, a method of manufacturing a light emitting element according to Embodiment 6 of the present invention and a light emitting element produced by the method will be described. Herein, components of the same quality as other embodiments or the variations thereof are assigned the same reference numerals and description thereof will be appropriately omitted.

Structure of Light Emitting Element

First, referring to FIGS. 32A, 32B, the light emitting element 10F produced by a method of manufacturing a light emitting element according to Embodiment 6 will be described. As shown in FIGS. 32A, 32B, the light emitting element 10F is different from the light emitting element 10E according to Embodiment 5 shown in FIG. 27A, 27B, in that the light emitting element does not include the mask member 62 which covers the side surfaces of the insulating member 6. Also, in the light emitting element 10F, a step difference is formed in the side surfaces, which is also different from the light emitting element 10E which has flat side surfaces. That is, in the light emitting element 10F, in a height direction, the upper region which is provided with the insulating member 6 is formed inner side than the lower region which is not provided with the insulating member 6 by an amount corresponding to the thickness of the mask member 62 (see FIGS. 27A, 27B) in the light emitting element 10E.

Method of Manufacturing Light Emitting Element

Next, referring to FIG. 33 to FIGS. 36A, 36B (also to FIGS. 32A, 32B), a method of manufacturing a light emitting element according to Embodiment 6 will be described.

First, in a similar manner as in Embodiment 5, conducting the Forming Semiconductor: S10, the Forming Electrode: S20, the Forming Bump: S30, and the Forming Insulating Member: S40E, the wafer in a state shown in FIG. 29A is formed.

(Exposing Steps of Substrate Surface)

Next, conducting the Exposing Substrate Surface: S80F, the semiconductor structure 1 in the dividing regions is removed to expose the substrate 2 in the dividing regions. The Exposing Substrate Surface: S80F includes three sub-manufacturing steps of the Forming Resist Mask: S381, the Etching Semiconductor Layer: S382, and the Removing Resist: S383.

Figure 34A:
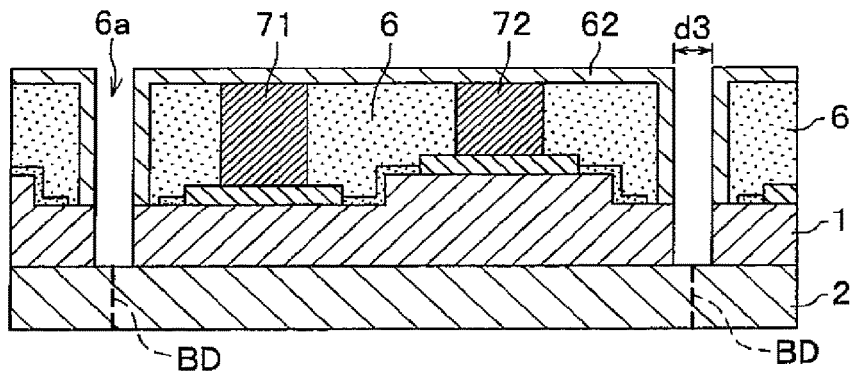

The Forming Resist mask: S381 and the Etching Semiconductor: S382 are conducted in a similar manner as in the Forming Resist Mask: S281 and the Etching Semiconductor Layer: S282 in the Exposing Substrate Surface: S80E in Embodiment 5, respectively. With this, as shown in FIG. 34A, the semiconductor structure 1 is removed in the regions with a width d3 along the dividing lines BD to obtain a state in which the substrate 2 is exposed. The state is similar to that shown in FIG. 29C.

Figure 34B:
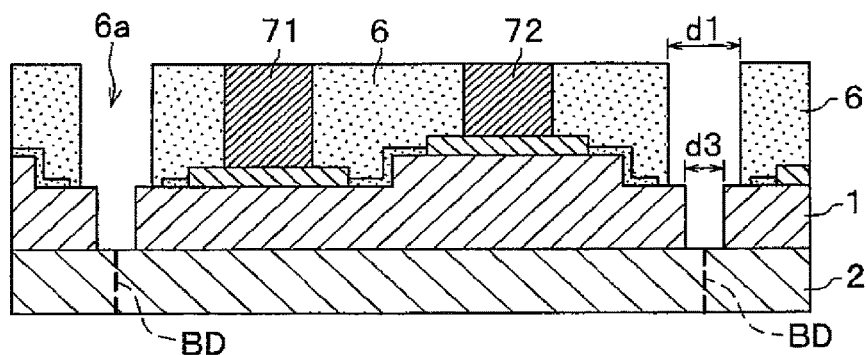

Next, in the Removing Resist: S383, using an appropriate chemical agent etc., as shown in FIG. 34B, all the mask member 62 is removed. With this, in the regions along the dividing lines BD, openings are formed with a width d1 in the upper regions where the insulation member 6 is disposed, and with a width d3 in the lower regions where the insulation member 6 is not disposed.

(Forming Steps of Bonding Layer)

Figure 34C:
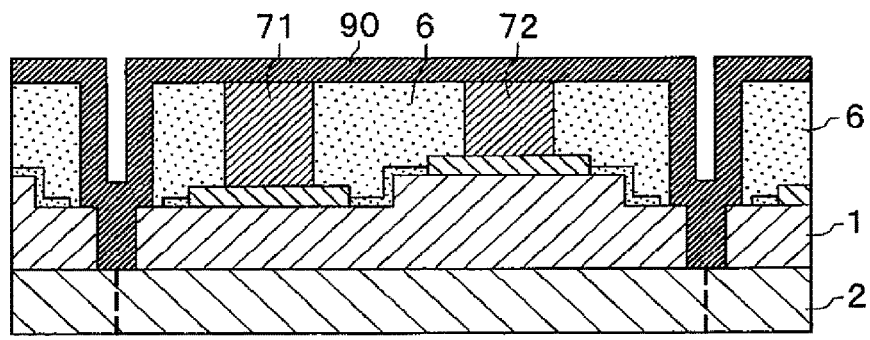
Figure 34D:
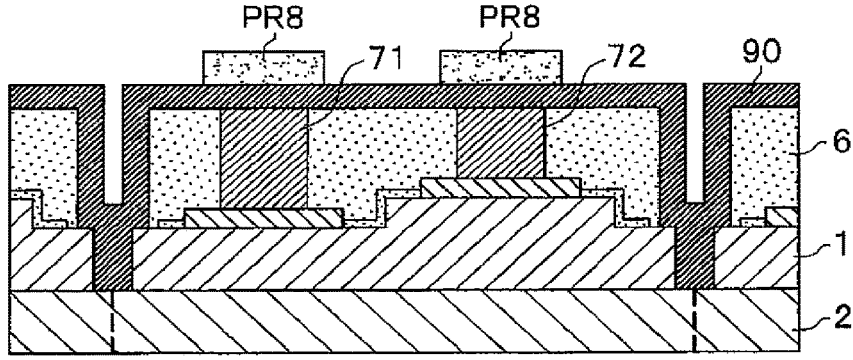

Next, in a similar manner as in Embodiment 5, by conducting Forming Bonding Layer: S50E, the bonding layers 91, 92 are formed. That is, first, in the Disposing Bonding Layer: S251 (see FIG. 28), as shown in FIG. 34C, the metal layer 90 is disposed on the wafer. Next, in Forming Resist Mask: S252 (see FIG. 28), as shown in FIG. 34D, on the wafer, the resist mask PR8 is formed to cover the regions over the bumps 71, 72 where the bonding layers 91, 92 are to be provided. The resist mask PR8 is formed in a similar manner as the resist mask PR7 in Embodiment 5.

Figure 35A:
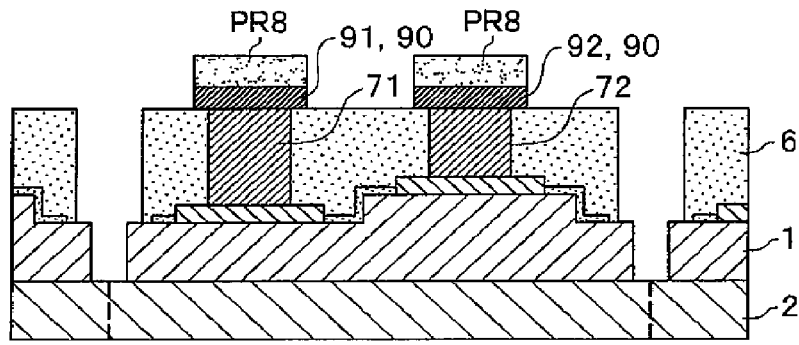
Figure 35B:
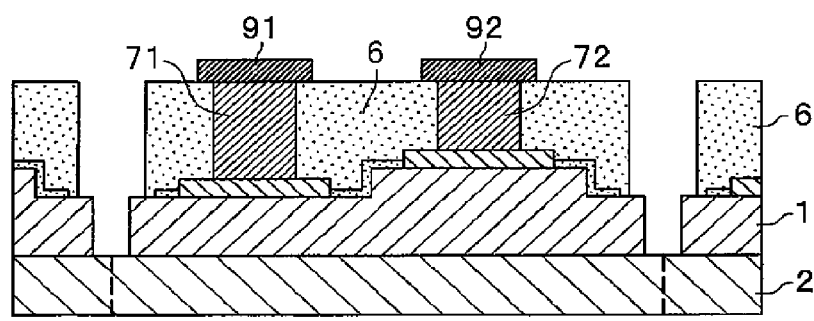

Next, in the Etching Bonding Layer: S253 (see FIG. 28), as shown in FIG. 35A, using the resist mask PR8 as the etching mask, the metal layer 90 is etched to form the pattern of the bonding layers 91, 92. Next, in Removing Resist: S254 (see FIG. 28), as shown in FIG. 35B, the resist mask PR8 is removed, thus, the bonding layers 91, 92 are formed.

(Singulating)

Figure 35C:
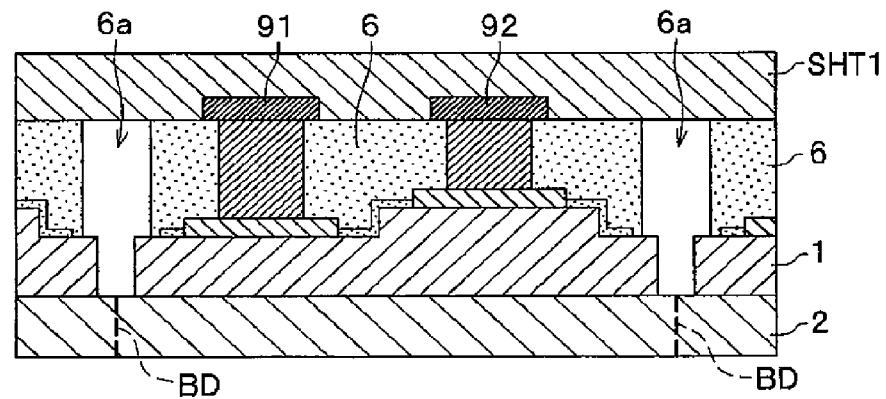

Next, conducting Singulating: S60D in a similar manner as in Embodiment 4 and Embodiment 5, the light emitting elements are singulated. That is, first, in the Attaching Sheet: S161 (see FIG. 22), as shown in FIG. 35C, the surface of the wafer on the side where the insulating member 6 is formed is attached to the adhesive sheet SHT1.

Figure 35D:
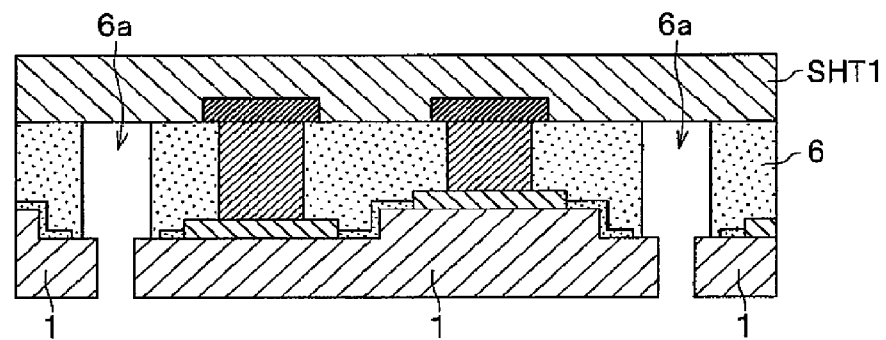

Next, in the Peeling Substrate: S162 (see FIG. 22), by using LLO technique or the like, as shown in FIG. 35D, the substrate 2 is removed by peeling. Also in Embodiment 5, after Forming Bonding Layer: S50E, the individual light emitting elements are connected only by the substrate 2. Accordingly, completely removing the substrate 2 by peeling, individual light emitting elements are singulated. Next, in Forming Irregular Surface of Semiconductor Layer: S163 (see FIG. 22), as shown in FIG. 36A, the lower surface and the side surfaces of the semiconductor structure 1 are formed into the irregular or rough surfaces 1a.

(Forming Steps of Wavelength Converting Member)

Next, in a similar manner as in Embodiment 4 and Embodiment 5, Forming Wavelength Converting Member: S70D is conducted, and as shown in FIG. 36B, the wavelength converting member 8 is formed on the lower surface and the side surfaces of the singulated light emitting elements. According to the manufacturing steps as described above, the individual light emitting elements 10F are fabricated.

In Embodiment 5, compared to the width d1 of the openings 6a which are gaps formed along the dividing lines BD in the insulating member 6, the width d3 of the gaps between the side surfaces of the semiconductor structures 1 is smaller, but in a similar manner as in Embodiment 4, at the time of forming the wavelength converting member 8 or/and at the time of cutting into the individual light emitting elements 10F, the arrangement interval of the light emitting elements 10F may be increased.

In Embodiment 6, the width d3 of the gaps between the side surfaces, which are a region where the wavelength converting member 8 to be preferably disposed, of the semiconductor structures 1 is smaller than the width d1 of the gaps between the side surfaces of the insulating member 6, and when viewed from the below, the side surfaces of the insulating member 6 are hidden behind the side surfaces of the semiconductor structure 1. That is, with such a shape, as shown in FIG. 36B, in the case where the resin which contains a fluorescent material is applied by spraying from the under side of the light emitting element 10F, the coating is difficult to apply on the side surfaces of the insulating member 6. Therefore, this structure is more suitable for applying the resin which contains a fluorescent material with the use of a spraying technique, to obtain a thin coating of the wavelength converting member 8 on the side surfaces of the insulating member 6 or not to dispose the wavelength converting member on the side surfaces of the insulating member 6. Accordingly, in the Cutting: S172 (see FIG. 22) which is conducted after forming the wavelength converting member 8, the wavelength converting member 8 can be easily cut or the Cutting: S172 (see FIG. 22) can be omitted.

Seventh Embodiment

Next, a method of manufacturing a light emitting element according to Embodiment 7 of the present invention and a light emitting element produced by the method will be described. Herein, components of the same quality as other embodiments or the variations thereof are assigned the same reference numerals and description thereof will be appropriately omitted.

Structure of Light Emitting Element

First, referring to FIGS. 37A, 37B, the light emitting element 10G produced by a method of manufacturing a light emitting element according to Embodiment 7 will be described. As shown in FIGS. 37A, 37B, the light emitting element G is different from the light emitting element 10F according to Embodiment 6 shown in FIGS. 32A, 32B, in that, the light emitting element 10G includes the substrate 2, the insulating member 6 is disposed to cover in the thickness direction of all the side surfaces of the semiconductor structure, and the wavelength converting member 8 is not provided. The substrate 2 is not peeled and thus included in the light emitting element 10G, so that an irregular or rough surface is not provided on the lower surface and the side surfaces of the semiconductor structure 1.

In Embodiment 7, all the side surfaces of the semiconductor structure 1 of the light emitting element G are covered with the insulating member 6 which has a light reflectivity so that light from the semiconductor structure 1 can be extracted only from the lower surface of the semiconductor structure 1. Accordingly, a uniform intensity distribution of light emitted in a normal direction to the lower surface of the light emitting element 10G can be obtained.

Method of Manufacturing Light Emitting Element

Next, referring to FIG. 38 to FIG. 42 (also to FIGS. 37A, 37B), a method of manufacturing a light emitting element according to Embodiment 7 will be described.

(Forming Semiconductor, Forming Electrode, Forming Bump)

First, in a similar manner as in Embodiment 4 and Embodiment 6, the Forming Semiconductor: S10, the Forming Electrode: S20, and the Forming Bump: S30 are conducted to form, as shown in FIG. 23A, the semiconductor structure 1, the full-surface electrode 31 (see FIG. 21B), the cover electrode 32 (see FIG. 21B), the protective layer 4, the pad electrodes 51, 52, and the bumps 71, 72, in this order on the substrate 2.

(Exposing Steps of Substrate Surface)

Next, in the Exposing Substrate Surface 80G, the semiconductor structure 1 in the dividing regions is removed to expose the substrate 2 in the dividing regions and also to expose the side surface of the semiconductor structure 1 in all the thickness directions. The Exposing Substrate Surface: S80G includes three sub-manufacturing steps of the Forming Resist Mask: S481, the Etching Semiconductor Layer: S482, and the Removing Resist: S483.

Figure 39A:
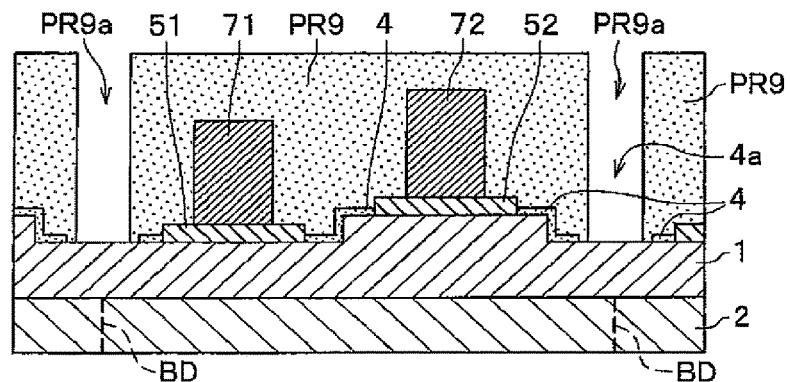

First, in the Forming Resist Mask: S481, with the use of a photolithographic technique, as shown in FIG. 39A, the resist mask PR9 is formed on the wafer. The resist mask PR9 is formed to define the openings PR9a in the regions with a width of d4 along the dividing lines BD.

With the width d1 necessary for dividing by way of laser scribing or a dicing with a thin blade, in Singulating: S60G to be described below, the width d4 can be determined to satisfy d4>d1. Then, the thickness of the insulating member 6 formed on the side surfaces of the semiconductor structure 1 corresponds to the thickness which is a half of the difference between the width d1 and the width d4. Thus, the width d1 and the width d4 are preferably determined to obtain satisfactory effect as a reflector with the insulating member 6.

Figure 39B:
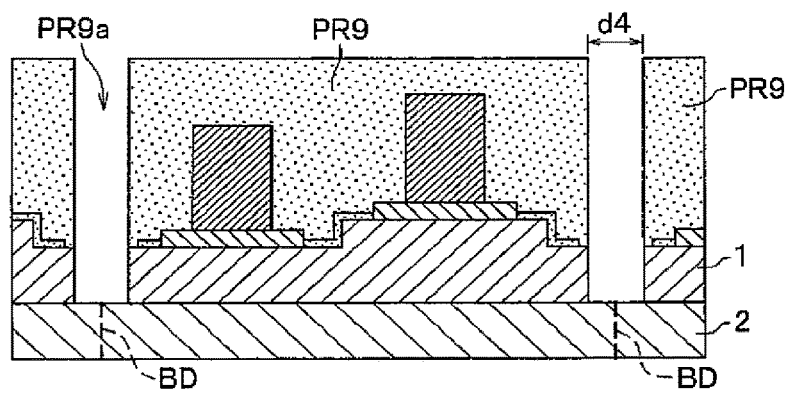
Figure 39C:
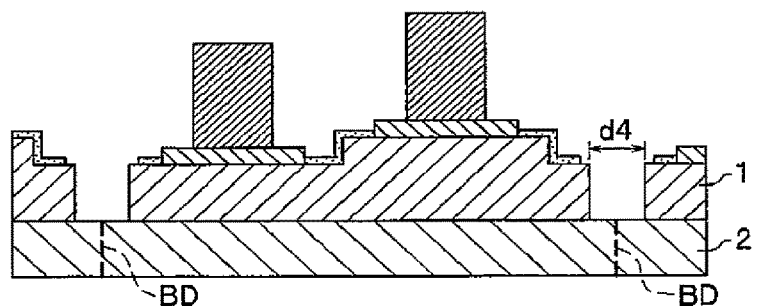

Next, in the Etching Semiconductor Layer: S482, as shown in FIG. 39B, the semiconductor structure 1 is etched by using the resist mask PR9 as the etching mask. Thus, the substrate 2 is exposed in the regions of a width d4 along the dividing lines BD. Next, in the Removing Resist: S483, using an appropriate chemical agent etc., as shown in FIG. 39C, all the resist mask PR9 is removed.

(Forming Insulating Member)

Next, in Forming Insulating Member: S40G, the insulating member 6 is formed on the wafer. The Forming Insulating Member: S40G in Embodiment 7 includes four sub-manufacturing steps of the Forming Resist Mask: S441, the Applying Resin: S442, the Grinding Surface: S443, and the Removing Resist: S444. Each of the sub-manufacturing steps of the Forming Insulating Member: S40G in Embodiment 7 can be conducted in a similar manner as in the corresponding sub-manufacturing steps in the Forming Insulating Member: S40D in Embodiment 4. In which, Embodiment 7 differs from the Embodiment 4 in that the resist mask PR5 (see FIG. 23B) is formed on the exposed surfaces of the semiconductor structure 1 in Embodiment 4, but in Embodiment 7, the resist mask PR10 is formed on the exposed surfaces of the substrate 2.

Figure 39D:
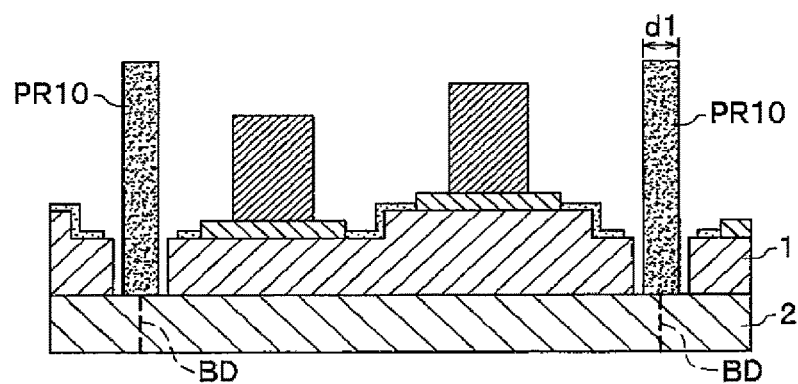

First, in Forming Resist Mask: S441, using a photolithographic technique, as shown in FIG. 39D, the resist mask PR10 is formed in a pattern with a width of d1 along the dividing lines BD, to cover the exposed surfaces of the substrate 2. At this time, the resist mask PR10 is disposed spaced apart from the side surfaces of the semiconductor structure 1.

Figure 40A:
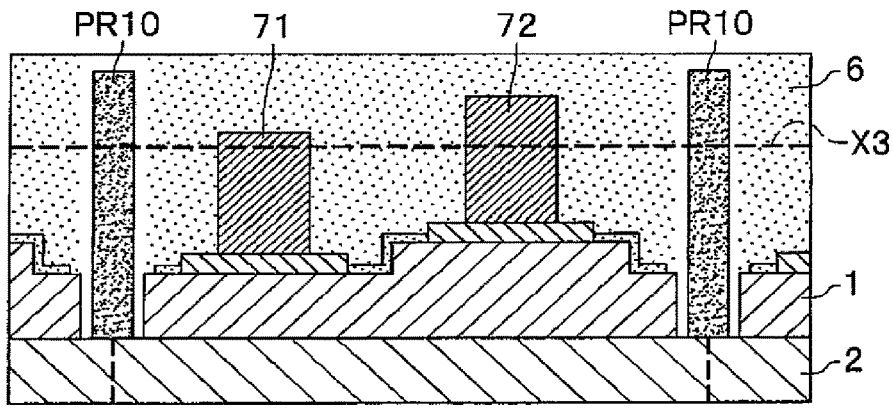

Next, in Applying Resin: S442, as shown in FIG. 40A, a liquid resin material to form the insulating member 6 is applied on the wafer to a thickness higher than the grinding line X3 and the applied resin material is cured. With this, the bumps 71, 72 and the resist masks PR10 are embedded in the insulating member 6. In Embodiment 7, the grinding line X3 indicates the height of the insulating member 6 at completion of the light emitting element 10G.

Figure 40B:
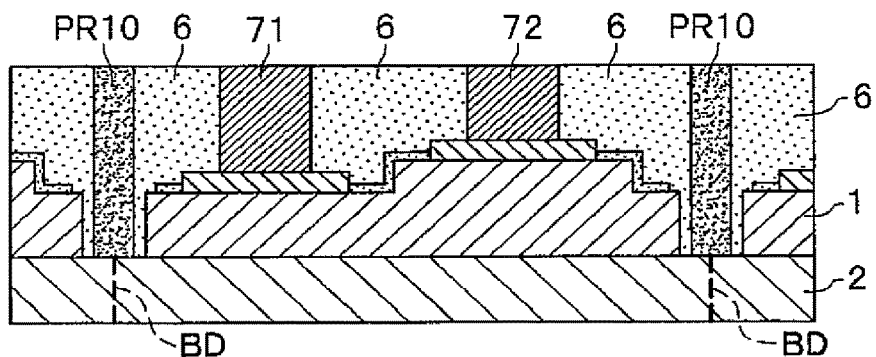

Next, in Grinding Surface: S443, the insulating member 6 is ground together with the bumps 71, 72, and the resist mask PR10 which are embedded in the insulating member 6 to the height indicated by the grinding line X3 to obtain a flat upper surface. Thus, as shown in FIG. 40B, the upper surfaces of the bumps 71, 72, and the resist mask PR10 are exposed at the surface of the insulating member 6.

Figure 40C:
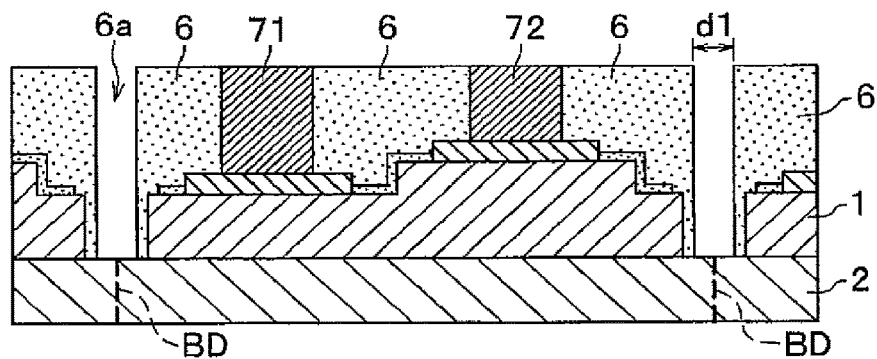

Next, in Removing Resist: S444, the resist mask PR10 is removed, and as shown in FIG. 40C, the semiconductor structure 1 is exposed in a region of a width d1 along the dividing lines BD. The resist mask PR10 may be removed in Removing Resist: S454 in Forming Bonding Layer: S50G to be described below, without conducting the Removing Resist: S444.

(Forming Steps of Bonding Layer)

Figure 40D:
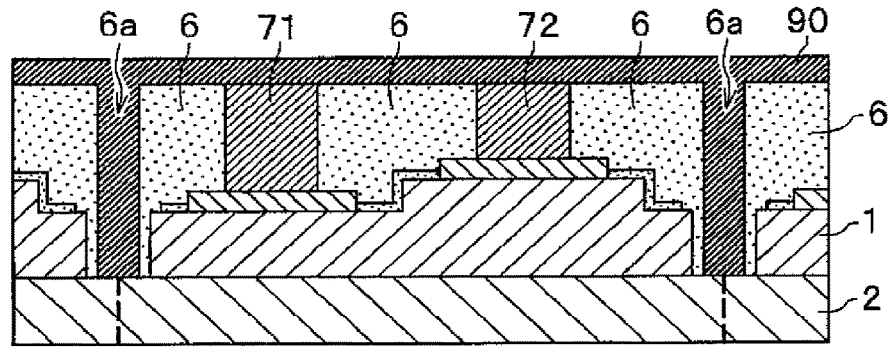
Figure 41A:
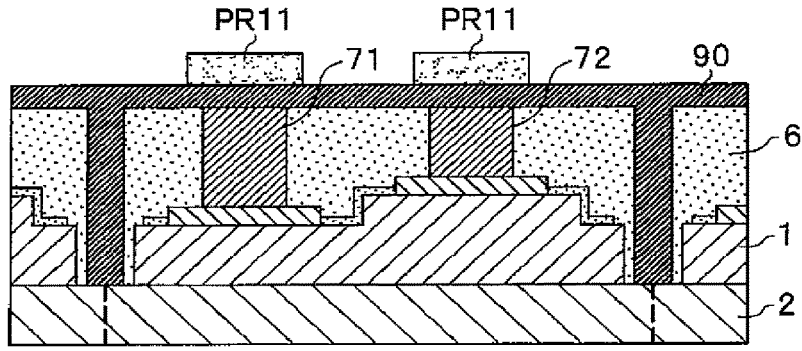

Next, in a similar manner as in Embodiment 5 and Embodiment 6, by conducting Forming Bonding Layer: S50E, the bonding layers 91, 92 are formed. That is, first, in the Disposing Bonding Layer: S251 (see FIG. 28), as shown in FIG. 40D, the metal layer 90 is disposed on the wafer. Next, in Forming Resist Mask: S252 (see FIG. 28), as shown in FIG. 41A, on the wafer, the resist mask PR11 is formed to cover the regions over the bumps 71, 72 where the bonding layers 91, 92 are to be provided. The resist mask PR11 is formed in a similar manner as the resist mask PR7 in Embodiment 5.

Figure 41B:
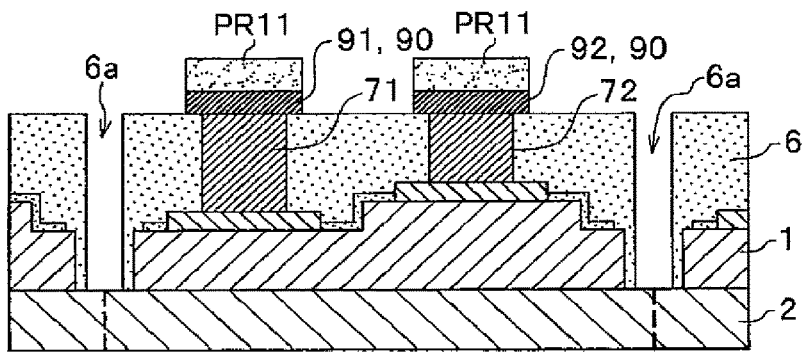
Figure 41C:
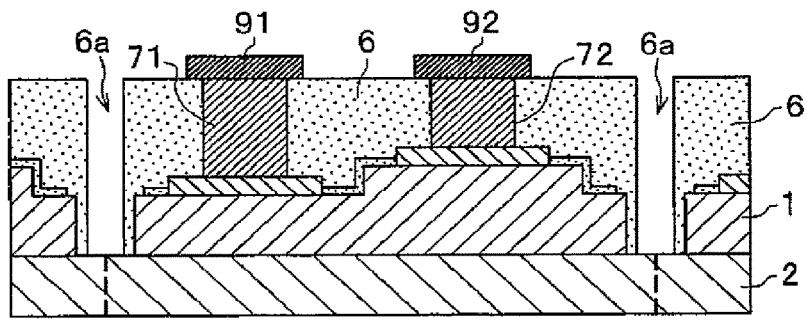

Next, in the Etching Bonding Layer: S253 (see FIG. 28), as shown in FIG. 41B, using the resist mask PR11 as the etching mask, the metal layer 90 is etched to form the pattern of the bonding layers 91, 92. Next, in Removing Resist: S254 (see FIG. 28), as shown in FIG. 41C, the resist mask PR11 is removed, thus, the bonding layers 91, 92 are formed.

(Singulating)

Next, the Singulating: S60G is conducted to obtain individual light emitting elements. The Singulating: S60G in Embodiment 7 includes two sub-manufacturing steps of the Attaching Sheet: S461 and Dividing Wafer: S462.

Figure 41D:
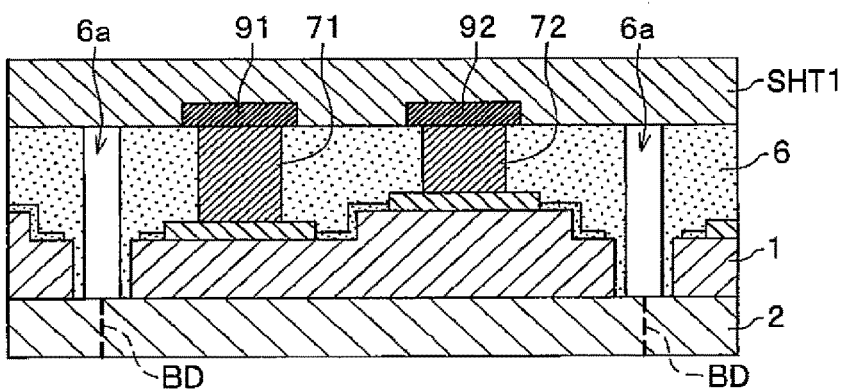

First, in the Attaching Sheet: S461, in a similar manner as the Attaching Sheet: S61 (see FIG. 4), as shown in FIG. 41D, the surface of the wafer on the side where the insulating member 6 is formed is attached to the adhesive sheet SHT1. Next, in the Dividing Wafer: S462, as shown in FIG. 42, the substrate 2 is cut along the dividing lines BD to divide into individual light emitting elements 10G. The Dividing Wafer: S462 in Embodiment 7 can be conducted in a similar manner as the Dividing Wafer: S63 (see FIG. 4) in Embodiment 1. For example, applying a laser scribing along the dividing lines BD on the substrate 2, and the substrate 2 can be cleaved by breaking.

Also in the Singulating: S60G in Embodiment 7, in a similar manner as in the Singulating: S60 in Embodiment 1, the Back-surface Grinding: S62 (see FIG. 4) is conducted between the Attaching Sheet: S461 and the Dividing Wafer: S462, to reduce the thickness of the substrate 2. According to the manufacturing steps as described above, the individual light emitting elements 10G can be completed.

Other Variations

The manufacturing steps as described above in the embodiments can be interchanged with each other. For example, the Forming Bonding layer: S50 in Embodiment 1 and the Forming Bonding layer: D in Embodiment 4 employ a patterning technique by way of lift-off, but as in the Forming Bonding layer: S50E in Embodiment 5, a patterning technique by way of etching may also be employed. Also, in Embodiments 5-7, alternative to the Forming Bonding Layer: S50E, a patterning technique by way of lift-off as in the Forming Bonding Layer: S50 of Embodiment 1 or the Forming Bonding Layer: S50D of Embodiment 4 may also be employed.

Also, in Embodiments 4-7, as in Embodiment 2, the bonding layers 91, 92 may be formed directly bonded to the pad electrodes 51, 52, respectively, without interposing the bumps 71, 72.

Also, in Embodiments 4-6, the light emitting elements may be singulated without peelingly removing the substrate 2 but cleaving the substrate 2 as in the Singulating: S60 in Embodiment 1 or in the Singulating: S60G in Embodiment 7. Also, in order to form the wavelength converting member 8, in Embodiment 7, alternative to the Singulating: S60G, the Singulating: S60D and further the Forming Wavelength Converting Member: S70D of Embodiment 4 may be conducted to form the wavelength converting member 8. Further, in Embodiments 4-7, without peelingly removing the substrate 2, the wavelength converting member 8 may be formed at the lower surface side of the substrate in a similar manner as in Embodiment 3 or Variational Embodiment of Embodiment 3.

As described above, a method of manufacturing light emitting elements according to the embodiments includes singulating light emitting elements (10, 10A to 10G) by dividing along dividing lines to obtain light emitting elements respectively having a semiconductor structure (1, 1B, 1C) which includes a first semiconductor layer (an n-type semiconductor layer 11) and a second semiconductor layer (a p-type semiconductor layer 13) stacked on a partial region on the first semiconductor layer, and electrodes (an n-side pad electrode 51, a p-side pad electrode 52, 51B, 52B) respectively connected to the first semiconductor layer and the second semiconductor layer. The method includes forming insulating member (S40, S40A, S40D, S40E, S40G) to form an insulating member (6, 6A, 6B) which covers the semiconductor structure 1 having the electrodes (51, 52, 51B, 52B) formed thereon, except for a connecting region to electrically connect the electrodes (51, 52, 51B, 52B) with outside and a region (width d1) including a dividing region having a predetermined width (w1) along the dividing lines, and along the dividing lines, singulating (S60, S60A, S60D, S60G) the semiconductor structure (1, 1B, 1C) to obtain individual light emitting elements (10, 10A-10G). In Forming Insulating Member (S40, S40A, S40D, S40E, S40G), a mask (PR3, PR3A, PR5, PR10) is formed at least on the component regions, then an insulating material is applied on the semiconductor structure (1, 1B, 1C), the insulating material is removed from the upper surface side to expose the mask (PR3, PR3A, PR5, PR10), then the mask (PR3, PR3A, PR5, PR10) is removed. Thus, the insulating member (6, 6A, 6B) is formed. In order to form the shape of the insulating member (6, 6A, 6B) in the height direction, so that the insulating member (6, 6A, 6B) which serves as a support can be formed with a thickness with good accuracy. Also, the insulating member (6, 6A, 6B) is not needed to be cut in singulation, which allows a reduction in the width in the dividing region required as a margin for singulating.

Also, in Forming Insulating Member (S40, S40A, S40D, S40E, S40G), the upper surface of the insulating member (6, 6A, 6B) may be flattened to expose the mask (PR3, PR3A, PR5, PR10). Accordingly, the upper surface of the insulating member (6, 6A, 6B) which serves as the mounting surface can be formed flat. Thus, the light emitting elements (10, 10A to 10G) which allow mounting of high reliability can be produced.

Also, prior to the Forming Insulating Member (S40, S40A, S40D, S40E, S40G), Forming Bump (S30) to form the bumps (71, 72) with an electrically conductive member may further be conducted on the connecting region of the electrodes (51, 52, 51B, 52B), and in the Forming Insulating Member (S40, S40A, S40D, S40E, S40G), in order to form the upper surfaces of the bumps (71, 72) at the same height as the upper surface of the insulating member, the bumps (71, 72) may be flattened with the insulating member (6, 6A, 6B). Accordingly, the upper surface of the insulating member (6, 6A, 6B) which serves as the mounting surface can be formed flat together with the bumps (71, 72). Thus, the light emitting elements (10, 10A to 10G) which allow mounting of high reliability can be produced.

Also, after the Forming Insulating Member (S40, S40A, S40D, S40E, S40G), and before the Singulating (S60, S60A, S60D, S60G), the Forming Electrode-Bonding Layer (S50, S50A, S50D, S50E) may be further conducted to form electrode-bonding layers (91, 92, 91A, 92A) so that a part of the electrode-bonding layers (91, 92, 91A, 92A) are formed on the upper surface of the insulating member (6, 6A, 6B) and that the electrode-bonding layers (91, 0.92, 91A, 92A) are electrically connected to the electrodes (51, 52, 51B, 52B) respectively. With this, the light emitting elements (10, 10A to 10G) which exhibit high bonding at the time of mounting can be manufactured.

Also, the semiconductor structure (1) is formed on the substrate (2) for growing crystal of a semiconductor material, and prior to Singulating (S60D), Removing Semiconductor Structure (Exposing Substrate Surface: S80D, D80E, S80F) may further be conducted to remove all the semiconductor structure (1) from the dividing regions, and in the Singulating (S60D), the light emitting elements (10A to 10F) may be singulated by removing the substrate (2). Accordingly, the light emitting elements (10A to 10F) can be easily singulated. Also, regions specifically for cutting the substrate (2) are not needed, so that in the Removing Semiconductor Structure (Exposing Substrate Surface: S80D, D80E, S80F), the width of the semiconductor structure (1) to be removed can be determined to the width of the dividing region necessary for Singulating.

As illustrated above, embodiments are described to give a concrete form to technical ideas of a method of manufacturing light emitting element according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A light emitting element comprising:
   a semiconductor structure including a first semiconductor layer, and a second semiconductor layer stacked on a portion of the first semiconductor layer;
   a first electrode connected to the first semiconductor layer;
   a second electrode connected to the second semiconductor layer; and
   an insulating protective layer located between the first electrode and the second electrode,
   wherein the first electrode comprises:
     a first intermediate electrode located on the first semiconductor layer such that a first surface of the first intermediate electrode directly contacts a surface of the first semiconductor layer; and a first pad electrode, wherein a surface of at least a part of the first pad electrode directly contacts a second surface of the first intermediate electrode;

wherein the second electrode comprises:
  a full-surface electrode located on the second semiconductor layer,
  a second intermediate electrode located on the second semiconductor layer and covering the full-surface electrode; and
  a second pad electrode, wherein a surface of at least a part of the second pad electrode directly contacts a first surface of the second intermediate electrode, wherein at least a part of the protective layer is between the first pad electrode and the second intermediate electrode, and wherein a thickness of the first intermediate electrode and a thickness of the second intermediate electrode are substantially the same.

2. The light emitting element according to claim 1, wherein a thickness of the first pad electrode and a thickness of the second pad electrode are substantially the same.

3. The light emitting element according to claim 1, wherein the first intermediate electrode and the second intermediate electrode are formed in a same process.

4. The light emitting element according to claim 1, wherein the protective layer has a plurality of openings at locations where, in a plan view, the first intermediate electrode contacts the first pad electrode, and the second intermediate electrode contacts the second pad electrode.

5. The light emitting element according to claim 1, wherein at least a part of the protective layer is located on at least a part of a surface of the semiconductor structure, the first intermediate electrode and the second intermediate electrode.

6. The light emitting element according to claim 1, wherein the thickness of the first intermediate electrode and the thickness of the second intermediate electrode are greater than a thickness of the protective layer.

7. The light emitting element according to claim 1, wherein a second surface of the second intermediate electrode directly contacts a surface of the second semiconductor layer.

* * * * *